US006435130B1

United States Patent
Takaki et al.

(10) Patent No.: US 6,435,130 B1
(45) Date of Patent: Aug. 20, 2002

(54) PLASMA CVD APPARATUS AND PLASMA PROCESSING METHOD

(75) Inventors: Satoshi Takaki, Komae; Yoshio Segi, Nara; Atsushi Yamagami, Kawasaki; Hiroyuki Katagiri, Nara; Hitoshi Murayama, Kyoto-fu; Yasuyoshi Takai, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 08/916,540

(22) Filed: Aug. 22, 1997

(30) Foreign Application Priority Data

| Aug. 22, 1996 | (JP) | 8-239730 |
| Aug. 26, 1996 | (JP) | 8-242586 |
| Aug. 26, 1996 | (JP) | 8-242620 |

(51) Int. Cl.[7] ............ C23C 16/509; C23C 16/505; C23C 16/503
(52) U.S. Cl. ............ 118/723 E; 118/723 R; 204/192.12; 204/298.05; 204/298.28; 216/68
(58) Field of Search ............ 118/723 E, 723 I, 118/715, 50.1, 623, 718, 719, 722, 723 ER, 723 MP, 723 MW, 723 R, 723 VE, 724, 728; 427/577; 156/345

(56) References Cited

U.S. PATENT DOCUMENTS

| 4,265,991 A | | 5/1981 | Hirai et al. ............ 430/64 |
| 4,958,591 A | * | 9/1990 | Yamazaki et al. ........ 118/723 E |
| 4,979,467 A | * | 12/1990 | Kamaji et al. ............ 118/723 |
| 5,016,565 A | * | 5/1991 | Saitoh et al. ........ 118/723 MW |
| 5,129,359 A | * | 7/1992 | Takei et al. .......... 118/723 MW |
| 5,382,487 A | | 1/1995 | Fukuda et al. ............ 430/57 |
| 5,433,790 A | * | 7/1995 | Niino et al. ......... 118/723 MW |
| 5,439,715 A | * | 8/1995 | Okamura et al. ............ 427/575 |
| 5,534,070 A | * | 7/1996 | Okamura et al. ........ 118/723 E |
| 5,540,781 A | * | 7/1996 | Yamagami et al. ...... 118/723 E |
| 5,558,719 A | * | 9/1996 | Tsuchida et al. ......... 118/723 E |
| 5,582,648 A | | 12/1996 | Katagiri et al. ............ 118/723 |
| 5,591,268 A | * | 1/1997 | Usui et al. ................ 118/723 E |
| 5,609,690 A | * | 3/1997 | Watanabe et al. ........ 118/723 E |
| 5,776,553 A | * | 7/1998 | Jaffe et al. ................... 427/577 |
| 5,855,685 A | * | 1/1999 | Tobe et al. ................. 118/723 |
| 6,279,504 B1 | * | 8/2001 | Takaki et al. ............ 118/723 E |
| 6,333,079 B1 | * | 12/2001 | Takaki et al. ............... 427/569 |

FOREIGN PATENT DOCUMENTS

| EP | 154160 | 9/1985 |
| JP | 57115556 | 7/1982 |
| JP | 6067951 | 4/1985 |
| JP | 6095551 | 5/1985 |
| JP | 61283116 | 12/1986 |
| JP | 62168161 | 7/1987 |
| JP | 63149381 | 6/1988 |

OTHER PUBLICATIONS

H. Curtins, et al.; "Influence of Plasma Excitation Frequency for α–Si:H Thin Film Deposition", Plasma Chemistry and Plasma Processing, vol. 7, pp. 267–273, 1987.

\* cited by examiner

*Primary Examiner*—Gregory Mills
*Assistant Examiner*—Rudy Zervigon
(74) *Attorney, Agent, or Firm*—Fitzpatrick, Cella, Harper & Scinto

(57) ABSTRACT

A plasma CVD apparatus comprising a substantially enclosed reaction chamber containing substrate holding means and a cathode electrode arranged therein, wherein a high frequency power from a high frequency power source is supplied to said cathode electrode to generate plasma between said substrate holding means having a subtrate positioned thereon and said cathode electrode whereby plasma-processing said substrate, characterized in that said cathode electrode comprises a plurality of conductor members situated on substantially the same axis which are capacitively coupled by a dielectric member.

A plasma-processing method using said cathode electrode.

18 Claims, 30 Drawing Sheets

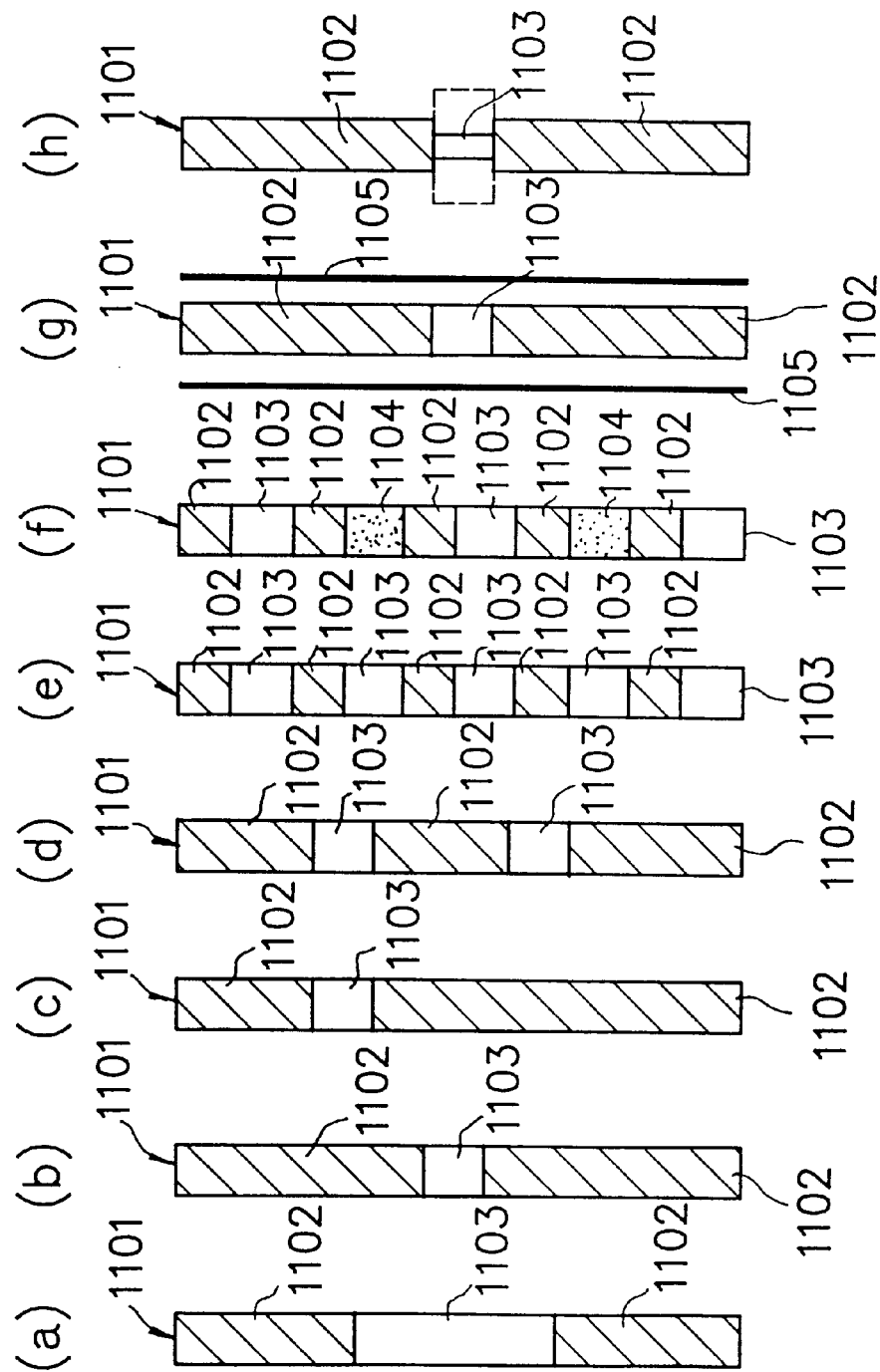

F I G. 12
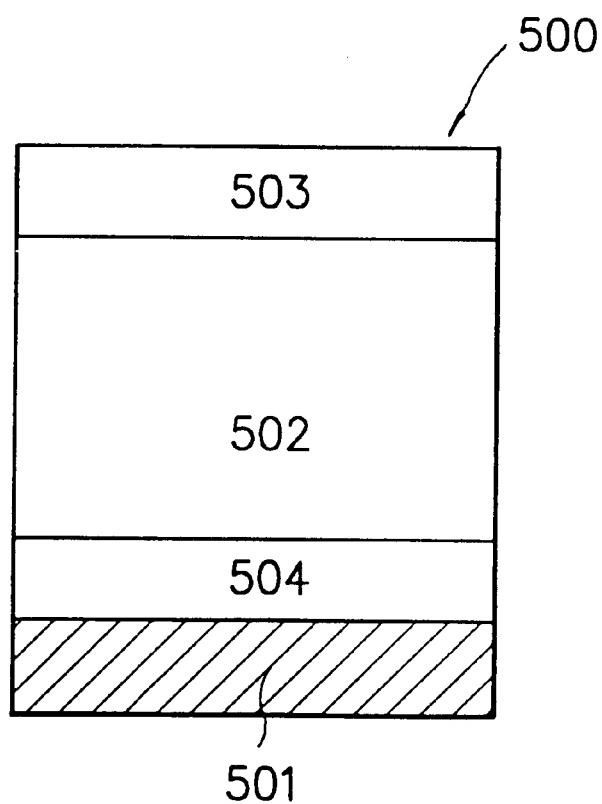

F I G. 17
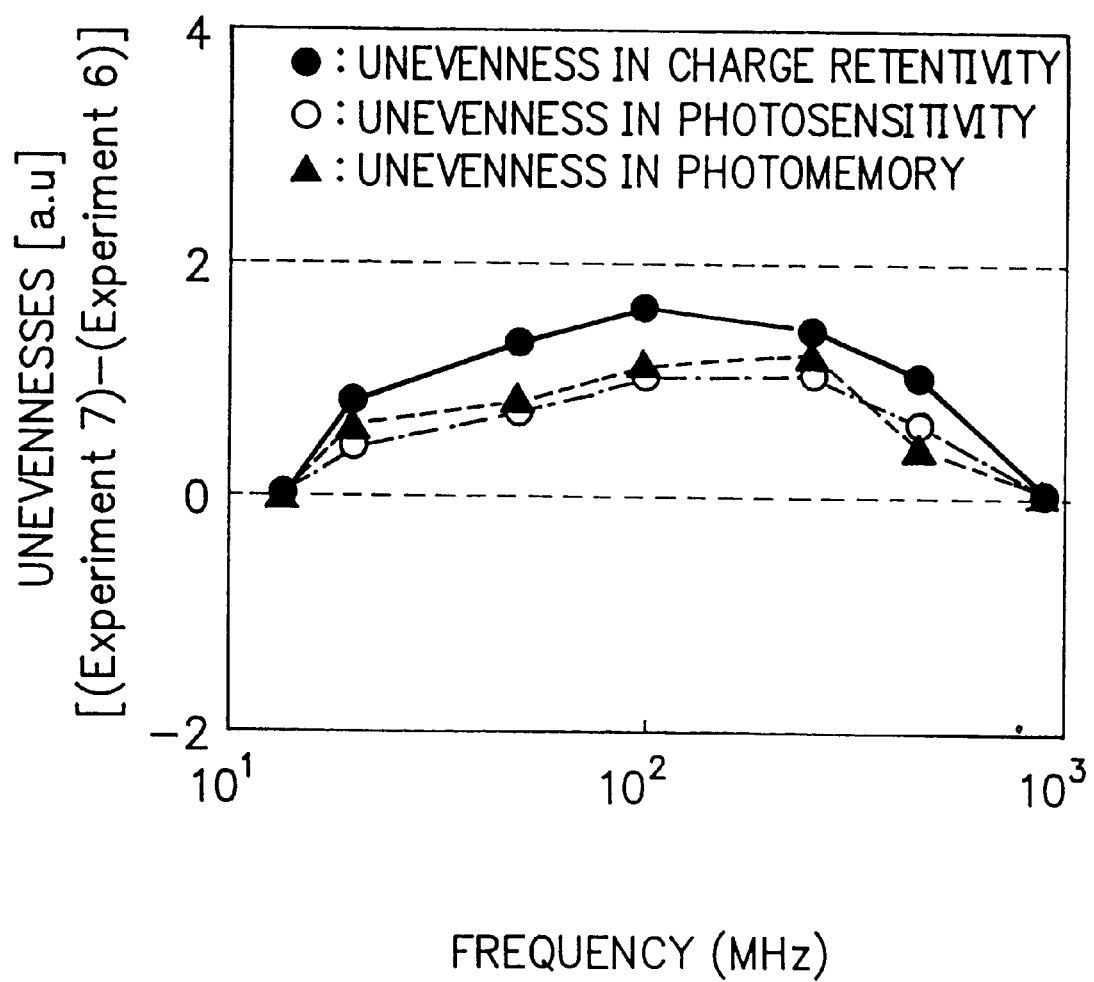

F I G. 25
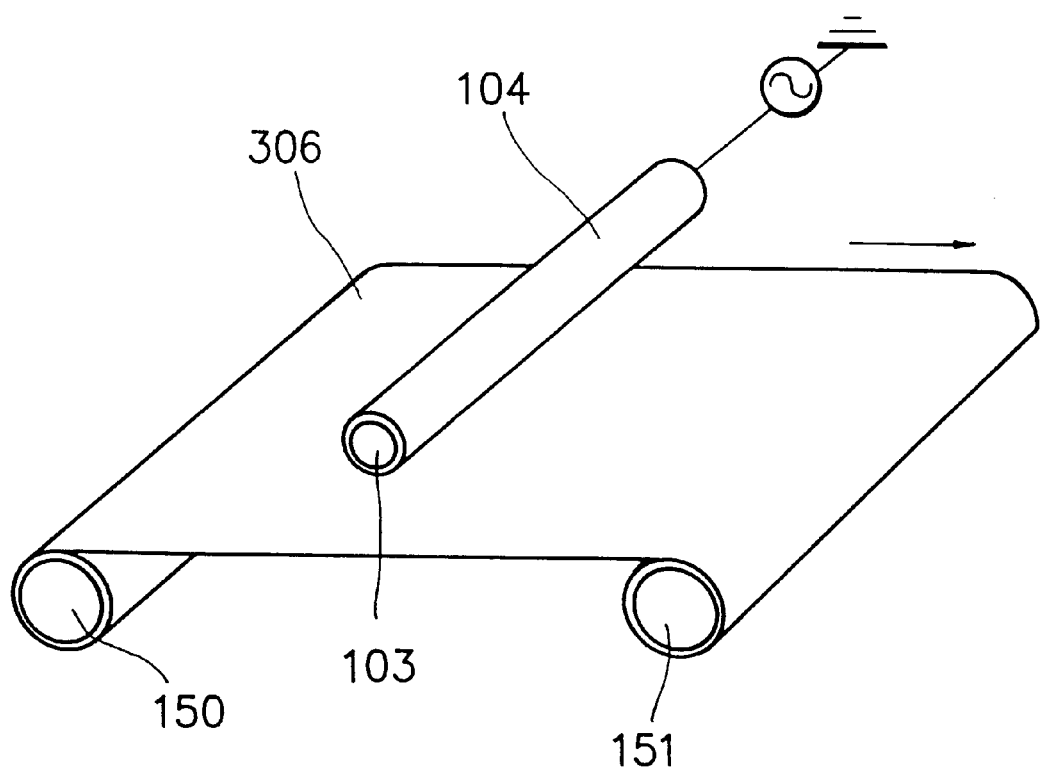

PLASMA CVD APPARATUS AND PLASMA PROCESSING METHOD

BACKGROUND OF THE INVENTION

1. Field of the Invention

The present invention relates to a plasma CVD apparatus and a plasma processing method. More particularly, the present invention relates to a plasma CVD apparatus and a plasma processing method which are suited for the production of various electronic devices such as semiconductor devices, electrophotographic photosensitive devices (or electrophographic light receiving members), image input line sensors, flat panel displays, image pickup devices, photovoltaic devices, and the like.

2. Related Background Art

Recently, in the production of an electronic device such as semiconductor device and the like, a plasma CVD apparatus has been often used. Particularly, a plasma CVD apparatus in which a high frequency with 13.56 HMz or a microwave with 2.45 GHz is used has been widely used, since various substrates and depositing materials regardless of their properties being electrically conductive or electrically insulating can be optionally plasma-processed by the plasma CVD apparatus.

As an example of such plasma CVD apparatus, there can be mentioned a parallel plane plate type plasma CVD apparatus in which a high frequency energy is used, as shown in FIG. 1.

Description will be made of the plasma CVD apparatus shown in FIG. 1.

The plasma CVD apparatus shown in FIG. 1 comprises a reaction chamber 1 in which a cathode electrode 3 is arranged through a cathode electrode support 2. Around the cathode electrode 3, an earth shield 4 is arranged so as to prevent discharge from being generated between a side portion of the cathode electrode 3 and the reaction chamber 1. The cathode electrode 3 is electrically connected to a high frequency power source 10 through a matching circuit 9.

Reference numeral 5 indicates a counter electrode which is arranged in parallel to the cathode electrode 3.

Reference numeral 6 indicates a plate-like shaped substrate as an object to be plasma-processed which is positioned on the counter electrode 5. Reference numeral 7 indicates an exhausting means (such as vacuuming pump) which is communicated with the inside of the reaction chamber 1 through an exhaust pipe. Reference numeral 8 indicates a raw material gas supply source which is communicated with the inside of the reaction chamber 1 through a gas feed pipe.

The substrate 6 can be maintained at a desired temperature by means of a substrate temperature control means (not shown).

Plasma CVD (plasma chemical vapor deposition) using the plasma CVD apparatus shown in FIG. 1 is conducted, for example, in the following manner.

The reaction chamber 1 is evacuated to bring the inside to a desired high vacuum by operating the exhausting means 7, followed by introducing a given raw material gas from the raw material gas supply source 8 into the reaction chamber 1, and the gas pressure in the reaction chamber is maintained at a predetermined pressure. Thereafter, a high frequency power from the high frequency power source 10 is supplied to the cathode electrode 3, whereby plasma is generated between the cathode electrode 3 and the counter electrode 5, where the raw material gas introduced into the reaction chamber 1 is decomposed and excited to cause the formation of a deposited film on the substrate 6.

In this case, as the high frequency power, there is generally used an RF power with 13.56 MHz. In the case of using a discharging frequency of 13.56 MHz, although there are advantages such that the discharging conditions can be relatively easily controlled and a deposited film having excellent film quality can be obtained, there are drawbacks such that the raw material gas utilization efficiency is insufficient and the deposition rate for a film deposited is relatively small.

In view of such situation as above described, various studies have been made of a plasma CVD method using a high frequency with 25 to 150 MHz.

For instance, *Plasma Chemistry and Plasma Processing*, Vol. 7. No. 3. pp. 267–273 (1987) (hereinafter, referred to as Document 1) discloses a manner in which using a parallel plane plate type glow discharge decomposition apparatus, a raw material gas (silane gas) is decomposed with a high frequency energy having a frequency with 25 MHz to 150 MHz to form an amorphous silicon (hereinafter referred to as a-Si) deposited film on a substrate. Specifically, Document 1 describes that a-Si deposited films were formed while changing the frequency in the range of 25 MHz to 150 MHz; and the deposition rate in the case of using 75 MHz was 2.1 nm/sec which is the largest among others and which is greater by about five to eight times over that in the case of the plasma CVD using a frequency with 13.56 MHz. Document 1 also describes that the defect density, optical bandgap and conductivity of an a-Si film obtained are less influenced by an excitation frequency employed.

However, the film formation described in the Document 1 is of a laboratory scale. Document 1 does not even suggest anything of whether or not such effect as above described can be expected in the case of forming an a-Si deposited film having a large area. Further, Document 1 is absolutely silent about a manner of simultaneously forming an a-Si deposited film on a plurality of large area substrates to efficiently produce a plurality of large area semiconductor devices which can be desirably used in practice. In fact, Document 1 merely mentions a possibility that the use of higher frequencies (13.56 up to ~200 MHz) opens interesting perspectives for fast processing of low cost, large area a-Si thin film devices in which thicknesses of several $\mu$m are required.

The above example is of the case where the plasma CVD apparatus which is appropriate for plasma-processing a plate-shaped substrate.

Besides, an example of a plasma CVD apparatus which is appropriate for forming a deposited film on a plurality of cylindrical substrates is disclosed in European Patent Publication No. 154160 A (hereinafter referred to as Document 2). Particularly, Document 2 discloses a plasma CVD apparatus using a microwave power source having a frequency with 2.45 GHz (this apparatus will be hereinafter referred to as microwave plasma CVD apparatus) and a plasma CVD apparatus using a radio frequency (RF) power source (this apparatus will be hereinafter referred to as RF plasma CVD apparatus).

In the microwave plasma CVD apparatus disclosed in Document 2, since a microwave energy is used, the density of plasma generated upon film formation is extremely high. Because of this, a film-forming raw material gas is rapidly is decomposed, whereby the deposition of a film is conducted at a high speed. However, there is a problem such that it is difficult to stably and continuously form a high quality dense film.

Next, description will be made of the RF plasma CVD apparatus described in Document 2 while referring to FIGS. 2(A) and 2(B).

FIG. 2(A) is a schematic diagram illustrating an RF plasma CVD apparatus based on the RF plasma CVD apparatus described in Document 2. FIG. 2(B) is a schematic cross-sectional view, taken along the line X—X in FIG. 2(A).

The RF plasma CVD apparatus shown in FIGS. 2(A) and 2(B) comprises a reaction chamber 100 in which six cylindrical substrate holders 105A each having a cylindrical substrate 106 for film formation positioned thereon are concentrically and spacedly arranged at a predetermined interval. The reaction chamber 100 has a plasma generation region A circumscribed by the substrate holders 105A. Reference numeral 105B indicates a dummy holder which serves to cap an end portion of the cylindrical substrate 106 positioned on the substrate holder 105A.

Each substrate holder 105A is provided with a heater 104 in the inside thereof so that the cylindrical substrate 106 can be heated from the inner side thereof. Each substrate holder 105A is held on a shaft 131 coupled to a driving motor 132 so that the substrate holder 105A can be rotated.

Reference numeral 103 indicates a cathode electrode arranged at a central position in the plasma generation region A. The cathode electrode 103 is electrically connected to an RF power source 111 through a matching circuit 109. The cathode electrode 103 serves to supply an RF power from the RF power source 111 in the plasma generation region A.

Reference numeral 130 indicates a support member by which the cathode electrode 103 is supported.

Reference numeral 107 indicates an exhaust pipe provided with an exhaust valve. The exhaust pipe 107 is communicated with an exhausting mechanism 135 provided with a vacuum pump (not shown).

Reference numeral 108 indicates a raw material gas supply system comprising gas reservoirs, mass flow controllers, valves and the like. The raw material gas supply system 108 is connected to a gas feed pipe 116 provided with a plurality of gas discharge ports through a gas supply pipe 117. Reference numeral 133 indicates a seal member.

The plasma CVD using the above RF plasma CVD apparatus is conducted, for example, in the following manner.

The reaction chamber 100 is evacuated to bring the inside to a desired high vacuum by operating the exhausting mechanism 135, followed by introducing a given raw material gas from the raw material gas supply system 108 into the reaction chamber 100 through the gas supply pipe 117 and the gas feed pipe 116, and the gas pressure in the reaction chamber 100 is maintained at a predetermined pressure. Thereafter, a given high frequency power from the RF power source 111 is supplied to the cathode electrode 103 through the matching circuit 109, whereby plasma is generated between the cathode electrode 103 and the cylindrical substrates 106 in the plasma generation region A, where the raw material gas introduced into the reaction chamber 100 is decomposed and excited to cause the formation of a deposited film on each of the cylindrical substrates 106.

In the case of using the RF plasma CVD apparatus shown in FIGS. 2(A) and 2(B), since the discharge space (comprising the plasma generation region A) is circumscribed by the cylindrical substrates 106, there is an advantage such that the raw material gas can be utilized at a high utilization efficiency. However, there are disadvantages such that in order to evenly form a deposited film on the entire surface of each of the cylindrical substrates, it is necessary to rotate the cylindrical substrates, and by rotating the cylindrical substrates, the substantial deposition rate is reduced to about $\frac{1}{3}$ to $\frac{1}{5}$ of that in the case of using the foregoing parallel plane plate type plasma CVD apparatus. This situation is due to the reason that as the discharge space is circumscribed by the cylindrical substrates, film deposition on a surface area of the cylindrical substrate which is positioned to oppose the cathode electrode is conducted at a deposition rate similar to that in the case using the parallel plane plate type plasma CVD apparatus, but on the remaining surface areas of the cylindrical substrate which are positioned not to oppose the cathode electrode, film deposition is slightly conducted.

Incidentally, using the RF plasma CVD apparatus shown in FIGS. 2(A) and 2(B) in which a cylindrical substrate is positioned on each of the substrate holders, the present inventors conducted the formation of an a-Si film on the entire surface of each of the cylindrical substrates while rotating the cylindrical substrates, where an RF energy having a frequency with 13.56 MHz (which is usually used in ordinary RF plasma CVD) was used as the discharge energy, $SiH_4$ was used as the film-forming raw material gas, and the gas pressure in the reaction chamber upon the film formation was made to be several hundreds mTorrs under which the film deposition rate is increased but a powder of polysilane or the like is liable to occur. And based on the resultants, deposition rate was examined. As a result, the substantial deposition rate was found to be at most 0.5 nm/sec.

Now, in the case of producing an electrophotographic light receiving member having a photoconductive layer comprising an a-Si film using the RF plasma CVD apparatus shown in FIGS. 2(A) and 2(B), the a-Si film as the photoconductive layer is necessary to have a thickness of about 30 $\mu$m. In order to form the a-Si film having such large thickness, it takes more than 16 hours at the foregoing deposition rate of about 0.5 nm/sec. Therefore, the productivity is unsatisfactory.

In addition, for the RF plasma CVD apparatus shown in FIGS. 2(A) and 2(B), when an RF energy having a frequency with 30 MHz or more is used as the discharge energy, uneven plasma is liable to form in the axial direction of the cylindrical substrate. Because of this, it is difficult to form a homogeneous deposited film having a uniform thickness over the entire surface of the cylindrical substrate.

By the way, in the image-forming industrial field, for the photoconductive material to constitute a light receiving layer in an electrophotographic light receiving member, it is required to be highly sensitive, to have a high S/N ratio (photo-current (Ip)/dark current (Id)), to have absorption spectrum characteristics suited for an electromagnetic wave to be irradiated, to be quickly responsive, and to have a desired dark resistance. Besides, it is also required to be not harmful to living things, especially human body, upon use.

Particularly for electrophotographic light receiving members used in an electrophotographic apparatus which is used as a business machine at the office, causing no pollution is highly important.

From these standpoints, there have been proposed a-Si series electrophotographic light receiving members comprising an amorphous silicon hydride material (hereinafter referred to as a-Si:H), for example, as disclosed in U.S. Pat. No. 4,265,991 which discloses an electrophotographic light receiving having a photoconductive layer constituted by an a-Si:H material.

These electrophotographic light receiving members can be produced by a manner of heating to and maintaining an electrically conductive substrate at a temperature of 50 to 400° C., and forming a light receiving layer comprising an a-Si material by means of an appropriate film-forming process such as vacuum evaporation, sputtering, ion plating, thermal CVD, photo-assisted CVD, or plasma CVD.

Of these, the film-forming process by means of plasma CVD in which direct current (D.C.) discharge, high frequency dischage or microwave glow discharge is generated in a film-forming raw material gas to decompose the film-forming raw material gas whereby forming an a-Si deposited film on a substrate maintained at a desired temperature has been evaluated as being the most appropriate, and it has been using in practice.

Besides, U.S. Pat. No. 5,382,487 discloses an electrophotographic light receiving member comprising a light receiving layer (a photoconductive layer) comprised of an a-Si material containing halogen atoms (X) (this material will be hereinafter referred to as a-Si:X) formed on an electrically conductive substrate. In this document, it is described that by incorporating halogen atoms in an amount of 1 to 40 atomic % into an a-Si material, there can be attained a light receiving layer which is highly heat resistant and has good electric and optical properties required for a photoconductive layer in an electrophotographic light receiving member.

Japanese Unexamined Patent Publication No. 57-115556 discloses a technique for improving a photoconductive member having a photoconductive layer comprising an a-Si deposited film with respect to its electric, optical and photoconductive properties including dark resistance, photosensitivity, and photoresponsibility and also with respect to its use environmental characteristics including moisture resistance, by disposing a surface barrier layer constituted by a non-photoconductive amorphous material containing silicon and carbon atoms on a photoconductive layer constituted by an amorphous material containing silicon atoms as a matrix.

Japanese Unexamined Patent Publication No. 60-67951 discloses a photosensitive member having a light transmissive and insulative overcoat layer comprising an amorphous silicon material containing carbon atoms, oxygen atoms and fluorine atoms. Japanese Unexamined Patent Publication No. 62-168161 discloses a light receiving member having a surface layer constituted by an amorphous material containing silicon atoms, carbon atoms and hydrogen atoms in an amount of 41 to 70 atomic %.

Furthermore, Japanese Unexamined Patent Publication No. 60-95551 discloses a technique for improving the quality of an image reproduced by an amorphous silicon electrophotographic light receiving member by conducting an image-forming process including charging, exposure, development and transfer steps while maintaining the temperature in the vicinity of the surface of the light receiving member in the range of 30 to 40° C., whereby a reduction in the surface electrical resistance of the surface of the light receiving member which will be caused when moisture is deposited on the surface and occurrence of a smeared image in an image reproduced because of the reduction of the surface electrical resistance are prevented.

In addition, Japanese Unexamined Patent Publication No. 61-283116 discloses a microwave plasma CVD (hereinafter referred to as MW-PCVD) process and a MW-PCVD apparatus which are suitable for the production of an amorphous semiconductor. Japanese Unexamined Patent Publication No. 63-149381 discloses a manner in which a plurality of cylindrical substrates are concentrically arranged at a desired interval so as to establish a discharge space circumscribed by the cylindrical substrates in a deposition chamber, and a microwave power is introduced into the discharge space, whereby an amorphous film is formed on each cylindrical substrate.

Based on the foregoing knowledges, it is possible to realize a desirable a-Si series electrophotographic light receiving constituted by an a-Si material, which is satisfactory in electric, optical and photoconductive characteristics, use-environmental characteristics and durability, and enables to reproduce a high quality image.

In the following, description will be made of an example of an apparatus and a process for producing such a-Si series electrophotographic light receiving member.

FIG. 3 is a schematic diagram illustrating an example of an apparatus for the production of an electrophotographic light receiving member by means of an RF-plasma CVD process using a frequency belonging to the RF band (this apparatus will be hereinafter referred to as RF-PCVD apparatus).

The RF-PCVD apparatus shown in FIG. 3 roughly comprises a deposition apparatus 3100, a raw material gas supply system 3200, and an exhaust system for evacuating the inside of a reaction chamber 3111 in the deposition apparatus 3100.

In the reaction chamber 3111 of the deposition apparatus 3100, there is provided a cylindrical substrate holder 3113 for holding a cylindrical substrate 3112 (on which a film is to be formed) positioned thereon. The cylindrical substrate holder 3113 is provided with a heater 3113' installed therein, which serves to heat the cylindrical substrate 3112. Reference numeral 3114 indicates a raw material gas feed pipe (usually having a plurality of gas release holes capable of uniformly supplying a raw material gas toward the cylindrical substrate 3112) which is provided in the reaction chamber 3111.

The raw material gas feed pipe 3114 is communicated with the raw material gas supply system 3200 through a gas piping 3116 provided with a sub-valve 3260.

Reference numeral 3115 indicates a high frequency power matching box extending from an RF power source (not shown), which is electrically coupled to the deposition chamber 3111. Each of reference numerals 3120 and 3121 indicates an insulating member which is provided at the circumferential wall of the reaction chamber 3111.

The reaction chamber 3111 is provided with an exhaust pipe provided with a main valve 3118, which is connected to an exhaust device (not shown). Reference numeral 3117 indicates a leak valve, and reference numeral 3119 a vacuum gage.

The raw material gas supply system 3200 comprises gas reservoirs 3221–3226 for raw material gases such as $SiH_4$, $GeH_4$, $CH_4$, $H_2$, $B_2H_6$, $PH_3$, and the like; and valves 3231–3236, inlet valves 3241–3246, exit valves 3251–3256 and mass flow controllers 3211–3216 respectively corresponding one of the gas reservoirs 3221–3226. The raw material gas supply system 2200 is designed such that the raw material gas from each gas reservoir can be introduced into the reaction chamber 3111 through the sub-valve 3260 of the gas piping 3116, and the raw material gas feed pipe 3114.

The formation of a deposited film using the RF-PCVD apparatus shown in FIG. 3 may be conducted, for example, in the following manner.

A cylindrical substrate 3112 is positioned on the substrate holder 3113 in the reaction chamber 3111. The inside of the reaction chamber 3111 is evacuated to a desired vacuum degree by means of the exhaust device comprising a vacuum pump for example (not shown in the figure). The temperature of the cylindrical substrate is controlled to a desired temperature in the range of 20 to 450° C. by means of the heater 3113.

Particularly, prior to the entrance of raw material gases into the reaction chamber 3111, it is confirmed that the valves 3231–3236 for the gas reservoirs 3221–3226 and the leak valve 3117 of the reaction chamber 3111 are closed and that the inlet valves 3241–3246, the exit valves 3251–3256, and the sub-valve 3260 are opened. Then, the main valve 3118 is first opened to evacuate the inside of the reaction chamber 3111 and the inside of the gas piping 3116 by the vacuum pump (not shown).

Then, upon observing that the reading on the vacuum gage 3119 becomes a predetermined vacuum degree of, for example, about $5\times10^{-6}$ Torr, the sub-valve 3260 and the exit valves 3251–3256 are closed. Thereafter, the valves 3231–3236 are opened to introduce raw material gases from the gas reservoirs 3221–3226, and the pressures of the respective gases are adjusted to 2 Kg/cm by means of the pressure controllers 3261–3266. Then, the inlet valves 3241–3246 are gradually opened to introduce the respective gases in the mass flow controllers 3211–3216.

After completing the preparation for the film formation as described above, the formation of a deposited film as a light receiving layer is conducted as follows.

After the temperature of the cylindrical substrate 3112 becomes stable at a desired temperature, one or more of the exit valves 3251–3256 (which are necessary to be used for the formation of the deposited film) and the sub-valve 3260 are gradually opened to introduce one or more given raw material gases (which are required for the formation of the deposited film) from one or more of the gas reservoirs 3221–3226 into the reaction chamber 3111 through the gas feed pipe 3114. The flow rate of each raw material gas is controlled to a predetermined value by means of one or more of the mass flow controllers 3211–3216 involved. In this case, the gas pressure (inner pressure) of the reaction chamber 3111 is adjusted to a predetermined value of less than 1 Torr by regulating the opening of the main valve 3118 while observing the reading on the vacuum gage 3119.

After all the flow rates of the raw material gases and the inner pressure of the reaction chamber 2111 becomes stable, a high frequency power (having an oscillation frequency of 13.56 MHz) of a desires wattage from a high frequency power source (not shown) is applied into the reaction chamber 3111 through the matching box 3115 to cause glow discharge in the raw material gases introduced therein, where the raw material gases are decomposed to case the formation of a deposited film containing, for example, silicon atoms as a matrix on the cylindrical substrate 3112.

After the deposited film is formed at a desired thickness on the cylindrical substrate 3112, the application of the high frequency power is suspended and the exit valves are closed to suspend the introduction of the raw material gases into the reaction chamber. By this, the formation of the deposited film as the light receiving layer is completed.

If necessary, by repeating the above film-forming procedures several times, there can be formed a light receiving layer having a multi-layered structure. In this case, all the exit valves other than those required for forming the respective layers are of course closed.

Further, if necessary, upon forming the respective layers, the inside of the system is once evacuated to a high vacuum degree as required by closing the exit valves 3251–3256 while opening the sub-valve 3260 and fully opening the main valve 3118 in order to prevent the gases used for the formation of the previous layer to be left in the reaction chamber 3111 and also in the gas pipe ways.

In this way, there can be formed a desired deposited film such as an a-Si deposited film as a light receiving layer on a cylindrical substrate. By this, there can be produced an electrophotographic light receiving member (or an electrophotographic light receiving drum).

In the above, in order to improve the uniformity of the deposited film formed, it is possible to rotate the cylindrical substrate 3112 at a desired speed during the formation thereof by means of a deriving means (not shown). Further, in the above, it is a matter of course that the raw material gases used and the valve operations are properly changed depending upon conditions for forming a desired deposited film.

Other than the foregoing RF-PCVD apparatus, there is known a film-forming apparatus as shown in FIGS. 4(A) and 4(B), which enables to produce a plurality of electrophotographic light receiving members at the same time.

Particularly, FIG. 4(A) is a schematic diagram illustrating a film-forming apparatus by means of a microwave plasma CVD process (this apparatus will be hereinafter referred to as MW-PCVD apparatus), which enables to mass-produce an electrophotographic light receiving member. FIG. 4(B) is a schematic cross-sectional view, taken along the line B-B' in FIG. 4(A).

The MW-PCVD apparatus shown in FIGS. 4(A) and 4(B) comprises a reaction chamber 401 having a center longitudinal axis and which is provided with an exhaust pipe 404 connected through an exhaust valve (not shown) to an exhaust device (not shown).

The reaction chamber 401 has opposite end portions, each of which being hermetically provided with a microwave transmissive window 402 to which a waveguide 403 extending from a microwave power source (not shown) is connected. In the reaction chamber 401, six cylindrical substrate holders 407 each having a cylindrical substrate 405 (on which a film is to be formed) are concentrically and spacedly arranged in substantially parallel to each other so as to circumscribe the center longitudinal axis. Each cylindrical substrate holder 407 is provided with a heater 407' installed therein, which serves to heat the cylindrical substrate positioned thereon from the inner side. Each cylindrical substrate holder 407 is held on a rotary shaft 408 connected to a driving mechanism comprising a reduction gear 410 and a driving motor 409 so that when the driving motor 409 is actuated, the rotary shaft 408 is rotated through the reduction gear 410, whereby the cylindrical substrate positioned on the cylindrical substrate holder is rotated about the central axis in the generatrix direction.

Reference numeral 406 indicates a discharge space (or a film-forming space) circumscribed by the six cylindrical substrate holders 407 each having the cylindrical substrate 405 positioned thereon and the opposite microwave transmissive windows 402.

The reaction chamber 401 is provided with three longitudinal gas feed pipes 451 each being arranged between given adjacent two cylindrical substrate holders. Each gas feed pipe 451 is provided a plurality of gas release nozzles capable of uniformly supplying a raw material gas into the discharge space 406. All the gas feed pipes 451 are communicated with a raw material gas supply system including a plurality of gas reservoirs (not shown).

The production of an electrophotographic light receiving member using the above MW-PCVD apparatus is conducted, for example, as will be described below.

The inside of the reaction chamber 401 is evacuated to a vacuum degree of less than $1 \times 10^{-7}$ Torr by means of the exhaust device (not shown), followed by heating the cylindrical substrates 405 to and maintaining at a desired temperature by means of the heater 407'. Then, given film-forming raw material gas is introduced into the discharge space 406 of the reaction chamber 401, and simultaneously with this, a microwave power with an oscillation frequency of more than 500 MHz, preferably 2.45 GHz, is introduced into the discharge space 406 through the waveguide 403 and the microwave transmissive window 402, where glow discharge is generated in the discharge space containing the raw material gas therein to decompose and excite the raw material gas whereby causing the formation of a deposited film as a light receiving layer on each of the cylindrical substrates 405. In this case, by actuating the driving motor 409 as above described, the deposited film can be uniformly formed over the entire surface of each of the cylindrical substrates 405. By this, there can be produced six electrophotographic light receiving members at the same time.

According to the foregoing apparatus and processes, it is possible to produce a good a-Si series light receiving member for use in electrophotography. It is necessary to have a further technology progress in order to meet high level demands on the market. These demands include demands for further diminishing the occurrence of a defective image, the occurrence of a ghost based on the so-called photomemory phenomenon on an image reproduced, and the production cost.

The photomemory phenomenon herein means a phenomenon that a latent image formed in a given electrophotographic image formation cycle is somewhat remained without completely extinguished until the successive electrophotographic image formation cycle, and the residual latent image appears in the form of a ghost image on an image reproduced in the successive electrophotographic image formation cycle.

In order to attain a desirable a-Si series electrophotographic light receiving member which can meet such demands as above described, it is essential to develop a further progress in the technique for the production of an a-Si series electrophotographic light receiving member, particularly, in the technique for the formation of an a-Si film.

With respect to the technique for the formation of an a-Si film, in terms of applying the a-Si film in various uses including light receiving members for use in electrophotography, various contrivances and improvements have been made and as a result, the technique has been progressing.

For instance, as one of the techniques on which the public attention has been focused in recent years, there is a VHF-plasma CVD method in which a high frequency power with an oscillation frequency belonging to a VHF band is used.

This VHF-plasma CVD method has advantages such that the film deposition rate is high and a high quality a-Si film can be produced. In view of this, the VHF-plasma CVD process is expected so that it can achieve a desirable reduction in the production cost of a product and an a-Si film having a desirably improved quality.

And various studies have been made of various film forming processes in which the VHF-plasma CVD method is used.

However, in the case of producing an a-Si series light receiving member comprising a light receiving layer formed on a large area substrate for use in electrophotography using the VHF-plasma CVD method, a problem is liable to entail in that a high quality a-Si film as the light receiving layer is difficult to form at a uniform thickness over the entire surface of the large area substrate. The reason for this is considered such that when the VHF electrode used in the VHF-plasma CVD process is of a relatively small size, the film formed on a surface area of the substrate situated in the vicinity of the VHF electrode differs from that formed on a surface area of the substrate which is remote from the VHF electrode in terms of the film thickness and property, and on the other hand, when the VHF electrode is of a relatively large size, a variation is occurred in the density of a VHF power applied and this variation entails a variation for the film formed on the substrate in terms of the film thickness and property.

In order to prevent this situation from occurring, it is considered to use a plurality of small-sized VHF electrodes. However, this is not always effective for the reason that abnormal discharge is sometimes generated between adjacent VHF electrodes or discharge generated sometimes becomes unstable, and as a result, it is difficult to stably produce a desirable light receiving member.

In any case, in the case of producing a plurality of light receiving members particularly for use in electrophotography having a large area and relatively thick light receiving layer with a uniform property in a single film formation process, the plasma CVD apparatus and the plasma CVD process employed are necessary to be sufficiently optimized.

However, for the purpose of mass-producing a light receiving member at a high productivity, when a high frequency power in an excessive quantity is applied in order to form a light receiving layer on an increased number of large area substrates at a high deposition rate in a single film formation process, a problem is liable to entail in that the stability of discharge generated is decreased. When the stability of discharge generated is decreased, discharge discontinuance or spark (abnormal discharge) are liable to occur. When discharge discontinuance is occurred during film formation, the formation of a film deposited is tentatively suspended to cause the formation of an interface at a portion of the film for which the discharge discontinuance has been occurred. In order to resume discharge under this circumstance, it is necessary to supply a high frequency power which is greater than ordinary discharge-commencing high frequency power, where a structural defect is liable to occur at the interfacial portion. In the case where the foregoing spark should have been occurred during the formation of a deposited film, a portion of the deposited film for which the spark has been occurred is liable to be locally inferior in terms of the film property.

In the case where a light receiving member having a light receiving layer comprising the deposited film having such defective portion is used in an electrophotographic apparatus, when image formation by ordinary electrophotographic image-forming process is repeated, the durability thereof is insufficient and because of this, so-called ghost phenomenon in which an image once reproduced in a given electrophotographic image formation cycle remains in the form of a ghost image on an image reproduced in the successive electrophotographic image formation cycle is occasionally occurred. In the case where the electrophotographic image formation is continuously repeated over a long period of time, so-called blank exposure is irradiated to a portion of the light receiving member which is situated between a copying sheet used in a given electrophotographic image formation cycle and another copying sheet used in the successive electrophotographic image formation cycle, in order to prevent toner from being adhered onto said portion. In this case, it is liable to have such an occasion that a phenomenon in which the density of an image reproduced on the portion of the light receiving member having irradiated with the blank exposure is thinned (this phenomenon is remarkable in the reproduction of a halftone image), namely, a blank exposure memory, is apparently occurred.

Now, in the past, the electrophotographic image reproduction was mainly for characters and therefore, the request on the market for the quality of an image reproduced was not so high, where the foregoing problems were not so serious.

However, in recent years, photo images or minute images are often subjected to electrophotographic image reproduction and therefore, there is an increased demand for further improving the quality of an image reproduced, where the foregoing problems are serious. In this connection and also in view of industrial sake, it is an urgent necessity to establish an adequate film-forming apparatus and an adequate film-forming process which enable to mass-produce a desirable light receiving member for use in electrophotography which is free of the foregoing problems at a high yield.

SUMMARY OF THE INVENTION

An object of the present invention is to provide a plasma CVD apparatus and a plasma processing method which can solve the foregoing problems in the prior art and can form a high quality deposited film having a remarkably uniform film thickness and an uniform film quality on a plurality of cylindrical substrates not only in the axial direction but also in the circumferential direction of each cylindrical substrate at a high speed whereby enabling to efficiently mass-produce a high quality semiconductor device.

Another object of the present invention is to provide a plasma CVD apparatus and a plasma processing method which can efficiently mass-produce, at a high yield, a desirable light receiving member for use in electrophotography having a light receiving layer constituted by a non-single crystalline material particularly a non-single crystalline material containing silicon atoms as a matrix which always stably exhibits satisfactory electric, optical and photoconductive properties without depending on use-environments, is not deteriorated even upon repeated use over a long period of time and excels in durability.

A further object of the present invention is to provide a plasma CVD apparatus and a plasma processing method in which a high frequency power introduction means for introducing a high frequency power of a VHF band which comprises a plurality of electrodes and a dielectric arranged between each adjacent electrodes is used, and which can stably and efficiently mass-produce a large area light receiving member for use in electrophotography having a light receiving layer comprising an a-Si film having a remarkably uniform film thickness and an uniform film quality, whose occasion of suffering from a photomemory being markedly diminished over the entire area, and which is satisfactory in uniformity with respect to electrophotographic characteristics including charge retentivity and photosensitivity, while sufficiently preventing the occurrence of discharge discontinuance and abnormal discharge found in the prior art.

A further object of the present invention is to provide a plasma CVD apparatus comprising a reaction chamber capable of being substantially vacuumed, substrate holding means and a cathode electrode arranged in said reaction chamber, in which a high frequency power is supplied to the cathode electrode to generate plasma between a substrate held by the substrate holding means and the cathode electrode whereby processing said substrate by said plasma, wherein said cathode electrode comprises a plurality of electrically conductive members on the same axis which are capacitively coupled by a dielectric member.

A still further object of the present invention is to provide a plasma processing method comprising the steps of: introducing a raw material gas into a reaction chamber capable of being substantially vacuumed and applying a high frequency power to a cathode electrode positioned in said reaction chamber to generating plasma whereby processing a substrate held by substrate holding means in the reaction chamber, wherein a cathode electrode comprises a plurality of electrically conductive members on the same axis which are capacitively coupled by a dielectric member is used as the cathode electrode.

BRIEF DESCRIPTION OF THE DRAWINGS

FIGS. 5(a) through 5(h), FIGS. 15(A) through 15(D), and FIG. 22 schematic views respectively for explaining an example of the constitution of a high frequency power introduction means (a cathode electrode) in the present invention.

FIG. 10, FIG. 11, FIG. 12, FIG. 13, and FIG. 14 are schematic cross-sectional views respectively illustrating an example of the layer configuration of a light receiving member for use in electrophotography in the present invention.

FIG. 17 and FIG. 20 respectively shows graphs of interrelations between unevenesses with respect to charge retentivity, photosensitivity and photomemory and oscillation frequencies (MHz).

FIG. 24 and FIG. 25 are schematic slant views for explaining an example of a plasma CVD apparatus.

DESCRIPTION OF THE INVENTION AND THE PREFERRED EMBODIMENTS

Figure 1:
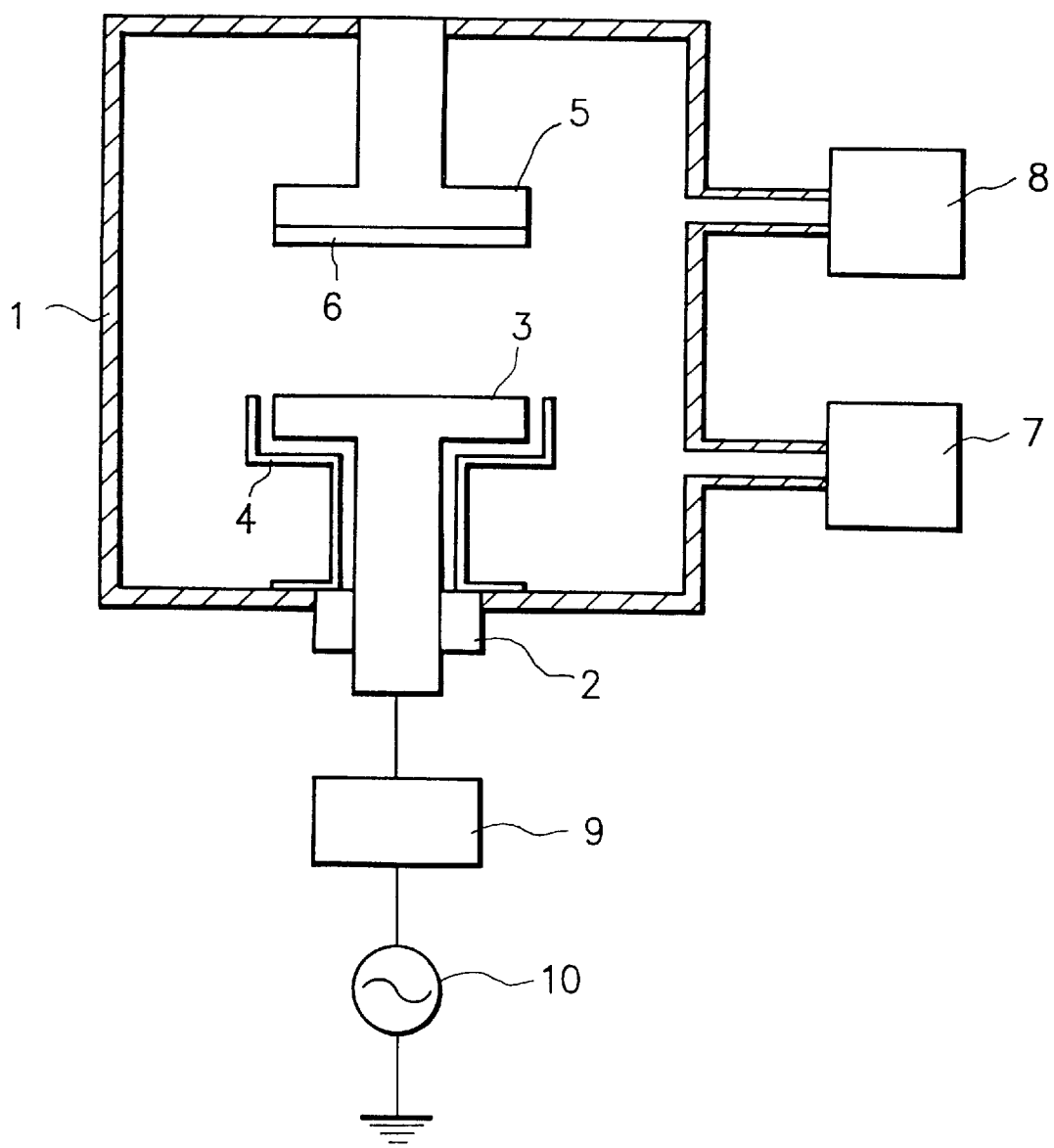
FIG. 1, FIGS. 2(A) and 2(B), FIG. 3, FIGS. 4(A) and 4(B), FIGS. 8(A) and 8(B), FIGS. 9(A) and 9(B), FIGS. 18(A) and 18(B), FIGS. 21(A) and 21(B), FIG. 23, FIGS. 26(A) and 26(B), FIGS. 27(A) and 27(B), FIGS. 28(A) and 28(B), and FIGS. 29(A) and 29(B) are schematic views respectively for explaining an example of a plasma CVD apparatus.

The present invention will be described, if necessary, while referring to the drawings.

First, description will be made of circumstances under which the present invention has been accomplished.

The present inventors conducted of discharge stability in various viewpoints. As a result, for the problem in that the discharge stability is deteriorated as the number of light receiving member produced in once film formation is increased, it was found that a delicate change in the dimension of the deposition chamber upon the film formation is a principal factor therefor. Particularly, as previously described, when a plurality of light receiving members are produced in once film formation by way of plasma CVD, it usually adopt a manner in which a plurality of substrates (cylindrical substrates) for these light receiving members are arranged in the deposition chamber and these substrates are rotated during the film formation in order to form a deposited film uniformly over the entire surface area of each substrate.

For this manner, the present inventors obtained such findings as will be described in the following. When the plurality of substrates are rotated in the discharge space, delicate changes are occurred in the substrate intervals and the like. This change sometimes causes a certain change in the volume of the discharge space, a delicate change in the gaseous pressure in the discharge space, or a certain change in the matching of the high frequency power. This situation will become remarkable as the number of substrate is increased, where the discharge stability is deteriorated accordingly.

In order to overcome these problems, the present inventors conducted various experimental studies of the film-forming apparatus and process. As a result, there was obtained a finding that when the frequency of a high frequency power used for decomposing a raw material gas is made to be in a specific range of 20 to 450 MHz, the discharge stability is improved. The reason for this is not clear enough for the time being. However, it is considered such that in comparison with the RF plasma CVD using the conventional frequency of 13.56 MHz or the microwave plasma CVD using the conventional frequency of 2.45 GHz, the frequency of 20 to 450 is superior with respect to the raw material gas decomposition efficiency and the energy-imparting performance to an active species provided as a result of the decomposition of the raw material gas.

As above described, in the conventional manner, the delicate changes in the substrate intervals and the like sometimes cause a certain change in the volume of the discharge space, a delicate change in the gaseous pressure in the discharge space, or a certain change in the matching of the high frequency power. These problems can be desirably diminished by using a high frequency power with a frequency in the foregoing specific range to improve the raw material gas decomposition efficiency and the energy-imparting performance to the active species.

As a result of further experimental studies aiming at improving the quality of a film deposited, the present inventors obtained a finding that the foregoing conventional manner has such subjects as will be described below, which are required to be solved.

(1) A subject relating to local deterioration of the uniformity of plasma generated:

As above described, by making the frequency of the high frequency power used for decomposing a raw material gas to be in a specific range of 20 to 450 MHz, the plasma stability is improved. Because of this, the film-forming conditions (the flow rate of a raw material gas, the gaseous pressure in the reaction chamber, the dimension of the apparatus, and the like) can be optionally determined in relatively wide ranges. However, on the other hand, it was found that there is an occasion in that the uniformity of plasma generated is locally deteriorated depending upon particular film-forming conditions. For instance, when film formation is conducted in a reaction chamber having a discharge space with a relatively large volume under high electric power condition, there is an occasion for the property of a film deposited to be locally inferior.

(2) A subject relating to an adverse effect based on a film deposited on a cathode electrode:

In the case where the cathode electrode is arranged in the discharge space, as the cathode electrode is at rest while the substrates are rotated, the thickness of a film deposited on the cathode electrode is several times that of a film deposited on each substrate. As the thickness of the film deposited on the cathode electrode is increased, the distortion (the internal stress) in the film is increased accordingly, where the film becomes to be in a state liable to readily peel off. When the film deposited on the cathode electrode is peeled off from the cathode electrode, there is an occasion such that flakes of the film are occurred, followed by flying due to the internal stress to arrive at and deposit on the substrates. When such film flake is deposited on the substrate, abnormal film growth based on a nucleus comprising the film flake is caused to form a spherically protruded portion in the film deposited on the substrate. This spherically protruded portion is different from the normal film portion with no deposition of the film flake in terms of the electric properties.

In the case where a light receiving member having a light receiving layer comprising such a deposited film as above described is used in an electrophotographic apparatus and image reproduction is repeated in accordance with ordinary electrophotographic image-forming process, there is a tendency in that a defective image having a blank area which is so-call "white dot" or another defective image having a stained area which is so-called "black dot" entail on a reproduced image, and this situation becomes remarkable as the image reproduction is continuously repeated. In addition, there is an occasion such that shadow-like fogging which is so-called "fogged dot" is occurred at the periphery of the white dot or the black dot.

For the foregoing cathode electrode, it is heated to a high temperature to due to the heat of plasma generated during the film formation. Since the cathode electrode is positioned in the discharge space, the temperature-rising rate of the cathode electrode is greater than that of the substrate because the substrate is rotated (the substrate temperature will be in equilibrium with about 200 to 300° C. in general) Therefore, for instance, in the case where an a-Si:(H,X) film is deposited on the cathode electrode, there is a tendency for the film to be reduced with respect to its electric resistance. The a-Si:(H,X) film whose electric resistance having reduced tends to take up or reflect the high frequency power applied in the discharge space. Because of this, there is an occasion such that the effective power of the high frequency power applied in the reaction chamber is decrease, whereby entailing reverse effects to the deposition rate or the property of a film deposited.

In this connection, the present inventors conducted experimental studies while focusing on the cathode electrode. As a result, there were obtained such findings as will be described in the following. When the cathode electrode is designed such that it has a structure with a plurality of reflection faces against the high frequency power applied and it has a roughened surface, it is possible to effectively solve the problem relating to the local deterioration of the uniformity of the plasma and the reverse effects of the film deposited on the cathode electrode.

The present invention has been accomplished based on the above described findings.

For the reasons why the foregoing problems can be solved by adopting such constitution as above described for the cathode electrode, the y are not clear enough for the time being. However, it is considered as will be described below.

(1) Description will be made of the local deterioration of the uniformity of the plasma.

For the reason why the uniformity of the plasma is locally deteriorated in the prior art, it is considered due to a standing wave of the high frequency power which is formed on the cathode electrode. For the high frequency power which propagates on the surface of the cathode electrode, the way for the high frequency power to propagate is changed depending upon the shape, length and constituent material and also depending upon the atmosphere in the discharge space (based on the flow rate of a raw material gas, the composition of the raw material gas, the gaseous pressure, and the like).

In addition, at a tip of the cathode electrode, reflection or divergence of the high frequency power is occurred. And under particular condition, there is an occasion such that a standing wave having a large amplitude is generated on the cathode electrode. When such standing wave is generated, the intensity of an electric field at a position of the cathode electrode which corresponds the loop of the standing wave greatly differs from that at a position of the cathode electrode which corresponds the node of the standing wave. Because of this, there is an occasion such that the potential of the plasma becomes uneven along the longitudinal direction of the cathode electrode at a level of influencing to the quality of a film deposited.

On the other hand, by making the cathode electrode to have a structure with a plurality of reflection faces against the high frequency power applied as previously described, a reflected wave can be forcibly generated at an optional position on the cathode electrode, and the form of an associated wave of a progressive wave and the reflected wave can be controlled as desired. By this, it is possible to uniform the intensity of the electric field in the discharge space.

In addition, by making the cathode electrode to have a plurality of regions capable of changing the phase of the high frequency power applied, the standing wave can be controlled as desired. By this, it is possible to improve the uniformity of the intensity of the electric field.

The cathode electrode in the present invention is constituted by a plurality of different materials to have a plurality of junction regions of the different materials, where the se junction regions serve as the foregoing reflection faces or the foregoing regions capable of changing the phase of the high frequency power applied. By this, the foregoing object can be attained.

The reason for this, it is considered such that although the high frequency is generally a surface wave which propagates on the surface of the cathode electrode, when the cathode electrode is constituted by a plurality of different materials, a reflected wave is generated at a junction between the different materials because the different materials respectively has a different dielectric constant. And when a dielectric material is interposed between the above different materials, it is considered such that an electrode situated above the dielectric material and an electrode situated below the dielectric material establish a capacitive coupling, where a phase difference of the high frequency is occurred.

In the following, an example of the configuration of a cathode electrode according to the present invention with reference to FIGS. 5 to 7.

Figure 6:
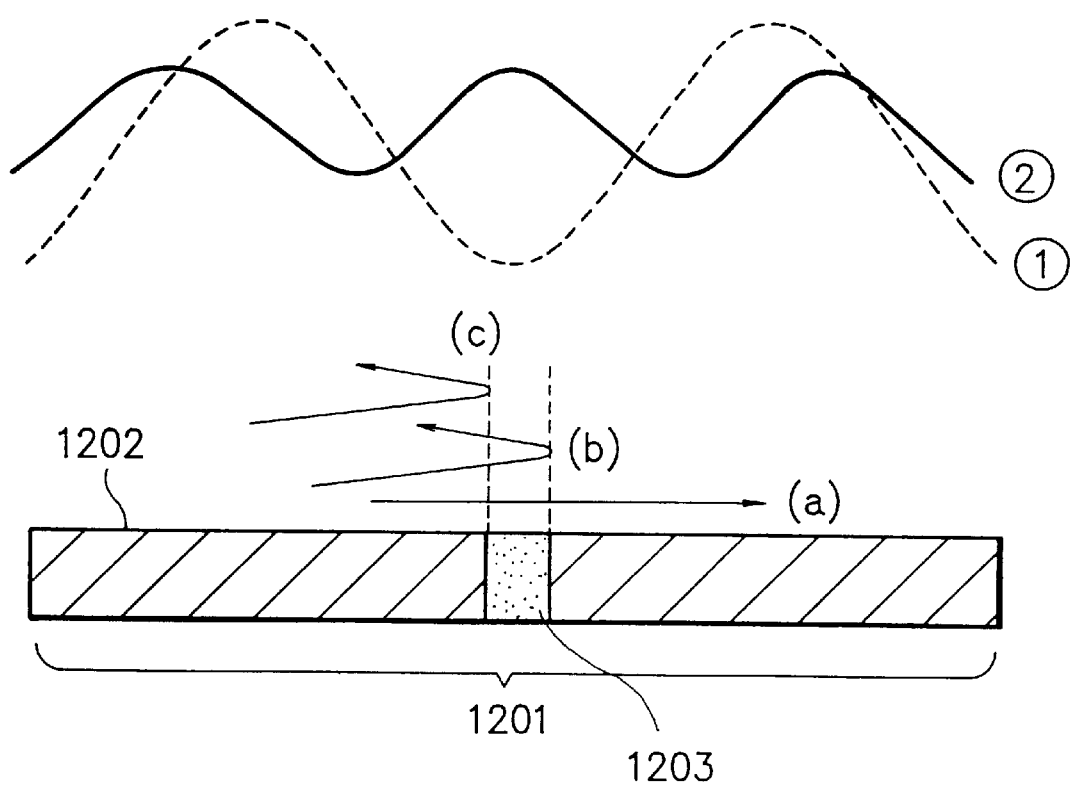
FIG. 6 and FIG. 7 are schematic views respectively for explaining influences to a high frequency power by a dielectric.
Figure 7:
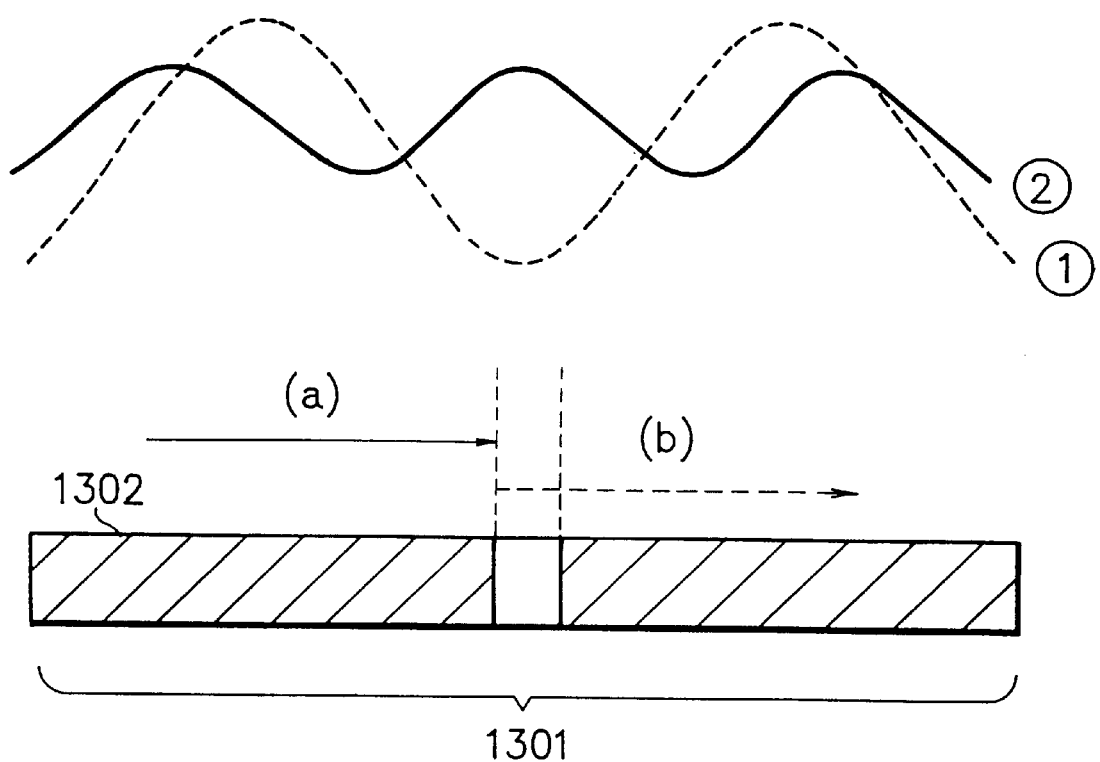

In FIGS. 5 to 7, each of reference numerals 1101, 1201, and 1301 indicates a cathode electrode, each of reference numerals 1102, 1202, and 1302 a constituent portion A, each of reference numerals 1103, 1203, and 1303 a constituent portion B, and reference numeral 1104 a constituent portion C.

FIGS. 5(*a*) through 5(*h*) are schematic views respectively illustrating an example of the configuration of a cathode electrode constituted by a plurality of different materials in the present invention. Particularly, FIGS. 5(*a*) through 5(*e*) are schematic views respectively illustrating an example of the configuration of a cathode electrode constituted by two different materials; FIG. 5(*f*) is a schematic view illustrating an example of the configuration of a cathode electrode constituted by three different materials; FIG. 5(*g*) is a schematic view illustrating an example in which a cathode electrode according to the present invention is provided with a dielectric cover 105; and FIG. 5(*h*) is a schematic view illustrating an example of a cathode electrode according to the present invention which comprises a plurality of electrode portions each constituted by a different material and having a different diameter.

In FIG. 5(*h*), the void portion shows a case where the constituent portion 1103 has a diameter which is smaller than that of the constituent portion 1102; and the portion indicated by a broken line shows a case where the constituent portion 1103 has a diameter which is greater than that of the constituent portion 1102.

FIG. 6 is a schematic explanatory view of a situation in that the intensity distribution of an electric field is uniformed in the case using a cathode electrode whose constituent portion being an electrically conductive material and which is provided with a cover comprising a dielectric material so as to establish reflection faces against a high frequency power.

In FIG. 6, (a) indicates a progressive wave, and each of (b) and (c) a reflected wave. And ① indicates an electric field intensity distribution intensity in the case of using a cathode electrode comprising a single constituent, and ② an electric field intensity distribution intensity in the case of using a cathode electrode having reflection faces.

From FIG. 6, it is understood that in the case where the cathode electrode is constituted by a plurality of constituent portions so that a reflected wave can be forcibly provided, and a progressive wave and the reflected are controlled, it is possible to more uniform the electric field intensity distribution.

FIG. 7 is a schematic explanatory view of a situation in that the intensity distribution of an electric field is uniformed in the case where a cathode electrode whose constituent portion being a combination of an electrically conductive material and a dielectric material and which can control the phase of a high frequency on the cathode electrode.

In FIG. 7, (a) indicates the original progressive wave, and (b) a progressive wave whose phase being shifted. And ① indicates an electric field intensity distribution intensity in the case of using a cathode electrode comprising a single constituent, and ② an electric field intensity distribution intensity in the case of using a cathode electrode having a region capable of changing the phase of a high frequency.

The cathode electrode shown in FIG. 6 is different from that shown in FIG. 7 with the following point. The former comprises the conductor and the dielectric cover provided on the conductor. On the other hand, the latter comprises the dielectric contained between the conductors. Particularly, in the configuration shown in FIG. 7, the constituent portion B is interposed between the constituent portions A, where capacitive coupling is established at the upper and lower portions of the constituent portion B. In this configuration, the phase of the progressive wave at the upper portion of the constituent B is different from that at the lower portion of the constituent portion B, and therefore, by controlling this phase, it is possible to uniform the electric field intensity distribution.

(2) Description will be made of the reverse effect of the film deposited on the cathode electrode.

For the film deposited on the cathode electrode, by controlling its structure, its adhesion, and its property against a high frequency power, it is possible to restrain the reverse effect of the film.

Specifically, when the cathode electrode has a roughened surface, an a-Si:(H,X) film deposited on the roughened surface of the cathode electrode excels in adhesion with the roughened surface, where the film is restrained from peeling off from the cathode electrode.

When the cathode electrode has a flat surface, an a-Si:(H,X) film is deposited on the flat surface of the cathode electrode in a uniform state. On the other hand, when the cathode electrode has an irregular surface, an a-Si:(H,X) film deposited on the irregular surface of the cathode electrode contains columnar structures the rein, where a relatively large amount of hydrogen atoms (H) or/and halogen atoms (X) is present at the interface of the a-Si:(H,X) grown into a columnar form. Because of this, the a-Si: (H,X) film has a high electric resistance and contains a relatively large number of defects. Hence, the a-Si:(H,X) film deposited on the irregular surface of the cathode electrode is high in electric resistance and small in temperature dependency.

It is considered that the loss in the high frequency power can be diminished because of the foregoing situations.

In the following, the present invention will be described in more detail.

For the constituent of the cathode electrode according to the present invention, there is no particular limitation as long as, in the direction of the high frequency power to propagate, the foregoing reflection face can be established and/or the foregoing phase can be desirably changed by using a combination of given constituent materials.

Specifically, the metallic constituent material can include, for example, metals such as Al, Cr, Ni, Mo, Au, In, Nb, Te, V, Ti, Pt, Pb, Fe, Co, Cu, and Mg; and alloys of these metals such as stainless steels, e.g., SUS 300 series stainless steels and SUS 400 series stainless steels under the JIS Standard. Besides, electrically insulating materials such as ceramics having a surface applied with electroconductive treatment are also usable.

The dielectric constituent material can include, for example, quartz glass, alumina ceramics, Teflon (trademark name) and the like.

For the combination of the foregoing constituent materials, there is no particular limitation. Specifically, it is possible to use two kinds of constituent materials or a combination of plural kinds of constituent materials (for instance, a combination of a conductor/a dielectric).

For the number of divided portions (the number of constituent portions, namely, the number of regions for changing the reflection face and the phase), there is no particular limitation. It should be properly determined depending upon the shape of the reaction chamber, the dimension of the discharge space, or the film-forming conditions (the kind of a raw material used, the gaseous pressure in the reaction chamber, and the like). According to the results of experimental studies by the present inventors, it is preferably in the range of 1 to 30, more preferably in the range of 1 to 20, most preferably in the range of 1 to 15.

For the unit length of each constituent portion of the cathode electrode (the thickness of the region for changing the reflection face and the phase), it may be either even or uneven. For the absolute value of the length, there is no particular limitation. However, according to the results of experimental studies by the present inventors while having a due care about the case wherein a large area is treated, for instance, as in the case of producing a light receiving member for use in electrophotography, for the conductor, it is preferably in the range of 0.1 mm to 30 cm, more preferably in the range of 0.2 mm to 20 cm, most preferably in the range of 0.3 mm to 15 cm. For the dielectric, it is preferably in the range of 0.1 mm to 5 cm, more preferably in the range of 0.2 mm to 3 cm, most preferably in the range of 0.3 mm to 2 cm.

For the reason why the unit length is different between the conductor and the dielectric, it is due to the following situation. In the case of the conductor, although a reflection face is established at a junction between different materials, it is electrically a conductor, where even when the reflection face-forming region is elongated at a certain extent, the high frequency power can transmit until the tip of the electrode. However, in the case where the dielectric is interposed between the conductors, when the thickness of the dielectric is increased at a certain extent, the transmittance of the high frequency power beyond the portion comprising the dielectric is prohibited or difficult, where there is a fear that the potential of a plasma generated becomes uneven.

Moreover, in the present invention, by optimizing the number, shape, size and the like of the cathode electrode, the uniformity of the plasma can be more improved.

As a result of experimental studies by the present inventors, there were obtained the following findings. That is, to use a plurality of cathode electrodes according to the present invention is effective in improving the uniformity of the plasma. However, when the number thereof is excessive, there is a tendency in that the discharge is disturbed. Therefore, the number of the cathode electrode used should be properly determined depending upon the apparatus used and also the situation involved. However, in general, the number of the cathode electrode used is preferably 20 or less, more preferably 15 or less, most preferably 10 or less.

For the cross-sectional form of the cathode electrode in the present invention, it is possible to be either polygonal or round. However, in order for the high frequency power to be uniformly introduced, it is desired to be a symmetrical form such as a round form or a regular polygonal form.

For the cross-sectional area of the cathode electrode in the present invention, it is desired to be preferably in the range of 70 mm$^2$ to 350 cm$^2$, more preferably in the range of 200 mm$^2$ to 200 cm$^2$, most preferably in the range of 300 mm$^2$ to 80 cm$^2$.

When the cathode electrode in the present invention is shaped in a cylindrical form, the cylindrical cathode electrode is desired to have a diameter preferably in the range of 5 mm to 10 cm, more preferably in the range of 8 mm to 8 cm, most preferably in the range of 10 mm to 5 cm. In this case, the diameter is not always necessary to be uniform along the longitudinal direction. Specifically, if necessary (in order to control the reflection), it is possible to change so as to provide a step on the cathode electrode.

For the total length of the cathode electrode in the present invention, being somewhat different depending upon the length of a substrate for film formation, but in general, it is preferably in the range of 5 to 200%, more preferably in the range of 10 to 180%, most preferably in the range of 20 to 150%, respectively versus the length of the substrate for film formation.

In the present invention, to cover the cathode electrode by a dielectric material such as alumina ceramics is effective. In this case, for instance, even in the case where a constituent material which is readily sputtered by the plasma is used in the cathode electrode, the constituent material used in the cathode electrode can be prevented from being sputtered by the plasma.

For the surface roughness of the cathode electrode or/and the dielectric cover, it is preferably in the range of 1.0 μm to 20 mm, more preferably in the range of 3.0 μm to 10 mm, most preferably in the range of 5.0 μm to 5 mm, respectively in terms of the ten-points average surface roughness.

For the manner of making the cathode electrode or/and the dielectric cover to have a roughened surface, there is no particular limitation. In any case, appropriate surface roughening is conducted depending upon the kind of the constituent material of the cathode electrode. Specifically, there can be optionally employed a manner in which minute spheres made of glass, ceramic, or metal (having a size of 10 μm to 10 mm) are sprayed onto the surface of an object while pressing them by air or liquid whereby forming irregularities at the surface; a manner of forming a uneven surface provided with regular irregularities by way of cutting byte processing; or a manner of forming a uneven surface provided with irregularities by way of chemical etching using acid or alkali.

In the present invention, in the case where a raw material gas-introducing means is positioned in the discharge space circumscribed by a plurality of cylindrical substrates, it is effective for the raw material gas-introducing means to have a roughened surface as well as the cathode electrode. In the present invention, the cathode electrode may be designed so as to serve also as the raw material gas-introducing means.

According to the knowledge obtained as a result of experimental studies by the present inventors, for the oscillation frequency of the high frequency power used in the present invention, it maybe, for instance, in the range of 20 to 600 MHz in terms of the frequency of the VHF band. Specifically, it is preferably in the range of 20 to 450 MHz, more preferably in the range of 51 to 250 MHz.

In the following, description will be made of the apparatus and method for producing a light receiving member for use in electrophotography in the present invention.

Figure 8A:
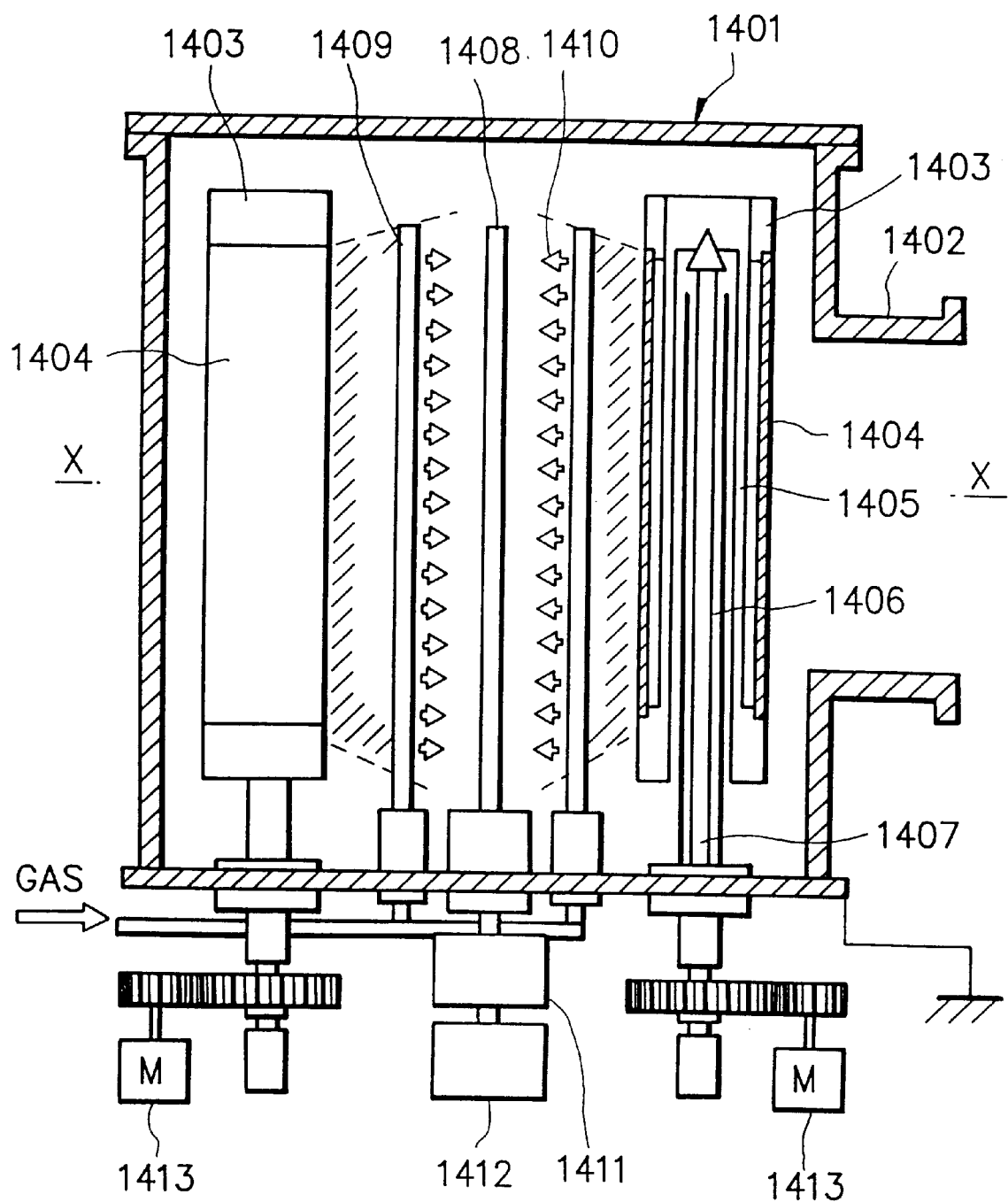
Figure 8B:
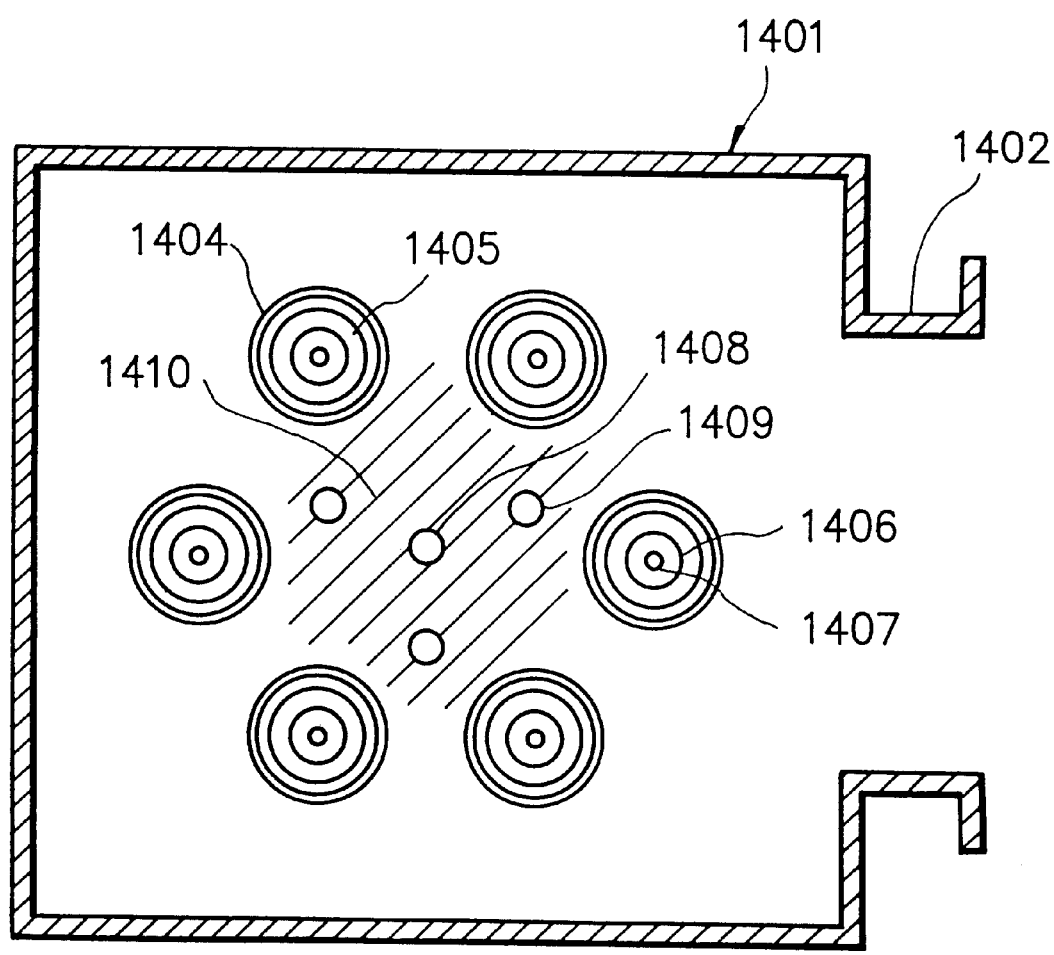

FIG. 8(A) is a schematic cross-sectional view illustrating an example of a plasma CVD apparatus which can be used as the film-forming apparatus in the case of producing a light receiving member for use in electrophotography in the present invention. FIG. 8(B) is a schematic cross-sectional view, taken along the line X—X in FIG. 8(A).

In FIGS. 8(A) and 8(B), reference numeral 1401 indicates a reaction chamber capable of being vacuumed. Reference numeral 1402 indicates an exhaust pipe, one end of which being open into the reaction chamber 1401 and the other end of which being connected to an exhaust device (not shown).

For the exhaust system comprising the exhaust pipe and the exhaust device, it is desired to comprise two independent exhaust systems each comprising an exhaust pipe and an exhaust device, one for evacuating air in the inside of the reaction chamber and the other for evacuating a film-forming raw material gas (which is either reactive or non-reactive), in view of preventing the residual gas from reacting with air in the exhaust pipe and the reaction chamber.

Reference numeral 1408 indicates a cathode electrode which is electrically connected to a high frequency power source 1412 (capable of generating a high frequency with the oscillation frequency in the present invention) through a matching box 1411.

In the reaction chamber 1401, six cylindrical substrate holders 1405 each having a cylindrical substrate 1404 (on which a film is to be formed) positioned thereon are concentrically and spacedly arranged in substantially parallel to each other. Reference numeral 1403 indicates a holder cap. Each cylindrical substrate holder 1405 is provided with a heater 1406 installed therein, which serves to heat the cylindrical substrate positioned thereon from the inner side. Each cylindrical substrate holder 1405 is held on a rotary shaft 1407 connected to a driving mechanism comprising a reduction gear and a driving motor 1413 so that when the driving motor 1413 is actuated, the rotary shaft 1407 is rotated through the reduction gear, whereby the cylindrical substrate positioned on the cylindrical substrate holder is rotated about the central axis in the generatrix direction.

Reference numeral 1410 indicates a discharge space circumscribed by the six cylindrical substrate holders 1405 each having the cylindrical substrate 1404 positioned thereon.

The reaction chamber 1401 is provided with three longitudinal gas feed pipes 1409 which are arranged in the discharge space 1410. Each gas feed pipe 1409 is provided a plurality of gas release nozzles (not shown) capable of uniformly supplying a raw material gas into the discharge space 1410, as indicated by arrow marks in FIG. 8(A). All the gas feed pipes 1409 are communicated with a raw material gas supply system including a plurality of gas reservoirs (not shown).

The production of an electrophotographic light receiving member using the apparatus shown in FIGS. 8(A) and 8(B) is conducted, for example, as will be described below.

The inside of the reaction chamber 1401 is evacuated to a vacuum degree of less than $1 \times 10^{-5}$ Torr through the exhaust pipe 1402 while operating the exhaust device (not shown). In this case, in order to prevent dust and the like in the reaction chamber 1401 from flying up, the evacuation at the beginning is desired to be slowly conducted by way of so-called slow evacuation.

Then, the cylindrical substrates 1404 are heated to and maintained at a predetermined temperature in the range of 20 to 500° C. by means of the heater 1406. In this case, in order to improve the thermal conduction between the heater and the cylindrical substrate so as to uniformly heat the entire of the cylindrical substrate, it is possible to introduce gas, which is stable against heat and non-reactive with the cylindrical substrate such as inert gas, hydrogen gas or the like, into the reaction chamber. In the case of forming an oxide film on the surface of the cylindrical substrate, to heat the cylindrical substrate in an atmosphere containing oxygen gas is effective.

Herein, the heater (the heating means) for heating the cylindrical substrate may comprise a heat-generating body usable in a vacuum atmosphere. Specific examples of such heat generating body are electric resistance heat-generating bodies such as coil heater comprising a sheath-like heater, plate-like heater, and ceramic heater; thermal radiation lamp heat-generating bodies such as halogen lamp, and infrared ray lamp; and heat-generating bodies by way of heat exchange using a temperature transfer medium comprising liquid or gas. The surface constituent of the heating means may be a metallic material such as stainless steel, Ni, Al, or Cu. Besides, ceramics and heat resistant polymer resins are also usable.

Other than those above mentioned, it is possible to adopt a manner in which the cylindrical substrate is heated in an independent heating vessel other than the reaction chamber, followed by transporting the substrate into the reaction chamber in a vacuumed atmosphere.

Now, after the temperature of each cylindrical substrate becomes stable at the predetermined temperature, the inside of the reaction chamber is once evacuated to a predetermined vacuum degree, followed introducing a film-forming raw material gas for forming a first layer region into the reaction chamber 1401 through the gas feed pipes 1409. For instance, in the case of forming an a-Si:(H,X) film doped with a dopant as the first layer region, silane gas, diborane gas (as a doping gas) and helium gas or the like (as a dilution gas) are introduced into the reaction chamber 1401.

Simultaneously with this, a high frequency power with an oscillation frequency of 20 to 450 MHz generated by the high frequency power source 1412 is applied into the reaction chamber 1401 through the matching box 1411 and the cathode electrode 1408, where in the discharge space 1410 circumscribed by the cylindrical substrates 1404, the foregoing raw material gases present therein are excited and dissociated by the energy of the above high frequency to produce active species such as neutral radicals, ion particles and electrons, and these are reacted with each other to cause the formation of the Si:(H,X) film on the surface of each cylindrical substrate 1404. By rotating each cylindrical substrate 1404 in the generatrix direction as above described in this case, the Si:(H,X) film can be uniformly formed over the entire surface of the cylindrical substrate. By this, the formation of the first layer region is completed.

In the case of forming a second layer region on the first layer region formed in the above, the formation thereof is conducted by repeating the above film-forming procedures employed for the formation of the first layer region, except for changing the composition (the composition ratio) of the raw material gases so to suite for the formation of the second layer region. In this case, it is not always necessary to once suspend the discharge and evacuate the inside of the reaction chamber to a high vacuum degree. For instance, it is possible to take a manner such that by properly controlling gas flow rate-controlling means (not shown) by way of manual manner or by means of a computer (not shown), the gas composition used in the formation of the first layer region gradually is switched to a predetermined gas composition (a predetermined gas composition ratio) suitable for the formation of the second layer region under condition of maintaining the discharge.

In the present invention, it is possible to supply a high frequency power from the opposite end sides of the cathode electrode (the high frequency electrode). In this case, although the size of the conductor of the electrode is adjusted so as to prevent occurrence of an unevenness in the density of a high frequency power supplied, the high frequency electrode as a whole enables to uniformly supply a high frequency power in the entire of the film-forming space (the discharge space), where a deposited film having a uniform property and thickness can be obtained.

By interposing the dielectric between the conductors as previously described, the stability of the discharge can be improved while preventing occurrence of abnormal discharge between the conductors. For the causes why, in the case where no dielectric is interposed between the respective conductors, the discharge becomes unstable and abnormal discharge frequently occurs between the respective conductors, they are not clear enough from the time being. However, it is considered such that power inconsistencies such as deviations of the frequency, phase, and voltage of the high frequency power supplied to the respective conductors, and deviations of the direct current voltage components among the respective conductors contribute to the causes.

In the present invention, as previously described, by interposing the dielectric between the respective conductors, these conductors are electrically coupled by way of capacitive coupling. Because of this, the respective conductors are not completely isolated one from the other in terms of the electrical meaning, where a given conductor receives power supply from the adjacent conductor in accordance with the coupling coefficient between them. It is considered that this situation results in relaxing such power inconsistencies as above described whereby preventing the discharge from becoming unstable.

Further in addition, the interposition of the dielectric between the respective conductors breaks the shortest route between the respective conductors. It is considered that even when abnormal discharge should be just about to occur at a certain part between the respective conductors, this situation results in restraining the growth thereof, whereby preventing occurrence of abnormal discharge.

For the optimum coupling coefficient when the dielectric is interposed between the respective conductors, it cannot be unconditionally determined, but it should be determined depending upon the film-forming conditions involved, such as the kind and flow rate of a raw material gas used, the gaseous pressure upon the film formation, the high frequency power applied upon the film formation, and the like.

In the following, an embodiment of the present invention will be described with reference to the drawings.

Figure 9A:
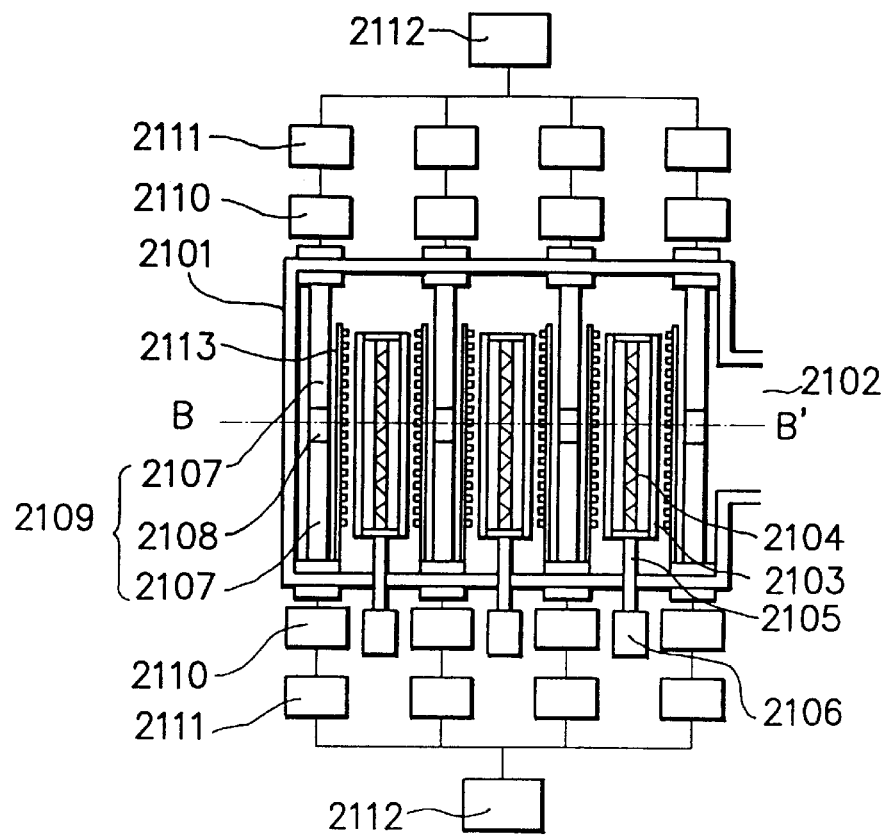
Figure 9B:
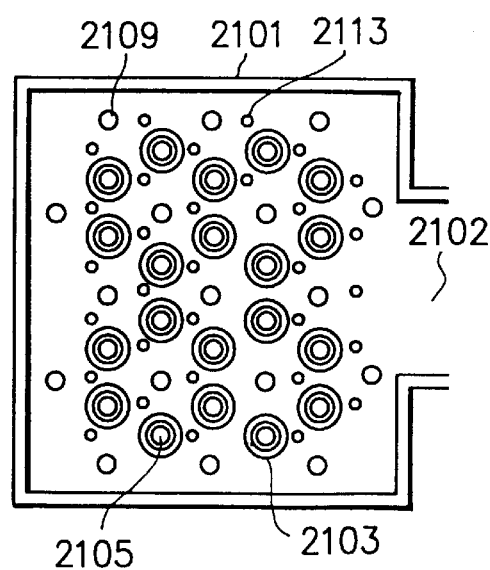

FIG. 9(A) is a schematic cross-sectional view illustrating an example of a plasma CVD apparatus which can be used as the film-forming apparatus in the case of producing a light receiving member for use in electrophotography in the present invention. FIG. 9(B) is a schematic cross-sectional view, taken along the line B—B' in FIG. 9(A).

In FIGS. 9(A) and 9(B), reference numeral 2101 indicates a reaction chamber capable of being vacuumed. Reference numeral 2102 indicates an exhaust pipe, one end of which being open into the reaction chamber 2101 and the other end of which being connected to an exhaust device (not shown).

Reference numeral 2103 indicates a cylindrical substrate positioned on a cylindrical substrate holder held on a rotary shaft 2105 connected to a driving mechanism comprising a reduction gear (not shown) and a driving motor 2106 so that when the driving motor 2106 is actuated, the rotary shaft 2105 is rotated whereby rotating the cylindrical substrate positioned on the cylindrical substrate holder. Each cylindrical substrate holder is provided with a heat generating means 2104 installed therein, which serves to heat the cylindrical substrate 2103 positioned thereon from the inner side.

Reference numeral 2107 indicates a rod-like conductor, and reference numeral 2108 an electrode-coupling inbetween portion comprising a dielectric material which is interposed between the adjacent conductors 2107.

Reference numeral 2109 indicates a high frequency power introduction means comprising a body comprising the two conductors 2107 and the electrode-coupling inbetween portion 2108 which are arranged substantially on the same axis.

Reference numeral 2110 indicates a phase adjuster, reference numeral 2111 a matching box, and reference numeral 2112 a high frequency power source. Herein, a high frequency power from the high frequency power source 2112 transmits through the matching box 2111 into the phase adjuster 2110 where it is subjected to phase adjustment, followed by supplying into the reaction chamber 2101 by means of the high frequency power introduction means 2109.

Reference numeral 2113 indicates a raw material gas supply means which is provided with a plurality of gas release nozzles capable of uniformly supplying a raw material gas into the reaction chamber 2101. All the raw material gas supply means 2113 are communicated with a raw material gas supply system including a plurality of gas reservoirs (not shown).

For the conductors 2107, their dimensions and forms may be the same or different from each other.

For the dielectric material by which the electrode-coupling inbetween portion 2108, there is no particular limitation. However, it is preferred to use a dielectric material which is highly heat resistant and highly electrically insulative. Such dielectric material can include, other than those previously mentioned, ceramics such as alumina ($Al_2O_3$), beryllia (BeO), magnesia (MgO), silicon nitride ($Si_3N_4$), boron nitride (BN), steatite ($MgO.SiO_2$), zircon ($ZrO_2.SiO_2$), cordierite ($2MgO.2Al_2O_3.5SiO_2$), zircon cordierite ($ZrSiO_4$—$2MgO.2Al_2O_3.5SiO_2$), and mica ceramics; and glasses. These may used either singly or in combination with two or more of them.

In FIG. 9(A), the high frequency power introduction means 2109 comprises two conductors 2107 and one electrode-coupling inbetween portion 2108 as above described. However this is not limitative. The number of the conductor may be greater than 2. In any case, it is necessary to interpose the electrode-coupling inbetween portion between each adjacent two conductors.

For the high frequency power introduction means 2109, it may take a configuration such that the exteriors of the conductors and the electrode-coupling inbetween portion are covered by an appropriate dielectric material.

Such dielectric material can include, for example, ceramics such as alumina ($Al_2O_3$), aluminum nitride (AlN), beryllia (BeO), magnesia (MgO), silicon nitride ($Si_3N_4$), boron nitride (BN), steatite ($MgO.SiO_2$), and zircon ($ZrO_2.SiO_2$); and glasses.

The outline of a manner of forming a deposited film using the apparatus shown in FIGS. 9(A) and 9(B) is as will be described below.

First, a plurality of cylindrical substrates 2103 (on which a film is to be formed) are arranged in the reaction chamber 2101. Then, the inside of the reaction chamber 2101 is evacuated through the exhaust pipe 2102 while operating the exhaust device (not shown).

Successively, the cylindrical substrates 2103 are heated to and maintained at a predetermined temperature in the range of 200 to 300° C. by means of the heat generating means 2104.

After the temperature of each cylindrical substrate 2103 becomes stable at the predetermined temperature, given film-forming raw material gas is introduced into the reaction chamber 2101 through the raw material gas supply means 2113.

After confirming that the flow rate of the film-forming raw material gas is stable at a predetermined flow rate and that the gaseous pressure in the reaction chamber 2101 is stable at a predetermined pressure, a high frequency power from the high frequency power source 2112 is supplied to the conductors 2107 of the high frequency power introduction means 2109 through the matching box 2111 and the phase adjuster 2110, where the high frequency power is radiated into the film-forming space by the high frequency power introduction means 2109 to cause glow discharge in the film-forming raw material gas in the film-forming space, whereby the film-forming raw material gas is excited and dissociated to cause the formation of a deposited film on the surface of each cylindrical substrate 2130. In this case, by rotating each cylindrical substrate 2103 at a predetermined speed through the rotary shaft 2105 by the driving motor 2106, the deposited film can be uniformly formed over the entire surface of the cylindrical substrate.

In the following, description will be made of some examples of a light receiving member produced according to the present invention while referring to the drawings.

In each of FIGS. 10 to 14, there is shown an typical example of a light receiving member produced according to the present invention. In FIGS. 10 to 14, reference numeral 500 indicates the entire of a light receiving member.

Figure 10:
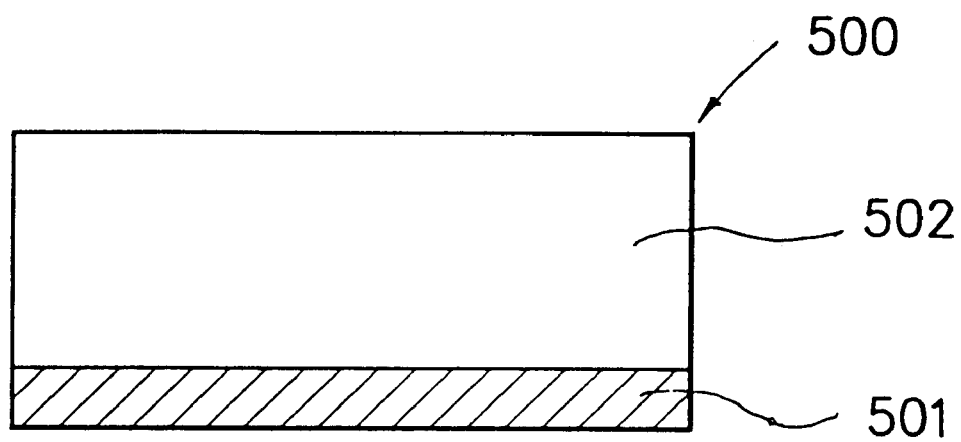

FIG. 10 is a schematic cross-sectional view illustrating an example of a light receiving member which comprises a photoconductive layer 502 disposed on a substrate 501.

Figure 11:
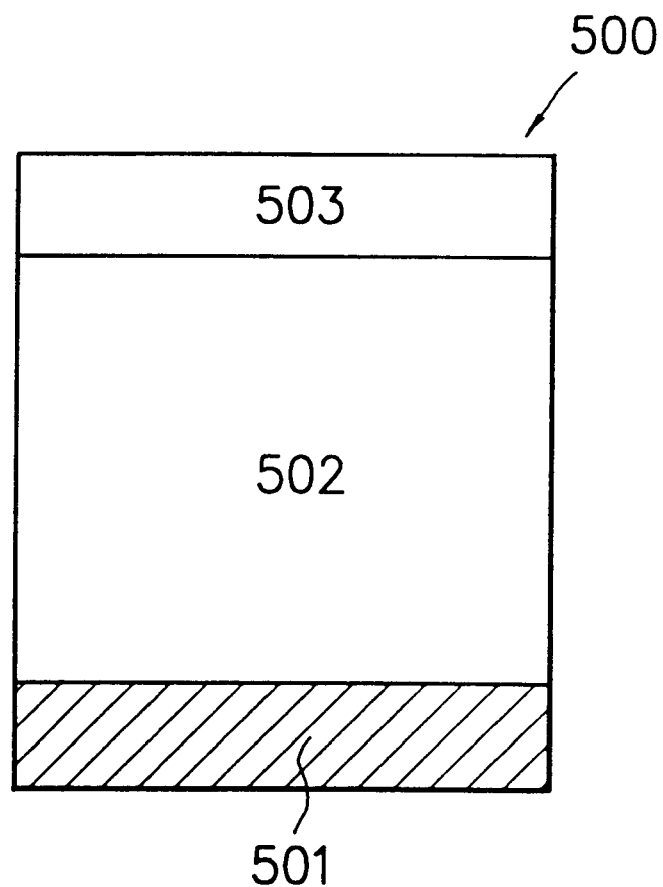

FIG. 11 is a schematic cross-sectional view illustrating an example of a light receiving member which comprises a photoconductive layer 502 and a surface layer 503 stacked in the named order on a substrate 501.

FIG. 12 is a schematic cross-sectional view illustrating an example of a light receiving member which comprises a charge injection inhibition layer 504, a photoconductive layer 502 and a surface layer 503 stacked in the named order on a substrate 501.

Figure 13:
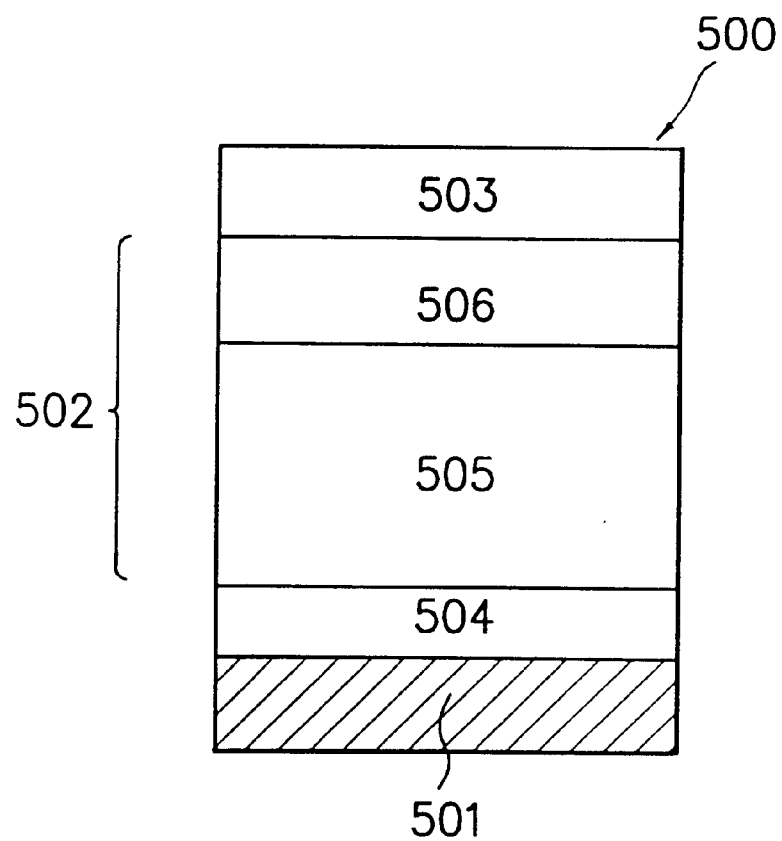

FIG. 13 is a schematic cross-sectional view illustrating an example of a light receiving member which comprises a charge injection inhibition layer 504, a photoconductive layer 502 and a surface layer 503 stacked in the named order on a substrate 501, wherein the photoconductive layer 502 has a charge transportation layer 505 and a charge generation layer 506 in the named order from the substrate 501 side.

Figure 14:
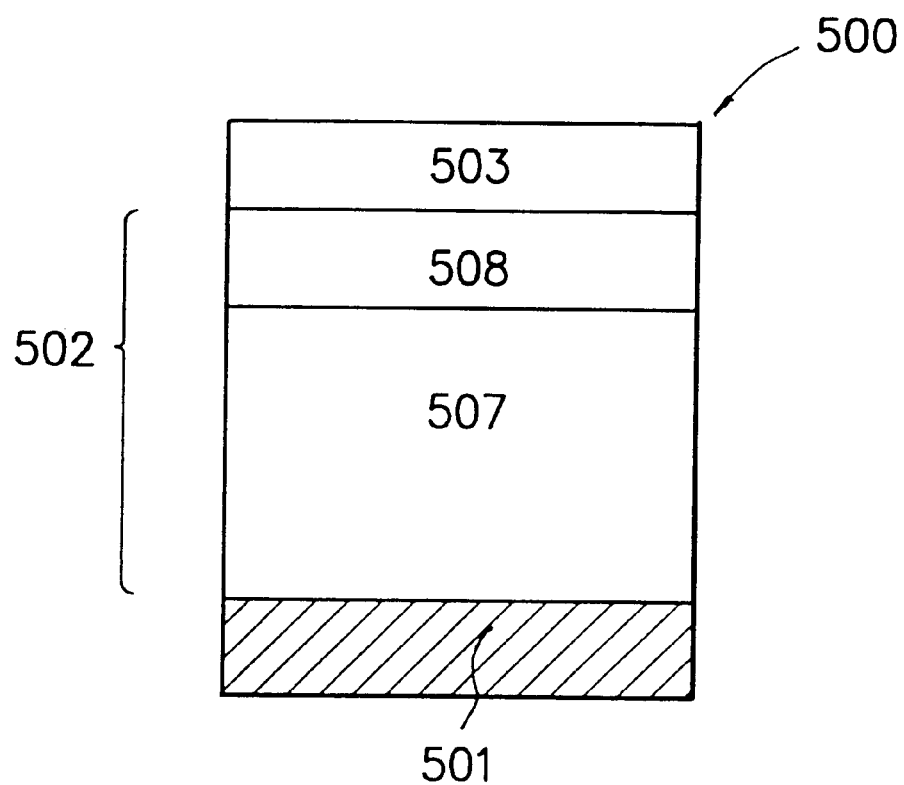

FIG. 14 is a schematic cross-sectional view illustrating an example of a light receiving member which comprises a photoconductive layer 502 and a surface layer 503 stacked in the named order on a substrate 501, wherein the photoconductive layer 502 has a first photoconductive layer region 507 and a second photoconductive layer region 508 in the named order from the substrate 501 side.

In any case, the interface between the adjacent layer may be made such that it has a distinct boundary. Alternatively, it is possible to provide a transition region at the interface.

It should be understood that these layer configurations shown in FIGS. 10 to 14 only for illustrative purposes and they can be optionally modified as desired. For instance, it is possible to provide a layer region, which contains at least aluminum atoms, silicon atoms and hydrogen atoms being unevenly distributed in the layer thickness direction, on the substrate side in contact with the photoconductive layer.

Description will be made of each constituent in the foregoing configurations.

Substrate 501

The substrate 501 used in the present invention may either be electrically conductive or electrically insulative. The electrically conductive substrate can include, for example, metals such as Al, Cr, Mo, Au, In, Nb, Te, V, Ti, Pt, Pd, Fe, Co, Cu, and Mg; and alloys of these metals such as stainless steels.

The electrically insulative subtrate can include, for example, films or sheets of synthetic resins such as polyester, polyethylene, polycarbonate, cellulose acetate, polypropylene, polyvinyl chloride, polystyrene and polyamide, glass, and ceramics. Any of these films and sheets are desired to be applied with electroconductive treatment to at least a surface thereof on which a light receiving layer is to be formed. In this case, the remaining surface may be also applied with electroconductive treatment.

The substrate may be a cylindrical form or a plate-like endless belt form, having a flat or irregular surface.

The thickness of the substrate should be properly determined so that a desired light receiving member for use in electrophotography can be produced. In the case where flexibility is required for the light receiving member, it can be made as thin as possible within a range capable of sufficiently providing the function as the substrate. However, the thickness is usually made to be greater than 10 μm in view of the fabrication and handling or mechanical strength of the substrate.

It is possible for the surface of the substrate 501 to be of an uneven surface. For instance, in the case where image formation is conducted using coherent monochromatic light such as laser beams, the uneven surface of the substrate may be a uneven surface provided with irregularities in order to prevent occurrence of defective images caused by a so-called interference fringe pattern being apt to appear in a visible image formed. The irregularities herein may be based on a plurality of spherical dimples. Particularly, their regularities may comprise a plurality of spherical dimples whose sizes are smaller than the resolution required for the electrophotographic light receiving member. By this, there can be obtained a highly fine image even in the case of coherent monochromatic light.

Photoconductive Layer 502

The photoconductive layer 502 may take a single-layered structure or a functionally divided layer structure comprising, for instance, a charge generation layer and a charge transportation layer.

The photoconductive layer 502 is typically constituted by a non-single crystalline material having a desired property, which is formed by a plasma CVD process using a high frequency with an oscillation frequency of 20 to 450 MHz, if necessary, while applying a bias voltage to the cathode electrode.

For instance, in order to form a photoconductive layer 502 comprising an a-Si film, basically, raw material gas capable of supplying at least silicon atoms (Si) is introduced in a desired gaseous state into a reaction chamber capable of being vacuumed in which a substrate 501 is positioned, wherein using a high frequency with an oscillation frequency of 20 to 450 MHz while applying a bias voltage to the cathode electrode, glow discharge is caused, whereby said a-Si film (usually containing hydrogen atoms (H)) as the photoconductive layer 502 is formed on the substrate 501.

The formation of a photoconductive layer 502 comprising an a-Si:(H,X) film may be conducted by introducing a raw material gas capable of supplying silicon atoms (Si) and a raw material gas capable of supplying hydrogen atoms (H) or/and a raw material gas capable of supplying halogen atoms (X) respectively in a desired gaseous state into a reaction chamber capable of being vacuumed in which a substrate 501 is positioned, wherein using a high frequency with an oscillation frequency of 20 to 450 MHz while applying a bias voltage to the cathode electrode, glow discharge is caused, whereby said a-Si:(H,X) film as the photoconductive layer 501 is formed on the substrate 501.

The photoconductive layer 502 containing silicon atoms (Si) as the main component is necessary to contain hydrogen atoms (H) or/and halogen atoms (X) in order to compensate dangling bonds of the Si and also in order to improve the layer quality, particularly in order to improve the photoconductivity and the charge retentively.

The amount of the hydrogen atoms (H), the amount of the halogen atoms (X), or the sum (H+X) of the amounts for the hydrogen atoms (H) and the halogen atoms (X) to be incorporated into the photoconductive layer is preferably in the range of 10 to 40 atomic %, more preferably in the range of 15 to 25 atomic %, respectively versus the total amount of the entire constituent atoms of the photoconductive layer.

The raw material capable of supplying Si can include, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying materials may be used either singly or in combination with two or more of them.

In order to structurally introduce hydrogen atoms (H) into the photoconductive layer 502 while readily controlling the amount of the hydrogen atoms to be introduced into the layer, it is effective to conduct the layer formation by mixing a desired amount of $H_2$ gas or/and He gas, or a gaseous silicon compound containing hydrogen atoms with the foregoing Si-supplying gaseous raw material.

As the raw material capable of supplying the halogen atoms (X), there can be mentioned gaseous or gasifiable halogen compounds such as gaseous halogen, halides, inter-halogen compounds, and hydrogenated silicon compounds containing halogen atoms, namely, halogen-substituted silane derivatives.

Preferable examples are fluorine gas (F2) as such gaseous halogen; BrF, ClF, $ClF_3$, $BrF_3$, $BrF_5$, $IF_3$, and $IF_7$ as such inter-halogen compound; and $SiF_4$ and $Si_2F_6$ as such halogen-substituted silane derivative.

To control the amount of the hydrogen atoms (H) or/and that of the halogen atoms (X) to be contained in the photoconductive layer 502 may be conducted by properly controlling the related factor such as the temperature of the substrate 501, the amount of the gaseous raw material capable of supplying hydrogen atoms (H) or/and halogen atoms (X) to be introduced into the reaction chamber, or the discharging power.

If necessary, the photoconductive layer 502 may contain atoms of a conductivity controlling element (hereinafter referred to as conductivity controlling atoms).

In this case, the photoconductive layer 502 may contain the conductivity controlling atoms such that they are uniformly distributed in the entire layer region or such that they are unevenly distributed in a partial layer region in the layer thickness direction.

As the conductivity controlling element, so-called impurities in the field of the semiconductor can be mentioned, and those usable herein can include elements belonging to group IIIb of the periodic table which provide a p-type conductivity (hereinafter simply referred to as group IIIb element) and elements belonging to group Vb of the periodic table which provide an n-type conductivity (hereinafter simply referred to as group Vb element).

Specific examples of the group IIIb element are B, Al, Ga, In, and Tl, of these elements, B, Al and Ga being particularly preferable.

Specific examples of the group Vb element are P, As, Sb, and Bi, of these elements, P and As being particularly preferable.

The amount of the conductivity controlling atoms contained in the photoconductive layer 502 is preferably in the range of from $1\times10^{-2}$ to $1\times10^{4}$ atomic ppm, more preferably in the range of from $5\times10^{-2}$ to $5\times10^{3}$ atomic ppm, or most preferably in the range of from $1\times10^{-1}$ to $1\times10^{3}$ atomic ppm.

The structural introduction of atoms of a given conductivity controlling element, specifically, atoms of a given group IIIb element (this atoms will be hereinafter referred to as group IIIb atoms) or atoms of a given Vb element (this atoms will be hereinafter referred to as group Vb atoms) into the photoconductive layer 502 may be conducted by introducing, in addition to the gaseous raw materials for the formation of the photoconductive layer, a gaseous raw material capable of supplying the group IIIb or Vb atoms into the reaction chamber upon the formation of the photoconductive layer.

Such group IIIb or Vb atom-supplying raw material can include raw materials capable of supplying group IIIb or Vb atoms, which are in the gaseous state at room temperature or can be easily gasified at least under the conditions for the formation of the photoconductive layer.

Such group IIIb atom-supplying gaseous or gasifiable raw material can include hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$. Besides, $AlCl_3$, $GaCl_3$, $Ga(CH_3)_3$, $InCl_3$, and $TlCl_3$ are also usable.

Such group Vb atom-supplying gaseous or gasifiable raw material can include phosphorous hydrides such as $PH_3$ and $P_2H_4$; and phosphorous halides such as $PH_4I$, $PF_3$, $PF_5$, $PCl_3$, $PCl_5$, $PBr_3$, $PBr_5$ and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable.

Any of the above mentioned raw materials may be diluted with $H_2$ gas, He gas or a mixture of these gases, if necessary, upon the introduction thereof into the reaction chamber.

If necessary, the photoconductive layer 502 may contain at least one kind of atoms selected from the group consisting of carbon atoms, oxygen atoms, and nitrogen atoms (this atoms will be hereinafter referred to as atoms (C, O, N)). In this case, the atoms (C, O, N) may be contained in the photoconductive layer such that they are uniformly distributed in the entire layer region or such that they are unevenly distributed in a partial layer region in the layer thickness direction.

For the amount of the atoms (C, O, N) contained in the photoconductive layer 502, it is preferably in the range of $1\times10^{-5}$ to 10 atomic %, more preferably in the range of $1\times10^{-4}$ to 8 atomic %, most preferably in the range of $1\times10^{-3}$ to 5 atomic %, respectively versus the sum of the amount of the silicon atoms and that of the atoms (C, O, N).

For the thickness of the photoconductive layer 502, it should be properly determined so as to attain desired electrophotographic characteristics therefor and also in economical viewpoints. However, in general, it is generally in the range of 1 to 1000 µm, preferably in the range of 5 to 50 µm, more preferably in the range of 20 to 50 µm, most preferably in the range of 23 to 45 µm.

In order to form a photoconductive layer having a desired film property, it is necessary to adequately adjust the mixing ratio between the Si-supplying raw material gas and the dilution gas, the gaseous pressure in the reaction chamber, the discharging power, and the substrate temperature (Ts).

For the flow rate of the dilution gas (comprising $H_2$ gas, He gas, or a mixture of these gases), its optimum range should be determined in accordance with a previously established layer design.

For the gaseous pressure in the reaction chamber, its optimum range should be also determined in accordance with the previously established layer design. However, in general, it is generally in the range of $1\times10^{-5}$ to 100 Torr or preferably in the range of $5\times10^{-5}$ to 30 Torr. In a preferred embodiment, it is desired to be preferably in the range of $1\times10^{-4}$ to 10 Torr, more preferably in the range of $5\times10^{-4}$ to 5 Torr, most preferably in the range of $1\times10^{-3}$ to 1 Torr.

For the substrate temperature (Ts), its optimum range should be also determined in accordance with the previously established layer design. However, in general, it is preferably in the range of 20 to 500° C., more preferably in the range of 50 to 480° C., most preferably in the range of 100 to 450° C.

However, the actual conditions for forming the photoconductive layer 502 such as the substrate temperature and the gaseous pressure in the reaction chamber cannot usually be determined with ease independent of each other. Accordingly, the conditions optimal to the layer formation are desirably determined based on relative and organic relationships for forming the photoconductive layer having desired properties.

Surface Layer 503

The surface layer 503 is constituted by a non-single crystalline material film having desired physical and electric characteristics and use-environmental characteristics, which is formed by a plasma CVD process using a high frequency with an oscillation frequency of 20 to 450 MHz, if necessary, while applying a bias voltage to the cathode electrode.

Specifically, the surface layer 503 is constituted by, for instance, an amorphous silicon material containing hydrogen atoms (H) or/and halogen atoms (X), and carbon atoms (C) (hereinafter referred to as a-SiC: (H,X)); an amorphous silicon material containing hydrogen atoms (H) or/and halogen atoms (X), and oxygen atoms (O) (hereinafter referred to as a-SiO:(H,X)); an amorphous silicon material containing hydrogen atoms (H) or/and halogen atoms (X), and nitrogen atoms (N) (hereinafter referred to as a-SiN:(H,X)); or an amorphous silicon material containing hydrogen atoms (H) or/and halogen atoms (X), and two or more kinds of atoms selected from the group consisting of carbon atoms (C), oxygen atoms (O) and nitrogen atoms (N) (hereinafter referred to as a-SiCON:(H,X)). Besides, an amorphous carbon (a-C) is also usable.

The surface layer 503 may be formed by a vacuum film-forming process under previously established film-forming conditions so that a layer having a desired property as the surface layer can be formed.

For instance, in order to form a surface layer 503 comprising an a-SiC: (H,X) film, a raw material gas capable of supplying silicon atoms (Si), a raw material gas capable of supplying carbon atoms (C), and a raw material gas capable of supplying hydrogen atoms (H) or/and a raw material gas capable of supplying halogen atoms (X) are introduced respectively in a desired gaseous state into a reaction chamber capable of being vacuumed in which a substrate 501 is positioned, wherein using a high frequency with an oscillation frequency of 20 to 450 MHz, if necessary, while applying a bias voltage to the cathode electrode, glow discharge is caused in the foregoing raw material gases introduced therein, whereby said a-SiC: (H,X) film as the surface layer 503 is formed on the substrate 501.

As the constituent material of the surface layer 503, silicon-containing amorphous materials are desirably used. Of these, silicon-containing amorphous materials containing at least one kind of atom selected from the group consisting of carbon atoms (C), nitrogen atoms (N) and oxygen atoms (O) are preferable, those principally comprised a-SiC being particularly preferable.

In the case where the surface layer 503 is constituted by an amorphous material principally comprised of a-SiC, the content of the carbon atoms is desired to be in the range of 30 to 90 atomic % versus the total content of the silicon and carbon atoms.

It is necessary for the surface layer 503 comprised of such silicon-containing amorphous material to contain hydrogen atoms (H) or/and halogen atoms (X) in order to compensate dangling bonds of the Si and also in order to improve the layer quality, particularly in order to improve the photoconductivity and the charge retentively.

The amount of the hydrogen atoms (H), the amount of the halogen atoms (X), or the sum (H+X) of the amounts for the hydrogen atoms (H) and the halogen atoms (X) to be incorporated into the surface layer is preferably in the range of 30 to 70 atomic %, more preferably in the range of 35 to 65 atomic %, most preferably in the range of 40 to 60 atomic %, respectively versus the total amount of the entire constituent atoms of the surface layer.

For the raw material capable of supplying Si which is used for the formation of the surface layer, it can include, for example, gaseous or gasifiable silicon hydrides (silanes). Specific examples are $SiH_4$, $Si_2H_6$, $Si_3H_8$, $Si_4H_{10}$, etc. Of these, $SiH_4$ and $Si_2H_6$ are particularly preferred in view of the easy layer forming work and the good efficiency for the supply of Si. These Si-supplying materials may be used either singly or in combination with two or more of them. In addition, if necessary, these Si-supplying materials may be used while being diluted with a gas such as $H_2$ gas, He gas, Ar gas, or Ne gas.

The raw material capable of supplying carbon atoms (C) which is used for the formation of the surface layer can include, for example, gaseous or gasifiable saturated hydrocarbons of 1 to 5 carbon atoms, ethylenic hydrocarbons of 2 to 4 carbon atoms, and acetylenic hydrocarbons of 2 to 3 carbon atoms. Specifically, the saturated hydrocarbons can include methane ($CH_4$), ethane ($C_2H_6$), propane ($C_3H_8$), n-butane (n-$C_4H_{10}$) and pentane ($C_5H_{12}$); the ethylenic hydrocarbons can include ethylene ($C_2H_4$), propylene ($C_3H_6$), butene-1 ($C_4H_8$), butene-2 ($C_4H_8$), isobutylene ($C_4H_8$) and pentene ($C_5H_{10}$); and the acetylenic hydrocarbons can include acetylene ($C_2H_2$), methylacetylene ($C_3H_4$) and butine ($C_4H_6$). Becides, carbon fluorides such as $CF_4$, $CF_3$, $C_2F_6$, $C_3F_8$, and $C_4F_8$ are also usable.

Of these, $CH_4$ and $C_2H_6$ are particularly preferred in view of the easy layer forming work and the good efficiency for the supply of C.

These C-supplying materials may be used either singly or in combination with two or more of them. In addition, if necessary, these C-supplying materials may be used while being diluted with a gas such as $H_2$ gas, He gas, Ar gas, or Ne gas.

The raw material capable of supplying nitrogen atoms (N) or/and oxygen atoms (O) can include, for example, gaseous or gasifiable N or/and O-containing compounds such as $N_2$, $NH_3$, NO, $N_2O$, $NO_2$, $O_2$, CO, and $CO_2$.

These compounds may be used either singly or in combination with two or more of them. If necessary, the se compounds may be used while being diluted with a gas such as $H_2$ gas, He gas, Ar gas, or Ne gas.

In order for the amount of the hydrogen atoms (H) incorporated into the surface layer 503 to be more easily controlled, it is desired to conduct the layer formation by mixing a desired amount of $H_2$ gas or a gaseous silicon compound containing hydrogen atoms with the gaseous raw material for the formation of the surface layer.

As the raw material capable of supplying the halogen atoms (X), there can be mentioned gaseous or gasifiable halogen compounds such as gaseous halogen, halides, inter-halogen compounds, and hydrogenated silicon compounds containing halogen atoms, namely, halogen-substituted silane derivatives.

Preferable examples are fluorine gas (F2) as such gaseous halogen; BrF, ClF, $ClF_3$, $BrF_3$, $BrF_5$, $IF_3$, and $IF_7$ as such inter-halogen compound; and $SiF_4$ and $Si_2F_6$ as such halogen-substituted silane derivative.

To control the amount of the hydrogen atoms (H) or/and that of the halogen atoms (X) to be contained in the surface layer 503 may be conducted by properly controlling the related factor such as the temperature of the substrate 501, the amount of the gaseous raw material capable of supplying hydrogen atoms (H) or/and halogen atoms (X) to be introduced into the reaction chamber, or the discharging power.

For the at least one kind of atoms selected from the group consisting of carbon atoms, oxygen atoms, and nitrogen atoms (this atoms will be hereinafter referred to as atoms (C, O, N)) contained in the surface layer, the atoms (C, O, N) may be contained in the surface layer such that they are uniformly distributed in the entire layer region or such that they are unevenly distributed in a partial layer region in the layer thickness direction.

If necessary, the surface layer 503 may contain atoms of a conductivity controlling element (hereinafter referred to as conductivity controlling atoms).

In this case, the surface layer 503 may contain the conductivity controlling atoms such that they are uniformly distributed in the entire layer region or such that they are unevenly distributed in a partial layer region in the layer thickness direction.

As the conductivity controlling element, so-called impurities in the field of the semiconductor can be mentioned, and those usable herein can include elements belonging to group IIIb of the periodic table which provide a p-type conductivity (hereinafter simply referred to as group IIIb element) and elements belonging to group Vb of the periodic table which provide an n-type conductivity (hereinafter simply referred to as group Vb element).

Specific examples of the group IIIb element are B, Al, Ga, In, and Tl, of these elements, B, Al and Ga being particularly preferable.

Specific examples of the group Vb element are P, As, Sb, and Bi, of these elements, P and As being particularly preferable.

The amount of the conductivity controlling atoms contained in the surface layer 503 is preferably in the range of from $1\times10^{-3}$ to $1\times10^3$ atomic ppm, more preferably in the range of from $1\times10^{-2}$ to $5\times10^2$ atomic ppm, or most preferably in the range of from $1\times10^{-1}$ to $1\times10^2$ atomic ppm.

The structural introduction of atoms of a given conductivity controlling element, specifically, atoms of a given group IIIb element (this atoms will be hereinafter referred to as group IIIb atoms) or atoms of a given Vb element (this atoms will be hereinafter referred to as group Vb atoms) into the surface layer 503 may be conducted by introducing, in addition to the gaseous raw materials for the formation of the surface layer, a gaseous raw material capable of supplying the group IIIb or Vb atoms into the reaction chamber upon the formation of the surface layer.

Such group IIIb or Vb atom-supplying raw material can include raw materials capable of supplying group IIIb or Vb atoms, which are in the gaseous state at room temperature or can be easily gasified at least under the conditions for the formation of the surface layer.

Such group IIIb atom-supplying gaseous or gasifiable raw material can include hydrides such as $B_2H_6$, $B_4H_{10}$, $B_5H_9$, $B_5H_{11}$, $B_6H_{10}$, $B_6H_{12}$, and $B_6H_{14}$; and boron halides such as $BF_3$, $BCl_3$, and $BBr_3$. Besides, $AlCl_3$, $GaCl_3$, $Ga(CH_3)_3$, $InCl_3$, and $TlCl_3$ are also usable.

Such group Vb atom-supplying gaseous or gasifiable raw material can include phosphorous hydrides such as $PH_3$ and $P_2H_4$; and phosphorous halides such as $PH_4I$, $PF_3$, $PF_5$, $PCl_3$, $PCl_5$, $PBr_3$, $PBr_5$, and $PI_3$. Besides, $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$ are also usable.

Any of the above mentioned raw materials may be diluted with $H_2$ gas, He gas or a mixture of these gases, if necessary, upon the introduction thereof into the reaction chamber.

For the thickness of the surface layer 503, it is preferably in the range of 0.01 to 3 μm, more preferably in the range of 0.05 to 2 μm, most preferably in the range of 0.1 to 1 μm. In the case where the thickness is less than 0.01 μm, a problem is liable to entail in that the surface layer is lost due to abrasion and the like during the use of the light receiving member. On the other hand, in the case where the thickness is beyond 3 μm, there is a tendency in that deterioration of the electrophotographic characteristics such as an increase in the residual potential and the like is occurred.

It is necessary for the surface layer 503 to be carefully formed so that it has the characteristics required for a surface layer of a light receiving member for use in electrophotography. Particularly, films composed of silicon atoms (Si), atoms (C, O, N) [that is, at least one kind of atoms selected from the group consisting of carbon atoms (C), oxygen atoms (O) and nitrogen atoms (N)], and hydrogen atoms (H) or/and halogen atoms (X) structurally take from a crystalline form to an amorphous from depending upon film-forming conditions employed, where they exhibit a different electrical or physical property varied in the range of from electrically conductive property to semiconductive or insulating property or in the range of from photoconductive property to non-photoconductive property. In view of this, in the formation of the surface layer in the present invention, optimum film-forming conditions are carefully selected so that an appropriate compound as the constituent of the surface layer, which is satisfactory in the characteristics required for the surface layer depending upon the situation involved, can be desirably formed. For instance, in the case where the surface layer 503 is formed principally aiming at improving the pressure-withstanding property of the light receiving member, the compound is formed as a non-single crystalline material having a significant electrically insulating behavior in the use environments. In the case where the surface layer 503 is formed principally aiming at improving the continuous repetitive use characteristics or the use-environmental characteristics, it is formed as a non-single crystalline material having a relatively relaxed electrically insulating behavior and having a sensitivity to light irradiated to a certain extent.

In order to form a surface layer 503 having desired characteristics which meets the requirements therefor, it is necessary to adequately adjust at least the substrate temperature (Ts) and the gaseous pressure in the reaction chamber.

For the substrate temperature (Ts), its optimum range should be determined in accordance with a previously established layer design. However, in general, it is generally in the range of 20 to 500° C., preferably in the range of 200 to 350° C., more preferably in the range of 230 to 330° C., most preferably in the range of 250 to 300° C.

For the gaseous pressure in the reaction chamber, its optimum range should be also determined in accordance with the previously established layer design. However, in general, it is generally in the range of $1\times10^{-5}$ to 100 Torr or preferably in the range of $5\times10^{-5}$ to 30 Torr. In a preferred embodiment, it is desired to be preferably in the range of $1\times10^{-4}$ to 10 Torr, more preferably in the range of $5\times10^{-4}$ to 5 Torr, most preferably in the range of $1\times10^{-3}$ to 1 Torr.

However, the actual conditions for forming the surface layer 503 such as the substrate temperature and the gaseous pressure in the reaction chamber cannot usually be determined with ease independent of each other. Accordingly, the conditions optimal to the layer formation are desirably determined based on relative and organic relationships for forming the surface layer having desired properties.

In the present invention, between the surface layer 503 and the photoconductive layer 502, it is possible to provide a layer region containing atoms (C, O, N) (that is, at least one kind of atoms selected from the group consisting of carbon atoms (C), oxygen atoms (O), and nitrogen atoms (N)) such that their distribution concentration is continuously decreased toward the photoconductive layer 502. In this case, the adhesion of the surface layer with the photoconductive layer is improved, and the influence of interference due to light reflected at the interface between the surface layer and the photoconductive layer is diminished while preventing a photocarrier from being trapped at the interface between the surface layer and the photoconductive layer, whereby the electrophotographic characteristics are improved.

Charge Injection Inhibition Layer 504

The light receiving member according to the present invention may be provided with the charge injection inhibition layer 504 between the substrate 501 and the photoconductive layer 502 in the case where it is necessary. The charge injection inhibition layer comprises a non-single crystalline silicon-containing film which is formed in the same manner in the case of forming the photoconductive layer.

The charge injection inhibition layer 504 serves to inhibit a charge from injecting from the substrate side. Particularly, the charge injection inhibition layer 504 has a so-called polarity-depending behavior such that it functions to inhibit a charge from injecting to the photoconductive layer side from the substrate side when the surface of the light receiving member is subjected to charging with a certain polarity but it does not exhibit such function when the surface of the light receiving member is subjected to charging with a polarity reverse to the above polarity. In order for the charge injection inhibition layer 504 to have such behavior, it contains atoms of a given conductivity controlling element (hereinafter referred to as conductivity controlling atoms) in a relatively large amount in comparison with the case of the photoconductive layer.

The charge injection inhibition layer 504 may contain the conductivity controlling atoms such that they are uniformly distributed in the entire layer region or such that they are distributed uniformly in the layer thickness direction while their concentration distribution being uneven in a partial layer region. For the case where the concentration distribution of the conductivity controlling atoms is unevened in a partial layer region of the charge injection inhibition layer, it is desired for the concentration distribution to be enhanced on the substrate side. However, in any case, it is necessary for the conductivity controlling atoms to be evenly contained at a uniform concentration distribution in the in-plane direction in parallel to the surface of the substrate in order to ensure a uniform property in the in-plane direction.

As the foregoing conductivity controlling element, so-called impurities in the field of the semiconductor can be mentioned, and those usable herein can include elements belonging to group IIIb of the periodic table which provide a p-type conductivity (hereinafter simply referred to as group IIIb element) and elements belonging to group Vb of the periodic table which provide an n-type conductivity (hereinafter simply referred to as group Vb element).

Specific examples of the group IIIb element are B, Al, Ga, In, and Tl, of these elements, B, Al and Ga being particularly preferable.

Specific examples of the group Vb element are P, As, Sb, and Bi, of these elements, P and As being particularly preferable.

For the amount of the conductivity controlling atoms contained in the charge injection inhibition layer 504, it should be properly determined depending upon the situation involved. However, in general, it is preferably in the range of from 10 to $1 \times 10^4$ atomic ppm, more preferably in the range of from 50 to $5 \times 10^3$ atomic ppm, or most preferably in the range of from $1 \times 10^2$ to $1 \times 10^3$ atomic ppm.

The charge injection inhibition layer 504 may contain at least one kind of atoms selected from the group consisting of carbon atoms, oxygen atoms, and nitrogen atoms (this atoms will be hereinafter referred to as atoms (C, O, N)). In this case, the adhesion between the charge injection inhibition layer and other layer which is provided in direct contact with the charge injection inhibition layer can be more improved.

The charge injection inhibition layer 504 may contain the atoms (C, O, N) such that they are uniformly distributed in the entire layer region or such that they are distributed uniformly in the layer thickness direction while their concentration distribution being uneven in a partial layer region. However, in any case, it is necessary for the atoms (C, O, N) to be evenly contained at a uniform concentration distribution in the in-plane direction in parallel to the surface of the substrate in order to ensure a uniform property in the in-plane direction.

For the amount of the atoms (C, O, N) contained in the entire layer region of the charge injection inhibition layer 504, it should be properly determined depending upon the situation involved. However, in general, it is preferably in the range of $1 \times 10^{-3}$ to 50 atomic %, more preferably in the range of $5 \times 10^{-3}$ to 30 atomic %, most preferably in the range of $1 \times 10^{-2}$ to 10 atomic %.

The charge injection inhibition layer 504 contains hydrogen atoms (H) or/and halogen atoms (X) in order to compensate dangling bonds present therein.

The amount of the hydrogen atoms (H), the amount of the halogen atoms (X), or the sum (H+X) of the amounts for the hydrogen atoms (H) and the halogen atoms (X) contained in the charge injection inhibition layer is preferably in the range of 1 to 50 atomic %, more preferably in the range of 5 to 40 atomic %, most preferably in the range of 10 to 30 atomic %, respectively versus the total amount of the entire constituent atoms of the charge injection inhibition layer.

For the thickness of the charge injection inhibition layer 504, it should be properly determined so as to attain desired electrophotographic characteristics therefor and also in economical viewpoints. However, in general, it is preferably in the range of 0.1 to 5 μm, more preferably in the range of 0.3 to 4 μm, most preferably in the range of 0.5 to 3 μm.

As above described, the charge injection inhibition layer 504 is formed in the same vacuum film-forming manner employed in the formation of the photoconductive layer. Particularly, as well as in the case of forming the photoconductive layer, in order to form a charge injection inhibition layer having a desired film property, it is necessary to adequately adjust the mixing ratio between the Si-supplying raw material gas and the dilution gas, the gaseous pressure in the reaction chamber, the discharging power, and the substrate temperature (Ts).

For the flow rate of the dilution gas (comprising $H_2$ gas, He gas, or a mixture of these gases), its optimum range should be determined in accordance with a previously established layer design. However, in general, the flow rate of the dilution gas is desired to be preferably 1 to 20 times, more preferably 3 to 15 times, most preferably 5 to 10 times, respectively for the flow rate of the Si-supplying raw material gas.

For the gaseous pressure in the reaction chamber, its optimum range should be also determined in accordance with the previously established layer design. However, in general, it is generally in the range of $1 \times 10^{-5}$ to 100 Torr, preferably in the range of $1 \times 10^{-4}$ to 10 Torr, more preferably in the range of $5 \times 10^{-4}$ to 5 Torr, most preferably in the range of $1 \times 10^{-3}$ to 1 Torr.

For the substrate temperature (Ts), its optimum range should be also determined in accordance with the previously established layer design. However, in general, it is preferably in the range of 20 to 500° C., more preferably in the range of 50 to 480° C., most preferably in the range of 100 to 450° C.

However, the actual conditions for forming charge injection inhibition layer 504 such as the mixing ratio of the dilution gas, the gaseous pressure in the reaction chamber, the discharging power, and the substrate temperature cannot usually be determined with ease independent of each other. Accordingly, the conditions optimal to the layer formation are desirably determined based on relative and organic relationships for forming the charge injection inhibition layer having desired properties.

In the present invention, for the purpose of more improving the adhesion between the substrate 501 and the photoconductive layer 502 or the charge injection inhibition layer 504, it is possible to provide a contact layer constituted by a material selected from the group consisting of Si3N4, SiO2, SiO, and non-single crystalline materials containing silicon atoms as a matrix, hydrogen atoms or/and halogen atoms, and at least one kind of atoms selected from the group consisting of carbon atoms, oxygen atoms and nitrogen atoms.

Further, in order to more effectively prevent occurrence of an interference fringe pattern due to light reflected from the substrate, it is possible to provide a light absorptive layer.

As previously described, the present invention has been accomplished based on the foregoing findings obtained as a result of the various experimental studies by the present inventors in order to achieve the foregoing objects of the present invention.

In the following, representative experiments conducted by the present inventors will be described.

Experiment 1

Figure 2A:
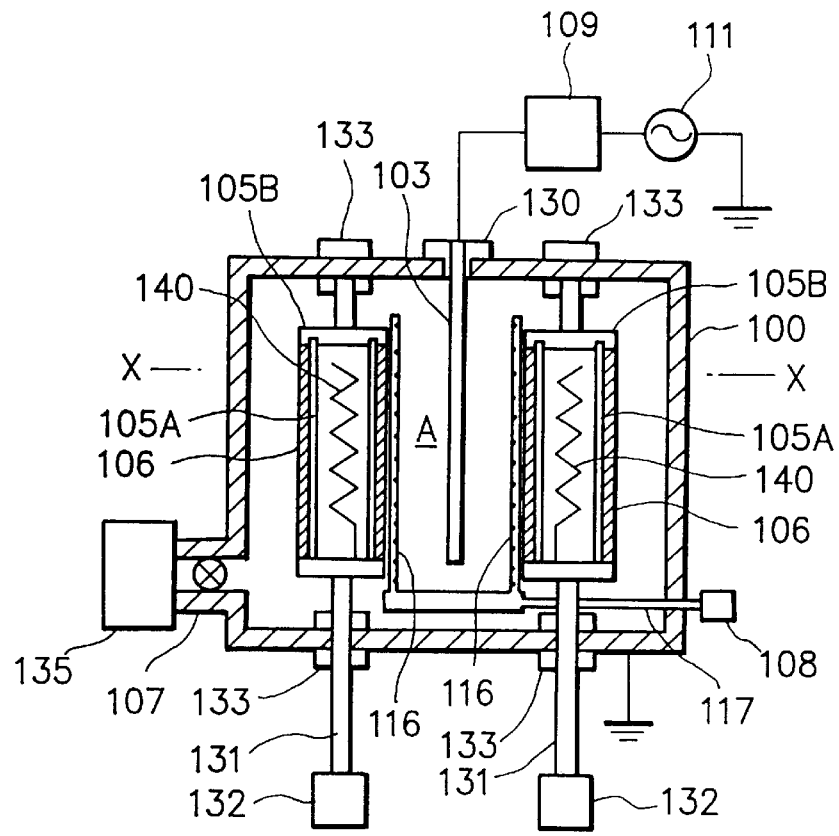
Figure 2B:
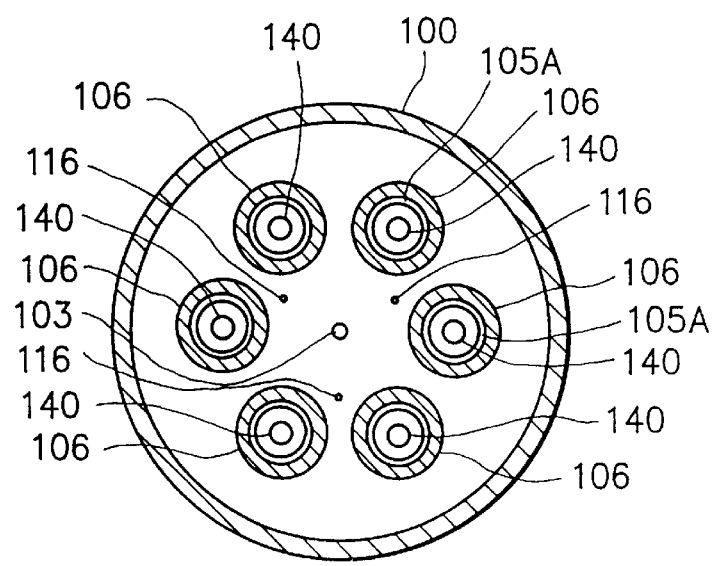
Figure 3:
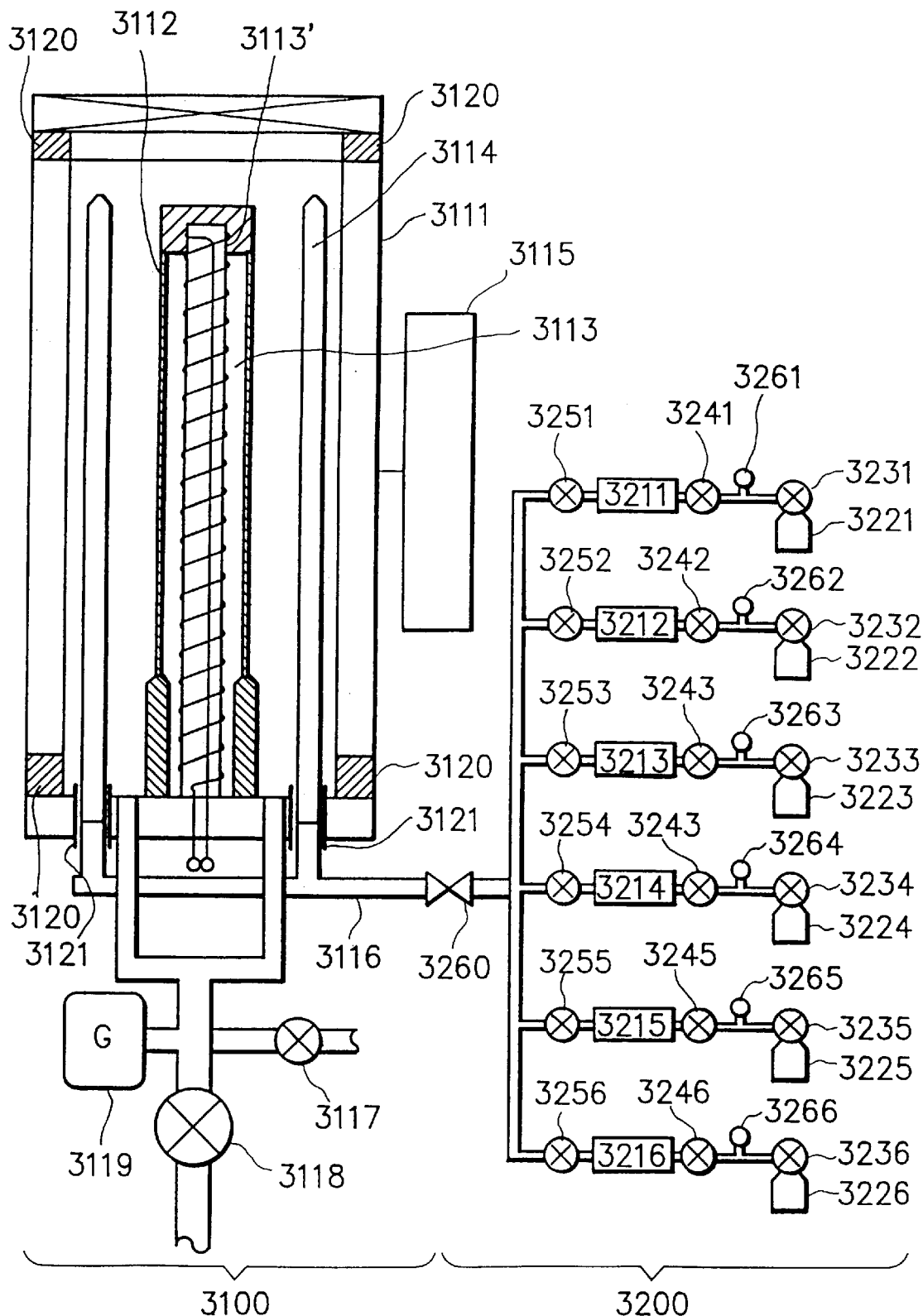
Figure 4A:
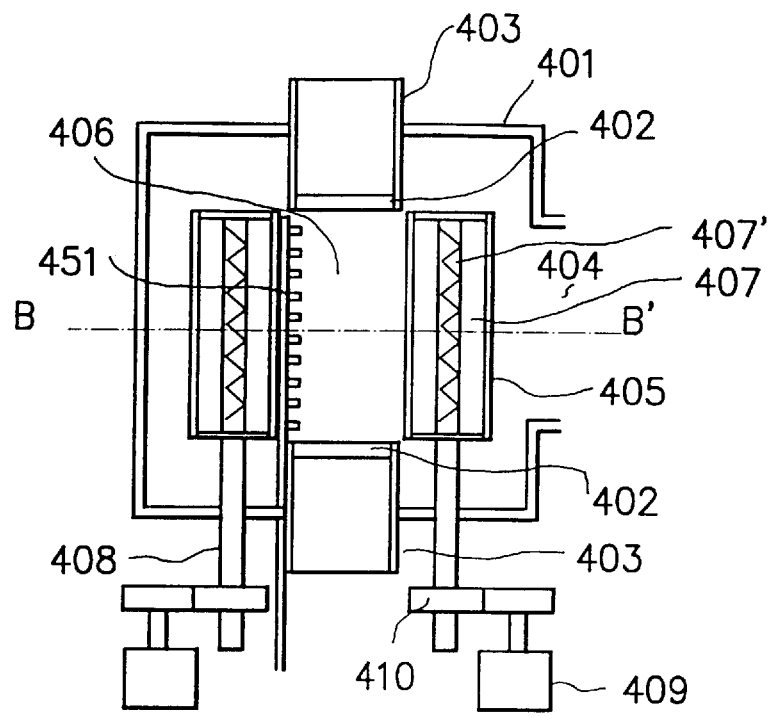
Figure 4B:
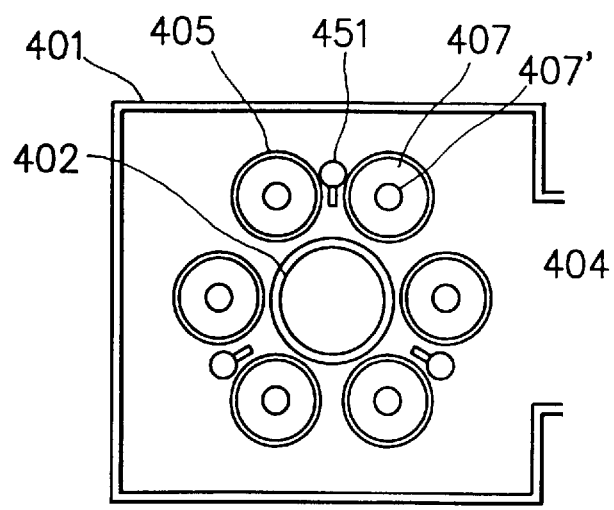

In this experiment, using a plasma CVD apparatus having the constitution shown in FIGS. 2(A) and 2(B) and using a high frequency power source capable of generating various frequencies, an amorphous silicon deposited film was formed on a plurality of cylindrical substrates such that the amorphous silicon deposited film was formed on the entire surface area of each cylindrical substrate.

Based on the resultant amorphous silicon deposited films, examination was conducted with respect to influences of the respective frequencies of the high frequency power source to the film quality, film thickness distribution, film deposition rate, and film deposition rate distribution.

At the beginning stage, experiment was conducted under a pressure condition of about 0.2 Torr with respect to the gaseous pressure in the reaction chamber, where powder such as polysilane or the like was considerably generated. Therefore, under condition of 50 mTorr or less for the gaseous pressure in the reaction chamber, experiment was conducted as will be described below.

In each film formation, six cylindrical substrates (made of aluminum) of 108 mm in diameter, 358 mm in length and 5 mm in thickness were arranged in the reaction chamber 100. And while rotating the cylindrical substrates, film formation experiment was conducted.

As the cathode electrode 103, there was used a cylindrical cathode electrode made of aluminum and having a diameter of 30 mm and a length of 450 mm.

In order to evaluate the film quality, a corning No. 7059 glass substrate having a comb-like shaped electrode made of Cr and having a gap of 250 μm formed thereon by way of evaporation was provided as a substrate for the evaluation of electrical characteristics. On one of the six cylindrical substrates, this glass substrate was arranged so as to cover an area over the length of 358 mm in an axial direction of the surface thereof.

Then, film formation was conducted as will be described below.

At first, by operating the exhausting mechanism 135, the inside of the reaction chamber 100 was evacuated to a vacuum degree of $1 \times 10^{-6}$ Torr. Then, the heater 140 was energized, whereby each cylindrical substrate 106 was heated to and maintained at 250° C.

Thereafter, SiH4 gas from the raw material gas supply system 108 was introduced into the reaction chamber 100 at a flow rate of 500 sccm through the gas supply pipe 117 and the gas feed pipe 116.

The internal pressure (the gaseous pressure) in the reaction vessel 100 was adjusted to a different pressure condition of 50 mTorr, 25 mTorr, or 5 mTorr in each film formation.

Under each pressure condition, a high frequency with an oscillation frequency in the range of from 13.56 MHz to 650 MHz and having a wattage of 1 KW was generated by the high frequency power source 111, followed by supplying to the cathode electrode 103 via the matching circuit 109.

As the high frequency power source 111 herein, there was used a high frequency power source capable of providing a high frequency with an oscillation frequency in the above range.

The matching circuit 109 was appropriately adjusted corresponding to the frequency of the high frequency power source.

By this, an amorphous silicon film was formed not only on the above substrate for electrical characteristic evaluation but also on the remaining five cylindrical substrates 106.

The film quality and film quality distribution were evaluated by measuring a photosensitivity [(photoconductivity ρ p)/(dark conductivity ρ d)] at eighteen positions selected at an interval about 20 mm from the upper end to the lower end of the substrate for electrical characteristic evaluation.

Herein, the photoconductivity ρ p was evaluated based on the conductivity obtained when an He-Ne laser with an intensity of 1 mW/cm² (wavelength: 632.8 nm) was irradiated.

Based the findings which were previously obtained by the present inventors in the production of electrophotographic light receiving members, the present inventors has a knowledge that it is possible to obtain a practically acceptable image by an electrophotographic light receiving member produced under optimized film-forming conditions based on the film-forming conditions capable of forming a deposited film having a photosensitivity of $10^3$ or according to the above method.

However, in recent years, there is an increased demand for highly contrasting an image reproduced. In view of this, the photosensitivity of $10^4$ or more is essential. Furthermore, it is expected that the photosensitivity of more than $10^5$ or $10^6$ is required in the near future.

From such a viewpoint, in this experiment, the evaluation with respect to photosensitivity was conducted on the basis of the following criteria.

⊚: a case where the photosensitivity is $10^5$ or more, and the film property is excellent, ○: a case where the photosensitivity is $10^4$ or more, and the film property is good, Δ: a case where the photosensitivity is $10^3$ or more, but the film property is not problematic in practice, and X: a case where the photosensitivity is less than $10^3$, and the film property is sometimes not suitable for practical use.

The evaluation with respect to film deposition rate and film deposition rate distribution was conducted as follows.

Using a charging current type film thickness measuring instrument (manufactured by Kett Kagaku kenkyusho K.K.), the film thickness was measured at eighteen positions selected at an interval of about 20 mm, similarly to the measurement positions of the photosensitivity described above, in the axial direction of each of the five cylindrical substrates having an a-Si film deposited thereon.

The film deposition rate was calculated on the basis of the film thicknesses at the eighteen positions, and an average value among the measured values was obtained. The resultant average value was made to be an average film deposition rate.

The evaluation of the film deposition rate distribution was conducted as follows. With respect to the film deposition rate distribution in the axial direction, a difference between a minimum value and a maximum value of the deposition rate at the eighteen positions in the axial direction was examined.

The difference was divided to obtain a value based on the equation: (the maximum value–the minimum value)/the average value. The resultant value was represented by a percentage as the film deposition rate distribution in the axial direction.

The evaluated results with respect to the photosensitivity for the samples formed under the three different pressure conditions; 50 mTorr, 25 mTorr, and 5 mTorr are shown in Tables 1(A) to 1(C).

The evaluated results with respect to the deposition rate for the samples formed under the three different pressure conditions are shown in Tables 2(A) to 2(C).

Now, with respect to the samples formed by the frequency energy with the frequency of 13.56 MHz, for those formed under the pressure condition of 50 mTorr, their film quality and film deposition rate were relatively uniform. However, their average deposition rate was found to be 0.15 nm/s which is very slow. Under the pressure condition of 25 mTorr or less, discharge could not be generated.

With respect to the samples formed by the high frequency energy with the frequency of 30 MHz, for those formed under the pressure condition of 50 mTorr and 25 mTorr, any of them was found to have a reduction in the photosensitivity at an upper position of the cylindrical substrate. And it was found that their average film deposition rate is greater by about three times that in the case of using the frequency of 13.56 MHz but their film deposition rate distribution is inferior. And under the pressure condition of 5 mTorr, discharge could not be generated.

For the samples formed by the high frequency energy with the frequency of 60 MHz to 300 MHz, it was found that any of them has a reduction in the photosensitivity of the area ranging from the center upper position to the center lower position of the cylindrical substrate, and the photosensitivity at the position with no substantial reduction in the photosensitivity has a tendency in that it is increased as the internal pressure of the reaction chamber is decreased. And it was found that their average film deposition rate is greater by about seven to twelve times that in the case of using the frequency energy with the frequency of 13.56 MHz, but their film deposition rate distribution is inferior.

For the samples formed by the high frequency energy with the frequency of 400 MHz to 600 MHz, it was found that any of them has a reduction in the photosensitivity at several positions of the cylindrical substrate, and the photosensitivity at the position with no substantial reduction in the photosensitivity has a tendency in that it is increased as the internal pressure of the reaction chamber is decreased. And it was found that their average film deposition rate is greater by about four to six times that in the case of using the frequency energy with the frequency of 13.56 MHz, but their film deposition rate distribution is inferior.

Under the discharging condition of 650 MHz, discharge was intermittently discontinued under any of the foregoing pressure conditions, where no film sample for the evaluation could be formed.

Based on the above experimental results, such findings as will be described in the following were obtained. When the frequency of the RF energy is 30 MHz or more, discharge can be generated in a high vacuum region where vapor phase reaction is difficult to occur, a film having an excellent film property can be obtained and the deposition rate is superior to that in the case of using the frequency of 13.56 MHz; however, the film quality distribution and deposition rate distribution are inferior.

The present inventors conducted extensive experimental studies in order to find out a cause that the film quality is locally deteriorated when the frequency of the RF energy is made to be 30 MHz or more. As a result, it was found that the distribution of a plasma potential is strongly correlated with the local deterioration of the film quality. Particularly, as a result of having measured the plasma potential distribution in the axial direction of the cylindrical substrate in accordance with a Langmuir's probe method, a reduction in the plasma potential distribution was found at the portion corresponding to the position where the film quality was locally deteriorated.

Based on the above findings, it is presumed that a standing wave generated on the cathode electrode would have contributed to deteriorating the film quality distribution and deposition rate distribution.

In general, when plasma is generated by applying a high frequency power between the cathode electrode and the counter electrode, a standing wave which cannot be neglected is sometimes generated on the cathode electrode, depending on the interrelation relationship between the frequency of the high frequency power applied to the cathode electrode and the dimension of the cathode electrode. Particularly in this respect, when the frequency of the high frequency power is high or when the cathode electrode has a large area, the generation of a standing wave the sends to readily occur. When the standing wave thus generated is large, the distribution of electric field in the cathode electrode is deteriorated, where the plasma distributions relating to the plasma density, plasma potential, electron temperature and the like between the opposite electrodes are disordered, resulting in entailing reverse influences the quality of a deposited film formed by way of plasma CVD.

In the foregoing experiment, it is considered that a reflected wave have generated on the cathode electrode at the tip thereof, followed by being interfered with the incident wave, whereby the standing wave of exerting to the film quality and deposition rate in case of using the frequency of 30 MHz or more. More specifically, it is considered that the electric field have weakened at a node position of the standing wave to cause the local reduction in the plasma potential, whereby the film quality has been locally deteriorated.

In case of using the frequency of 400 MHz to 600 MHz, it is considered that nodes of the standing wave have been generated at a plurality of positions.

Based on the above experimental results and examined results, the present inventors conducted studies of the shape and structure of the cathode electrode in order to prevent occurrence of the deterioration in the film quality and film thickness distribution, which is apt to occur when the frequency of the RF energy is heightened.

As a result, there was obtained a finding that to provide a reflection face capable of generating a reflected wave to reinforce the incident wave and the electric field in the vicinity of a position which is considered as the node of the standing wave is effective for achieving the above purpose.

Figure 15A:
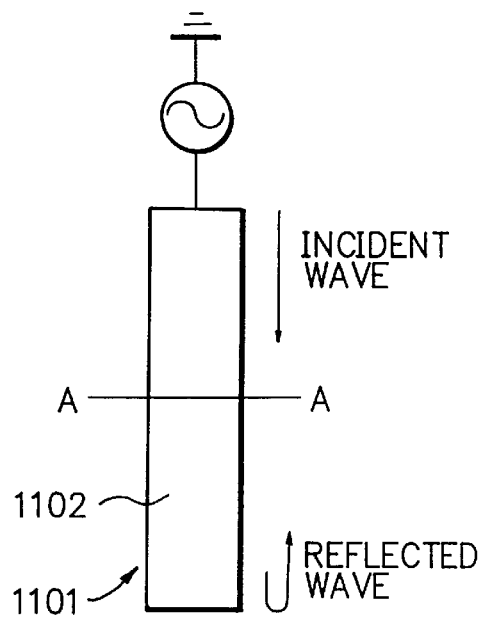
Figure 15B:
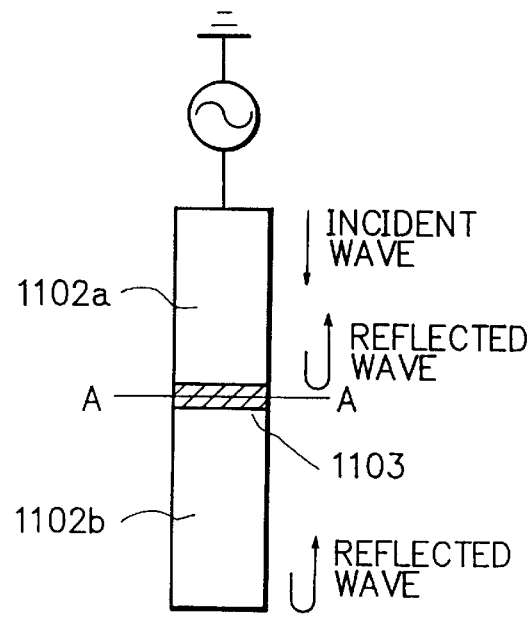

For instance, in FIG. 15(A), when it is considered that a standing wave generate s at an A—A position in a columnar cathode electrode 1101 (herein, the cathode electrode 1101 coincides with a conductor 1102), a dielectric plate 1103 composed of alumina ceramics for example is arranged at an A—A position between a cathode electrode conductor 1102a and a cathode electrode conductor 1102b as shown in FIG. 15(B). In this case, although the two high frequency transmission lines are capacitively coupled, the A—A position results in a mismatching portion. Because of this, the incident wave is partly reflected at the A—A position. And since the phase of the reflected wave becomes such a phase that reinforces the incident wave substantially as well as in the case of the open end, the electric field is reinforced at this position.

Figure 15C:
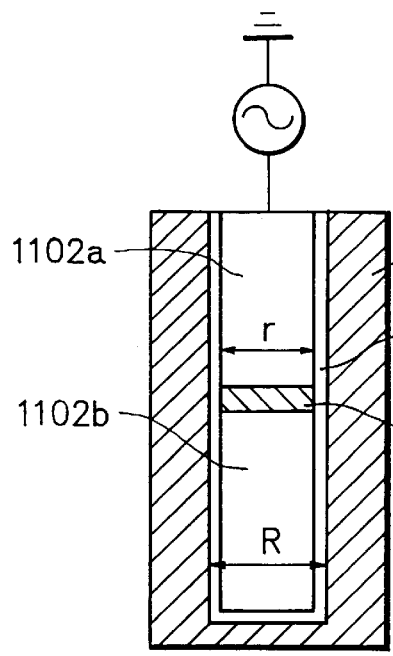
Figure 15D:
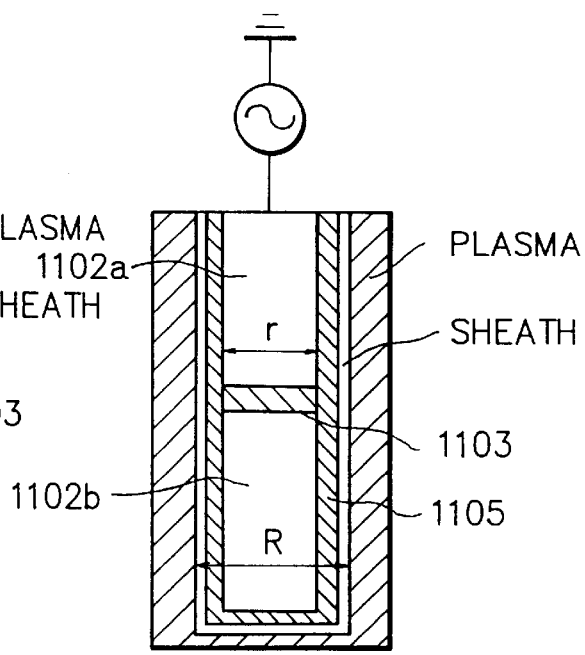

Further, as shown in FIG. 15(C), the transmission line of high frequency of the cathode electrode can be regarded as a coaxial line in which the cathode electrode conductors 1102a and 1102b constitute an inner conductor, plasma constitutes an outer conductor, and a sheath constitutes a transmission medium. When the outer diameter of the inner conductor of the coaxial line is defined as r and the inner diameter of the outer conductor is defined as R, the characteristic impedance is proportional to log(R/r), the impedance in the dielectric plate 1103 is represented by the equation $1/j\omega C$ (with j being an imaginary unit, $\omega$ being an angular frequency of the high frequency, and C being a capacitance), and the C is proportional to ω S/d (with ω being a dielectric constant of the dielectric plate, S being a surface area of the dielectric plate, and d being a thickness of the dielectric plates). Accordingly, by properly adjusting the thickness of the dielectric plate 1103 or constituting the dielectric plate by an adequate dielectric material having an appropriate dielectric constant, it is possible to control the ratio between the high frequency power which is supplied to the plasma from the cathode electrode conductor 1102a and the high frequency power which is supplied to the plasma by way of transmitting from the cathode electrode conductor 1102a to the cathode electrode conductor 1102b through the dielectric plate 1103. Further, when a dielectric cover 1105 comprised of alumina ceramics is provided in the cathode electrode as shown in FIG. 15(D), the distance to the plasma can be controlled as desired and as a result, the impedance can be adjusted over a wide range. By this, the controllability is more improved.

Experiment 2

In order to confirm the interrelation between the length of the region for the formation of the reflection face of the cathode electrode and the uniformity of plasma generated, the following experiment was conducted.

There were provided a plurality of well-cleaned cylindrical aluminum substrates of 80 mm in diameter, 358 mm in length and 5 mm in thickness and having a mirror-finished surface. And there were provided ten cathode electrodes each having a different configuration comprising a combination of SUS 304 and Ni as shown in Table 4.

Six of the foregoing cylindrical substrates were arranged in the plasma CVD apparatus shown in FIGS. 8(A) and 8(B) in which the cathode electrode 1408 comprises one of the foregoing ten cathode electrodes. Then, discharge was conducted under the conditions shown in Table 3, where the plasma potential was measured at ten positions in the longitudinal direction in the discharge space in accordance with a conventional probing methode using a tungsten probe of 1 mm in diameter. For each cathode electrode, an average value among the ten measured values was obtained, followed by obtaining a relative value to the average value for every measured position, and of the resultant relative values, the one which is the most remote from the average value was made to be a variation in the plasma potential. The results obtained are collectively shown in Table 4 in terms of percentage.

As apparent from the results shown in Table 4, it is understood that the variation of the plasma potential can be controlled by constituting the cathode electrode by a combination of two different constituent materials (SUS/Ni) and properly adjusting the length thereof. It is also understood that the variation of the plasma potential can be controlled to 50% or less by adjusting the length of the Ni constituent portion to be in the range of 0.1 to 300 mm.

Experiment 3

In order to confirm the interrelation between the dimension of the region for the formation of the reflection face of the cathode electrode and the uniformity of plasma generated, the following experiment was conducted.

There were provided a plurality of well-cleaned cylindrical aluminum substrates of 80 mm in diameter, 358 mm in length and 5 mm in thickness and having a mirror-finished surface. And there were provided eighteen cathode electrodes each having a different configuration comprising a combination of SUS 304 and Ni as shown in Table 5.

Six of the foregoing cylindrical substrates were arranged in the plasma CVD apparatus shown in FIGS. 8(A) and 8(B) in which the cathode electrode 1408 comprises one of the eighteen cathode electrodes. Then, discharge was conducted under the conditions shown in Table 3, where the plasma potential was measured at ten positions in the longitudinal direction in the discharge space in accordance with a conventional probing methode using a tungsten probe of 1 mm in diameter, wherein as needed, an voltage of −1 KV was applied to prevent an a-Si film from depositing on the probe by way of sputtering effect in order to diminish negative influence of the a-Si film to the probe.

For each cathode electrode, an average value among the ten measured values was obtained, followed by obtaining a relative value to the average value for every measured position, and of the resultant relative values, the one which is the most remote from the average value was made to be a variation in the plasma potential. The results obtained are collectively shown in Table 5 in terms of percentage.

Based on the results shown in Table 5, there were obtained such findings as will be described in the following. Even when the dimension (the diameter) of the cathode electrode, a desirable effect of depressing the variation in the plasma potential is provided. Depending upon a given combination of the two constituents, when a configuration in which the diameter of the electrode comprising the region (the Ni constituent portion) for the formation of the reflection face is different from that of the other region (the SUS constituent portion), there is an occasion in that the variation in the plasma potential is more decreased.

Experiment 4

In order to confirm the interrelation between the constituent of the cathode electrode and the uniformity of the plasma, the following experiments were conducted.

(1) Conductor constituent:

The procedures of Experiment 2 were repeated to examine the variation in the plasma potential, except for using nine different cathode electrodes shown in Table 6, each comprising a different combination (a combination of a given constituent material for the 1102 portion and a given constituent material for the 1103 portion in FIG. 5(a)) using SUS316, Fe and Ti in addition to the combination of SUS 304 and Ni in Experiment 2.

As a result, it was found that even when other combinations of two different constituent materials which are different from the combination of SUS 304 and Ni are used, a desirable effect of depressing the variation in the plasma potential is provided.

(2) Dielectric constituent:

The procedures of Experiment 2 were repeated, except that the Ni constituent portion in Experiment 2 was replaced by alumina ceramics, to thereby examine the variation in the plasma potential. The results obtained are shown in Table 7.

As apparent from the results shown in Table 7, it is understood that even when a part of the cathode electrode is constituted by alumina ceramics, it is possible to depress the variation in the plasma potential in the discharge space. It is also understood that the variation of the plasma potential can be controlled to 50% or less by adjusting the length of the alumina ceramics constituent portion to be in the range of 0.1 to 50 mm.

Experiment 5

In order to examine the interrelation between the surface state and the spherical protrusion occurred in a deposited film, the following experiment was conducted.

There were provided a plurality of well-cleaned cylindrical aluminum substrates of 80 mm in diameter, 358 mm in length and 5 mm in thickness and having a mirror-finished surface. And there were provided eighteen cathode electrodes each having the same configuration as the No. 6 cathode electrode shown in Table 4 and having a different surface state in terms of the ten-points-average surface roughness as shown in Table 9.

Six of the foregoing cylindrical substrates were arranged in the plasma CVD apparatus shown in FIGS. 8(A) and 8(B) in which the cathode electrode 1408 comprises one of the foregoing eighteen cathode electrodes. Then, film formation was continuously conducted for 10 hours under the conditions shown in Table 8 (in which a high frequency power with 105 MHz in frequency is used) to form a deposited film on each cylindrical substrate. In this way, there were prepared a plurality of light receiving members for each cathode electrode.

One of the resultant light receiving members for each cathode electrode was randomly selected, and it was subjected to evaluation as follows.

For the surface of the light receiving member, in the circumferential direction, 4 positions were selected at an interval of 90° and along the line extending from each of the 4 positions in the vertical direction, 3 evaluation regions having an area of 3 cm×3 cm respectively situated in the upper, central and lower regions were randomly selected, whereby 12 evaluation regions in total were determined. For each of the evaluation regions thus determined, the number of a spherical protrusion of more than 20 μm in size present therein was examined by means of an optical microscope.

The examined results obtained are collectively shown in Table 9 on the basis of the following criteria.
⊚: a case where substantially no distinguishable spherical protrusion is present,
○: a case where distinguishable spherical protrusions are slightly present,
Δ: a case where distinguishable spherical protrusions are present to a certain extent which is practically acceptable, and
X: a case where distinguishable spherical protrusions are present to a relatively large extent.

Based on the results shown in Table 9, the following facts are understood. In the case of using the cathode electrode having a surface with a ten-points-average surface roughness in the range of 1.0 μm to 20 mm, the situation for the number of distinguishable spherical protrusions present in the deposited film is satisfactory. Particularly, in the case of using the cathode electrode having a surface with a ten-points-average surface roughness in the range of 3.0 μm to 10 mm, the above situation is good enough. Especially, in the case of using the cathode electrode having a surface with a ten-points-average surface roughness in the range of 5.0 μm to 5 mm, the above situation is extremely excellent.

Experiments 6, 7 and 8

Experiment 6

Using the plasma CVD apparatus shown in FIGS. 9(A) and 9(B), there were sequentially formed a charge injection inhibition layer, a photoconductive layer and a surface layer on a plurality of cylindrical aluminum substrates of 80 mm in diameter, 358 mm in length and 5 mm in thickness and having a mirror-finished surface under the conditions shown in Table 10, wherein the oscillation frequency of the high frequency power source 2112 was made to be a frequency selected from the group consisting of 13.56 MHz, 20 MHz, 50 MHz, 100 MHz, 250 MHz, 450 MHz, and 600 MHz. In the case of the frequency of 13.56 MHz, since discharge could not be caused as desired under the inner pressures shown in Table 10, the formation of the charge injection inhibition layer was conducted under inner pressure of 150 mTorr, the formation of the photoconductive layer was conducted under inner pressure of 200 mTorr, and the formation of the surface layer was conducted under inner pressure of 300 mTorr.

As each of the high frequency power introduction means 2109 in the foregoing plasma CVD apparatus, there was used a body comprising a rod-like shaped electrode-coupling inbetween portion 2108 made of alumina and having a diameter of 15 mm and a thickness of 5 mm interposed between two rod-like shaped electrode conductors 2107 made of SUS 304 and having a diameter of 15 mm.

As each of the raw material gas supply pipes 2113 in the foregoing plasma CVD apparatus, there was used a raw material gas supply pipe made of alumina having a closed end and which is 6 mm in inner diameter and 8 mm in outer diameter and is provided with ten gas release nozzles of 1.0 mm in diameter which are spacedly arranged so as to face the high frequency power introduction means which is situated nearest thereto.

Under such condition as above described, the procedures for producing a three-layered a-Si light receiving member were repeated ten times.

During the film formation, the number of occurrence of abnormal discharge, and the number of occurrence of discharge discontinuance were examined.

And for the resultant a-Si light receiving members, evaluation was conducted with respect to (i) unevenness in charge retentivity (hereinafter referred to as charge retentivity unevenness, (ii) unevenness in photosensitivity (hereinafter referred to as photosensitivity unevenness) and (iii) unevenness in photomemory (hereinafter referred to as photomemory unevenness) using an electrophotographic apparatus NP-6030 modified for experimental purposes (produced by Canon Kabushiki Kaisha).

The evaluation of each of these evaluation items was conducted in a manner which will be described below.
(i) Evaluation of the Charge Retentivity Unevenness The light receiving member is installed in the electrophotographic apparatus, wherein a predetermined electric current is flown to the main charger of the electrophotographic apparatus, where for randomly selected portions in the entire surface region of the light receiving member in the generatrix direction, there is measured a dark potential of each selected portion at the position of the development mechanism. The measured dark potential for each portion is defined as a charge retentivity. For the resultant charge retentivity values, there is obtained a difference between the maximum and minimum values. This difference is defined as the charge retentivity unevenness.
(ii) Evaluation of the Photosensitivity Unevenness The light receiving member is installed in the electrophotographic apparatus, wherein after the electric current flown to the main charger is adjusted so that the dark potential of the light receiving member at the position of the development mechanism becomes constant at a prescribed value, using a white paper with a reflection density of less than 0.01 as a original, the quantity of image exposure light is adjusted so that the light potential of the light receiving member at the position of the development mechanism becomes constant at a prescribed value wherein the quantity of the image exposure light for each of randomly selected portions in the entire surface region of the light receiving member in the generatrix direction is measured. For the measured values, there is obtained a difference between the maximum and minimum values. This difference is defined as the photosensitivity unevenness.

(iii) Evaluation of the Photomemory Unevenness

The light receiving member is installed in the electrophotographic apparatus, wherein after the electric current flown to the main charger is adjusted so that the dark potential of the light receiving member at the position of the development mechanism becomes constant at a prescribed value, the quantity of image exposure light is adjusted so that the light potential of the light receiving member at the position of the development mechanism in the case of using a prescribed white paper as an original becomes constant at a prescribed value. While maintaining this state, a ghost test chart FY9-9040 (produced by Canon Kabushiki Kaisha) having a black solid circle of 5 mm in diameter and having a reflection density of 1.1 stuck thereon is positioned on the original table and a halftone test chart (produced by Canon Kabushiki Kaisha) is superposed thereon, followed by subjecting to image reproduction to obtain a copied halftone image product. For the resultant image product, there is measured a difference between the reflection density of the image based on the foregoing black solid circle of the ghost test chart and that of the halftone image. In this way, photomemory measurement is conducted. This photomemory measurement is conducted for each of randomly selected portions in the entire surface region of the light receiving member in the generatrix direction. For the measured values, there is obtained a difference between the maximum and minimum values. This difference is defined as the photomemory unevenness.

Experiment 7

The procedures of Experiment 6 were repeated, except that the rod-like shaped electrode-coupling inbetween portion 2108 in the plasma CVD apparatus was omitted.

As well as in the case of Experiment 6, the procedures for producing a three-layered a-Si light receiving member were repeated ten times.

During the film formation, the number of occurrence of abnormal discharge, and the number of occurrence of discharge discontinuance were examined.

And for the resultant a-Si light receiving members, evaluation was conducted with respect to (i) charge retentivity unevenness, (ii) photosensitivity unevenness and (iii) photomemory unevenness in the same manner as in Experiment 6.

Evaluated Results in Experiments 6 and 7

Figure 16:
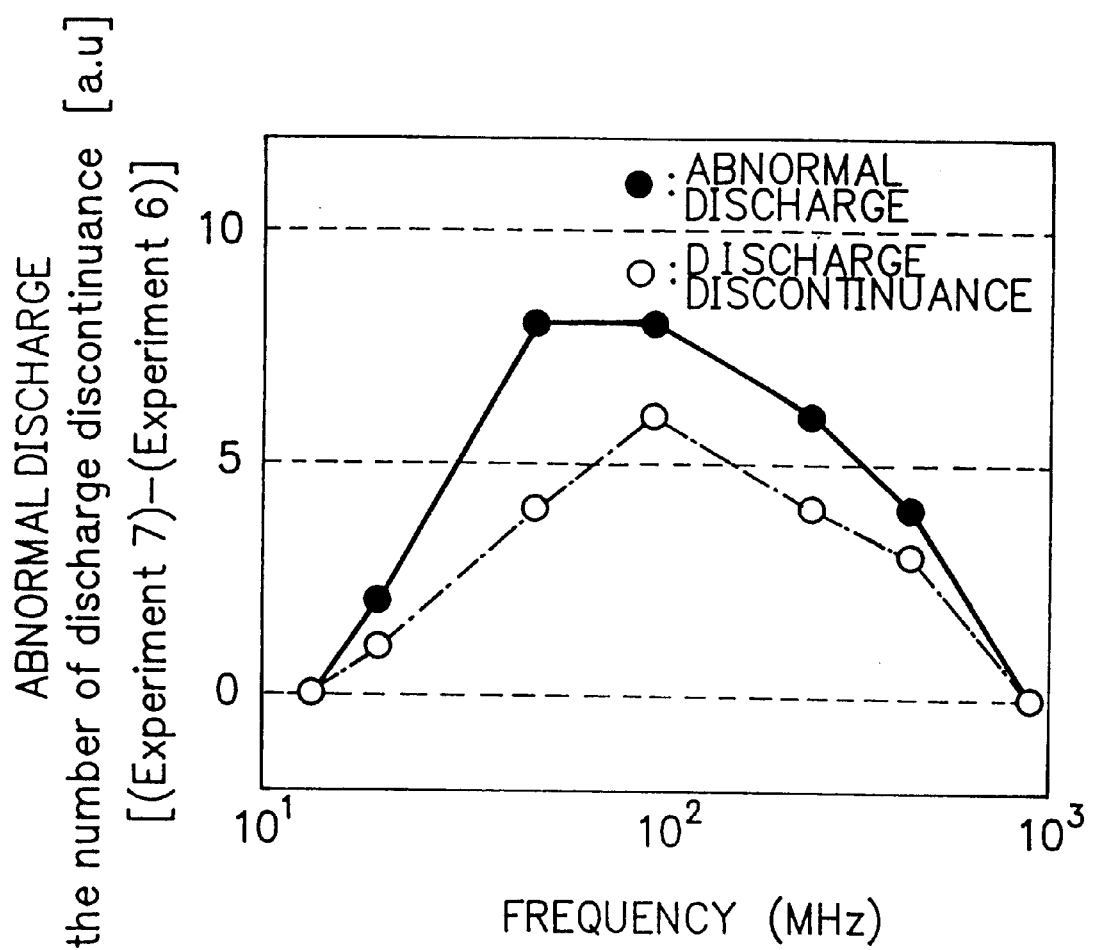
FIG. 16 and FIG. 19 respectively shows graphs of interrelations between abnormal discharge (the number of times for discharge being discontinued) and oscillation frequencies (MHz).

The examined results for the number of occurrence of abnormal discharge, and the number of occurrence of discharge discontinuance in Experiment 6 and those in Experiment 7 are graphically shown in FIG. 16 in terms of differences between Experiment 6 and Experiment 7.

Particularly, FIG. 16 is showing a solid line curve (●) relating to a difference [(the number of occurrence of abnormal discharge in Experiment 7)–(the number of occurrence of abnormal discharge in Experiment 6)] and a broken line curve (○) relating to a difference [(the number of occurrence of discharge discontinuance in Experiment 7)–(the number of occurrence of discharge discontinuance in Experiment 6)].

FIG. 16 indicates that the higher the value is, the higher the abnormal discharge or discharge discontinuance-depressing effect is.

Based on the results shown in FIG. 16, the following facts are understood. The use of the dielectric electrode-coupling inbetween portion 2108 in the cathode electrode (Experiment 6) provides an effect of depressing the occurrence of abnormal discharge and discharge discontinuance in the range of 20 MHz to 450 MHz. Especially, in the range of 50 MHz to 450 MHz, said effect is extremely high.

The evaluated results with respect to charge retentivity unevenness, photosensitivity unevenness and photomemory unevenness in Experiment 6 and those in Experiment 7 are graphically shown in FIG. 17 in terms of differences between Experiment 6 and Experiment 7. Particularly, FIG. 17 is showing a solid line curve (●) relating to a difference [(the charge retentivity unevenness in Experiment 7)–(the charge retentivity unevenness in Experiment 6)], a broken line curve (○) relating to a difference [(the photosensitivity unevenness in Experiment 7)–(the photosensitivity unevenness in Experiment 6)], and a broken line curve (▲) relating to a difference [(the photomemory unevenness in Experiment 7)–(the photomemory unevenness in Experiment 6)]. FIG. 17 indicates that the higher the value is, the higher the effect of decreasing the charge retentivity unevenness, photosensitivity unevenness or photomemory unevenness is.

Based on the results shown in FIG. 16, the following fact is understood. The use of the dielectric electrode-coupling inbetween portion 2108 in the cathode electrode (Experiment 6) provides an effect of depressing the charge retentivity unevenness, photosensitivity unevenness or photomemory unevenness in the range of 20 MHz to 450 MHz.

Experiment 8

Figure 18A:
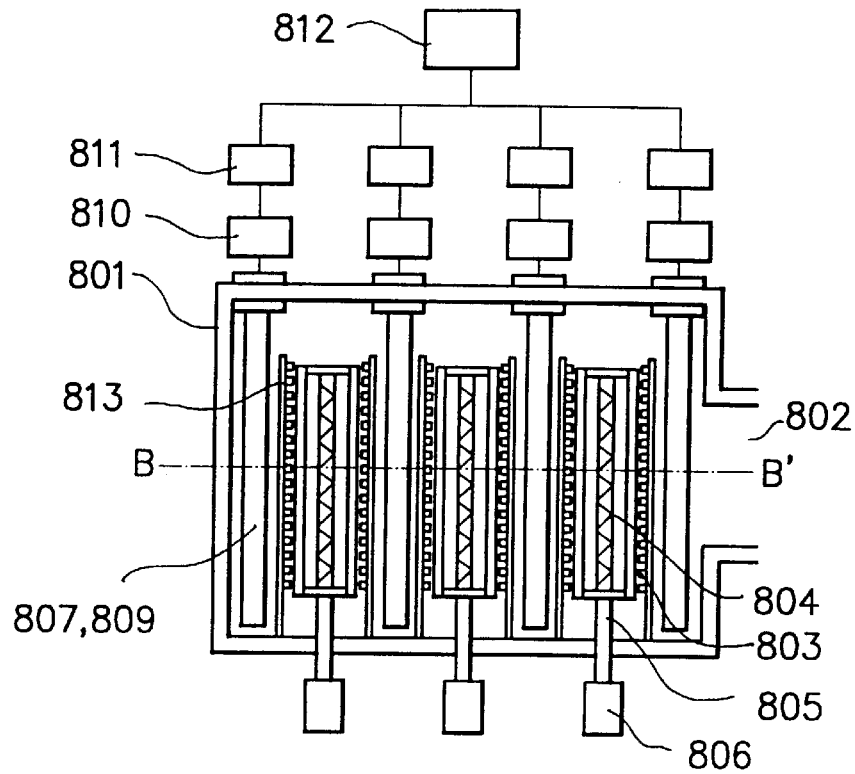
Figure 18B:
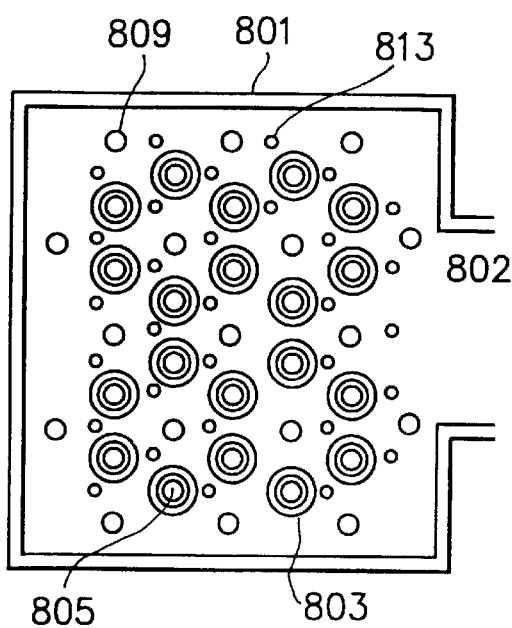

In this experiment, there was used a plasma CVD apparatus shown in FIGS. 18(A) and 18(B).

As the high frequency introduction means in this plasma CVD apparatus, there was used a modification of the high frequency power introduction means used in Experiment 6. Particularly, there was used a high frequency power introduction means obtained by modifying the body (comprising the two electrode conductors and the electrode-coupling inbetween portion interposed between the two electrode conductors) as the high frequency power introduction means used in the plasma CVD apparatus in Experiment 6 into a single rod-like high frequency electrode. This single rod-like electrode was used as the high frequency power introduction means of the plasma CVD apparatus shown in FIGS. 18(A) and 18(B).

In FIGS. 18(A) and 18(B), reference numeral 801 indicates a reaction chamber capable of being vacuumed.

Reference numeral 802 indicates an exhaust pipe, one end of which being open into the reaction chamber 801 and the other end of which being connected to an exhaust device (not shown). Reference numeral 803 indicates a cylindrical substrate positioned on a cylindrical substrate holder held on a rotary shaft 805 connected to a driving mechanism comprising a reduction gear (not shown) and a driving motor 806 so that when the driving motor 806 is actuated, the rotary shaft 805 is rotated whereby rotating the cylindrical substrate positioned on the cylindrical substrate holder. Each cylindrical substrate holder is provided with a heat generating means 804 installed therein, which serves to heat the cylindrical substrate 803 positioned thereon from the nner side.

Reference numeral 809 indicates a high frequency power introduction means comprising the foregoing single rod-like high frequency electrode.

Reference numeral 810 indicates a phase adjuster, reference numeral 811 a matching box, and reference numeral 812 a high frequency power source. Herein, a high frequency power from the high frequency power source 812 transmits through the matching box 811 into the phase adjuster 810 where it is subjected to phase adjustment, followed by supplying into the reaction chamber 801 by means of the high frequency power introduction means 809.

Reference numeral 813 indicates a raw material gas supply means which is provided a plurality of gas release nozzles capable of uniformly supplying a raw material gas into the reaction chamber 801. All the raw material gas supply means 813 are communicated with a raw material gas supply system including a plurality of gas reservoirs (not shown).

Now, the procedures of Experiment 6 were repeated, except that the plasma CVD apparatus used in Experiment 6 was replaced by the plasma CVD apparatus shown in FIGS. 18(A) and 18(B).

As well as in the case of Experiment 6, the procedures for producing a three-layered a-Si light receiving member were repeated ten times.

During the film formation, the number of occurrence of abnormal discharge, and the number of occurrence of discharge discontinuance were examined.

And for the resultant a-Si light receiving members, evaluation was conducted with respect to (i) charge retentivity unevenness, (ii) photosensitivity unevenness and (iii) photomemory unevenness in the same manner as in Experiment 6.

Evaluated Results in Experiment 8 in Comparison with the Evaluated Results in Experiment 6

Figure 19:
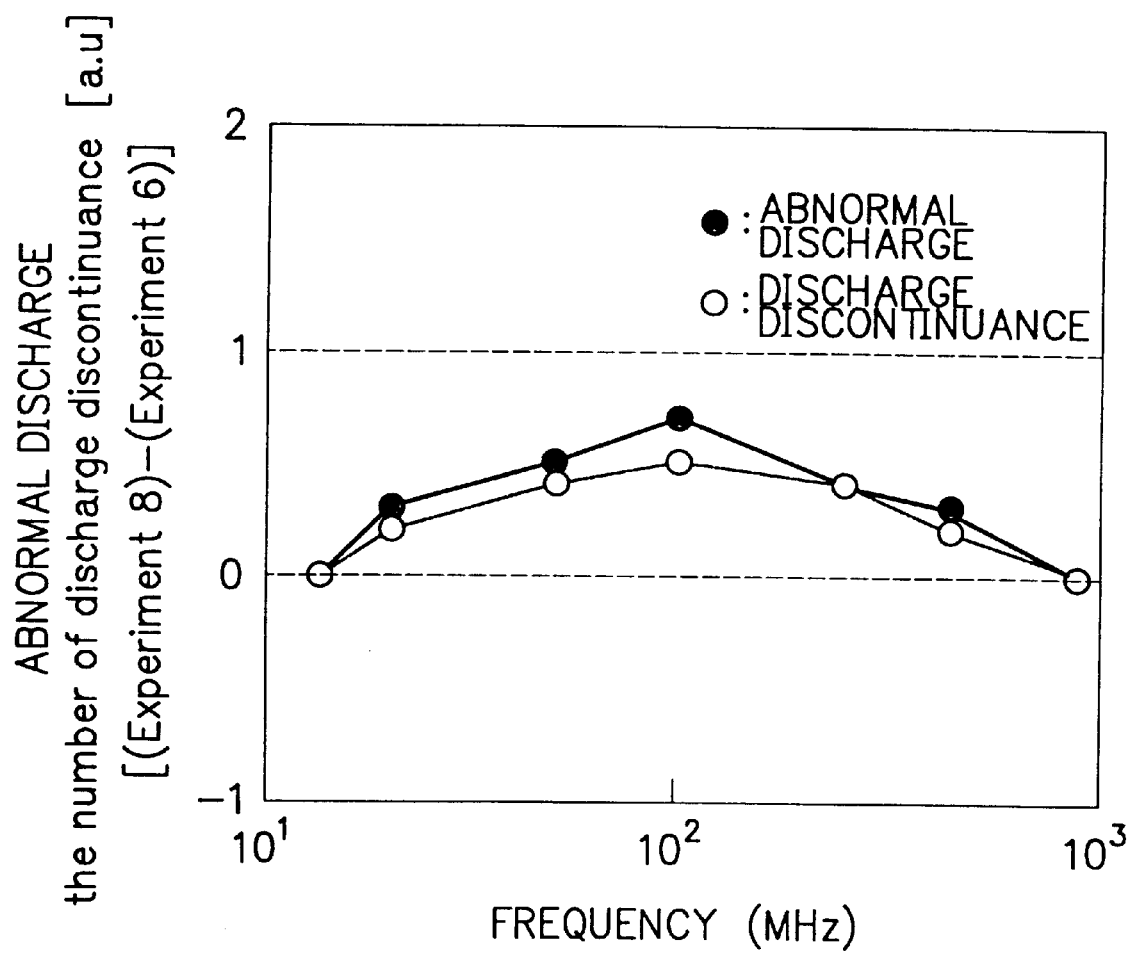

The examined results for the number of occurrence of abnormal discharge, and the number of occurrence of discharge discontinuance in Experiment 8 and those in Experiment 6 are graphically shown in FIG. 19 in terms of differences between Experiment 6 and Experiment 8. Particularly, FIG. 19 is showing a solid thick line curve (●) relating to a difference [(the number of occurrence of abnormal discharge in Experiment 7)–(the number of occurrence of abnormal discharge in Experiment 6)] and a solid thin line curve (○) relating to a difference [(the number of occurrence of discharge discontinuance in Experiment 8)–(the number of occurrence of discharge discontinuance in Experiment 6)].

FIG. 19 indicates that the higher the value is, the higher the abnormal discharge or discharge discontinuance-depressing effect is.

Based on the results shown in FIG. 19, the following fact is understood. The use of the dielectric electrode-coupling inbetween portion 2108 in the cathode electrode (Experiment 6) provides an effect of depressing the occurrence of abnormal discharge and discharge discontinuance in the range of 20 MHz to 450 MHz.

Figure 20:
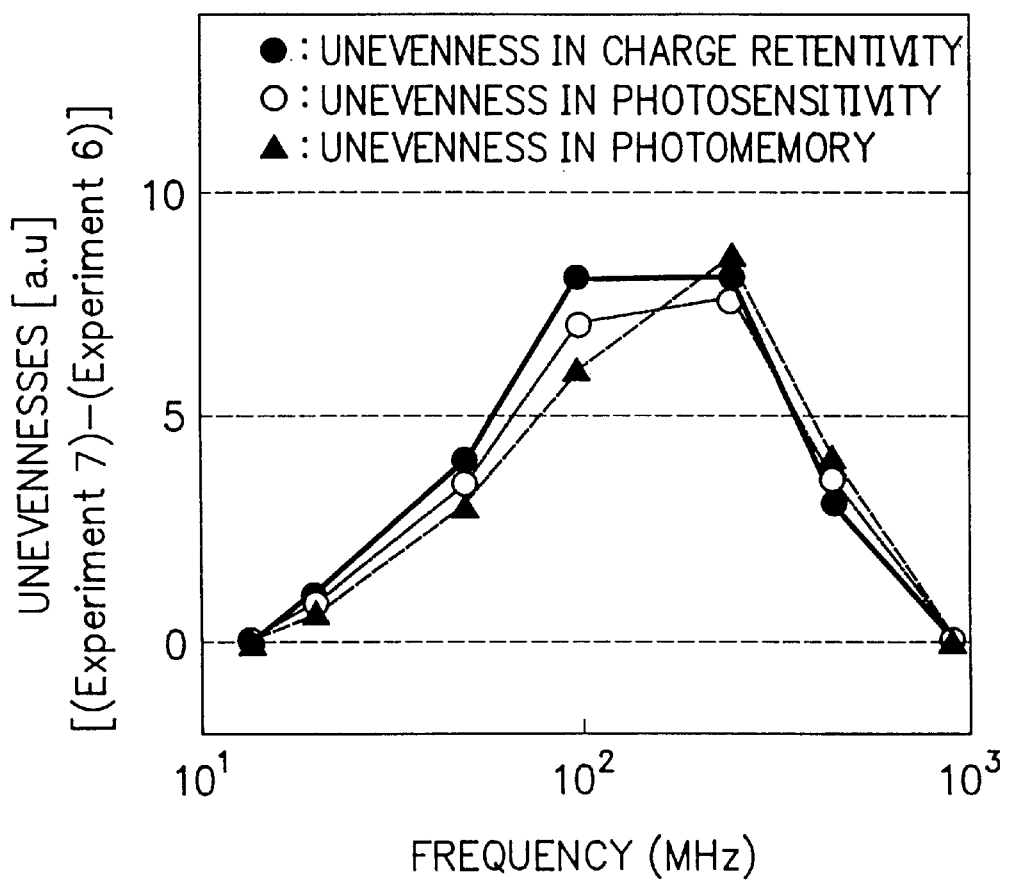

The evaluated results with respect to charge retentivity unevenness, photosensitivity unevenness and photomemory unevenness in Experiment 8 and those in Experiment 6 are graphically shown in FIG. 20 in terms of differences between Experiment 6 and Experiment 8.

Particularly, FIG. 20 is showing a solid line curve (●) relating to a difference [(the charge retentivity unevenness in Experiment 8)–(the charge retentivity unevenness in Experiment 6)], a solid thin line curve (○) relating to a difference [(the photosensitivity unevenness in Experiment 8)–(the photosensitivity unevenness in Experiment 6)], and a broken line curve (▲) relating to a difference [(the photomemory unevenness in Experiment 8)–(the photomemory unevenness in Experiment 6)].

FIG. 20 indicates that the higher the value is, the higher the effect of decreasing the charge retentivity unevenness, photosensitivity unevenness or photomemory unevenness is.

Based on the results shown in FIG. 20, the following facts are understood. The use of the dielectric electrode-coupling inbetween portion 2108 in the cathode electrode (Experiment6) provides an effect of depressing the charge retentivity unevenness, photosensitivity unevenness or photomemory unevenness in the range of 20 MHz to 450 MHz. Especially, said effect is extremely high in the range of 50 MHz to 450 MHz.

In the following, description will be made of an example of a plasma CVD apparatus according to the present invention while referring to FIGS. 21(A) and 21(B).

Figure 21A:
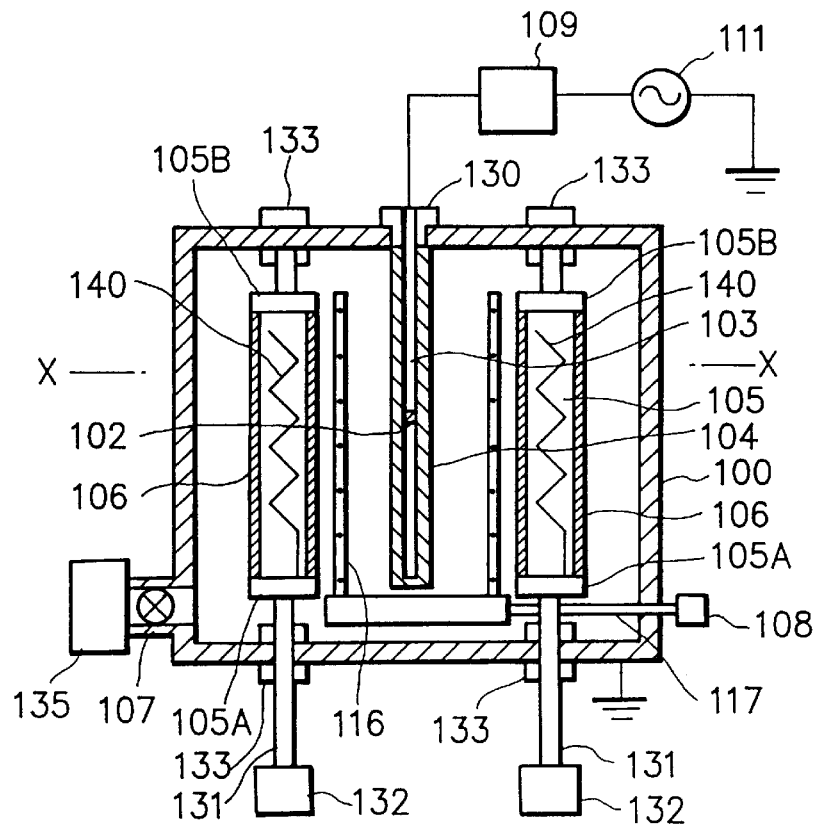

FIG. 21(A) is a schematic diagram illustrating a plasma CVD apparatus according to the present invention. FIG. 21(B) is a schematic cross-sectional view, taken along the line X—X in FIG. 21(A).

Figure 21B:
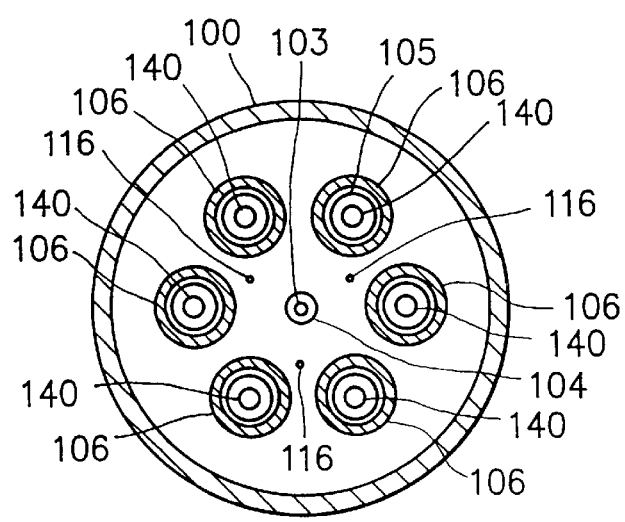

The plasma CVD apparatus shown in FIGS. 21(A) and 21(B) comprises a reaction chamber 100 in which six cylindrical substrate holders 105A each having a cylindrical substrate 106 for film formation positioned thereon are concentrically and spacedly arranged at a predetermined interval. The reaction chamber 100 has a plasma generation space circumscribed by the substrate holders 105A. Reference numeral 105B indicates a dummy holder which serves to cap an end portion of the cylindrical substrate 106 positioned on the substrate holder 105A.

Each substrate holder 105A is provided with a heater 140 (a heat generating means) installed in the inside thereof so that the cylindrical substrate 106 can be heated from the inner side thereof.

Each substrate holder 105A is held on a rotary shaft 131 coupled to a driving motor 132 so that the substrate holder 105A can be rotated.

Reference numeral 103 indicates a cathode electrode arranged at a central position in the plasma generation space. The cathode electrode 103 is electrically connected to a high frequency power source 111 through a matching circuit 109.

The cathode electrode 103 is covered by a dielectric cover 104 which is divided by a dielectric plate 102. Reference numeral 130 indicates a support member by which the cathode electrode is supported. provided with an exhaust valve.

Reference numeral 107 indicates an exhaust pipe provided with an exhaust valve. The exhaust pipe 107 is communicated with an exhausting mechanism 135 provided with a vacuum pump (not shown).

Reference numeral 108 indicates a raw material gas supply system comprising gas reservoirs, mass flow controllers, valves and the like. The raw material gas supply system 108 is connected to a gas feed pipe 116 provided with a plurality of gas discharge ports, through a gas supply pipe 117. Reference numeral 133 indicates a seal member.

Plasma CVD using the above plasma CVD apparatus is conducted, for example, in the following manner.

The reaction chamber 100 is evacuated to bring the inside to a desired high vacuum by operating the exhausting mechanism 135, followed by introducing a given raw material gas from the raw material gas supply system 108 into the reaction chamber 100 through the gas supply pipe 117 and the gas feed pipe 116, and the gas pressure in the reaction chamber 100 is maintained at a predetermined pressure. Thereafter, a given high frequency power from the high frequency power source 111 is supplied to the cathode electrode 103 through the matching circuit 109, whereby plasma is generated between the cathode electrode 103 and the cylindrical substrates 106 in the discharge space, where the raw material gas introduced into the reaction chamber 100 is decomposed and excited to cause the formation of a deposited film on each of the cylindrical substrates 106.

Figure 22:
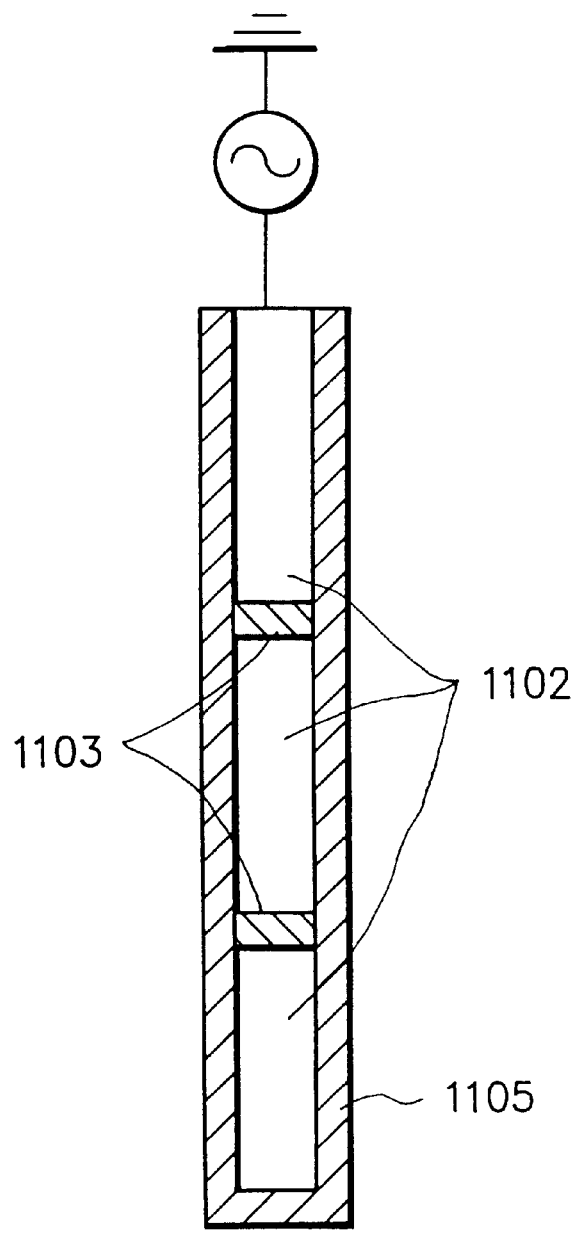

For the configuration of the cathode electrode portion in the present invention, an example thereof has been previously shown in FIG. 15(B). In the case of the configuration shown in FIG. 15(B), the dielectric plate 1103 is arranged at the central portion between the two cathode electrode conductors 1102a and 1102b. But the number of the dielectric plate and the position for the dielectric plate to be arranged may be properly determined depending upon the oscillation frequency of the high frequency power source and the length of the cathode electrode 103 in the axial direction. For instance, it may take such a configuration as shown in FIG. 22 in which two dielectric plates 1103 are arranged.

As the dielectric material by which the dielectric plate 102 is constituted, those dielectric materials previously mentioned may be selectively used. In any case, it is desired to use such a dielectric material that is small in dielectric loss and has a dielectric dissipation factor preferably of 0.01 or less, more preferably of 0.001 or less.

Preferable examples of such dielectric material are dielectric polymer materials such as polytetrafluoroethylene, polytrifluoroethylenechloride, polyfluoroethylenepropylene, and polyimide; glassy materials such as quartz glass, and borosilicate glass; porcelain materials such as boron nitride, silicon nitride, and aluminum nitride; and other porcelain materials comprising principally one or more element oxides selected from the group consisting of aluminum oxide, magnesium oxide, silicon oxide and the like.

The cathode electrode in thepresent invention is desired to take a rod-like configuration in a rod-like form, a cylindrical form, or a prismatic form.

Figure 23:
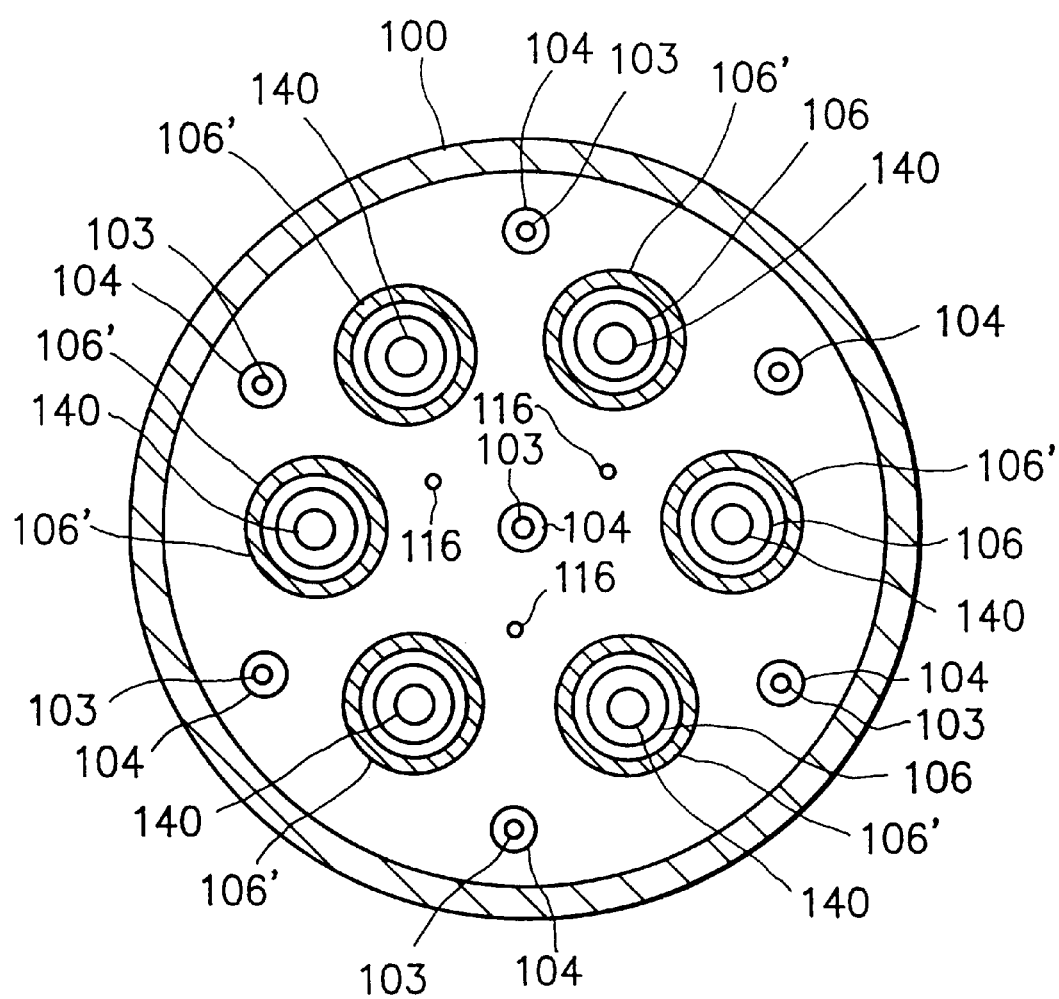

The plasma CVD apparatus in the present invention may take such a constitution as shown in FIG. 23 in which a plurality of cathode electrodes 103 are arranged around cylindrical substrates 106. In this case, the entire circumferencial faces of the cylindrical substrates can be always exposed to plasma upon the film formation, whereby the film deposition rate can be markedly improved and therefore, the productivity can be markedly improved.

Further, in the case where the number of the cathode electrode and the position for the cathode electrode to be arranged are optimized, a desired deposited film can be uniformly formed on the entire surface of a cylindrical substrate without rotating the substrate. This situation enables to simplify the apparatus constitution. When the cylindrical substrate is rotated in this case, it is a matter of course to say that an extremely uniform deposited film can be formed.

Figure 24:
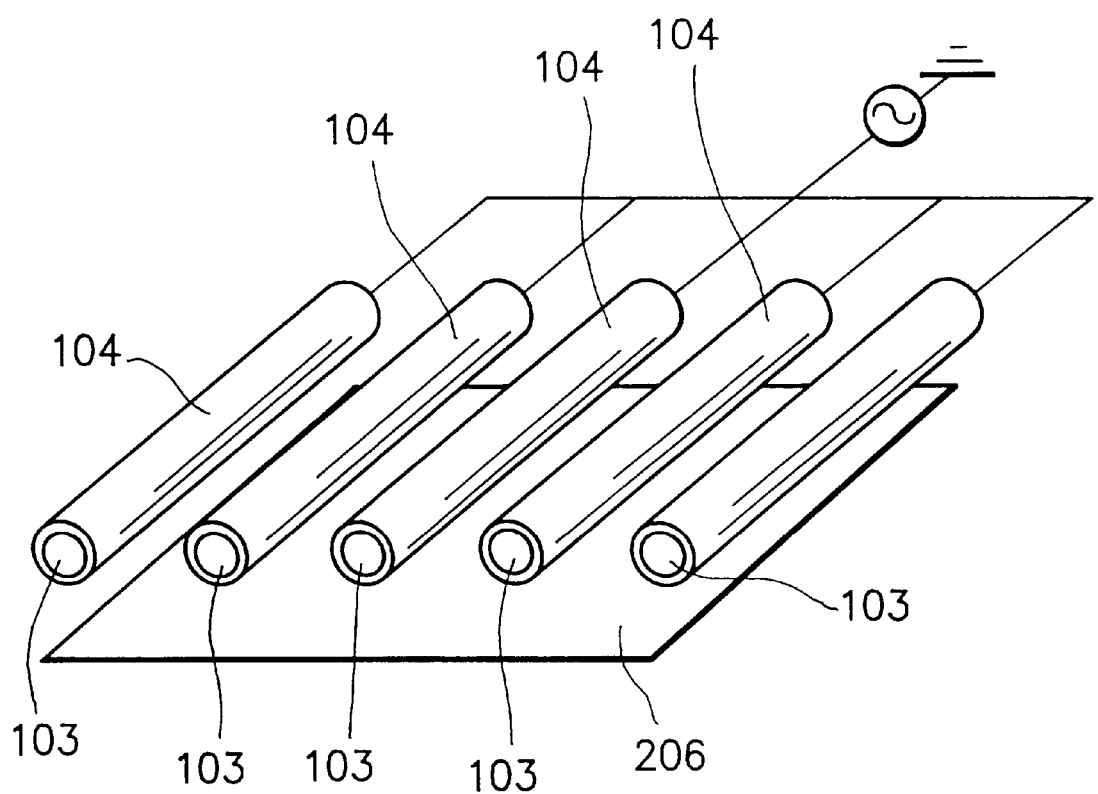

The plasma CVD apparatus in the present invention may also take such a constitution as shown in FIG. 24 in which a plurality of cathode electrodes 103 are arranged inparallel to a plate-like substrate 206. In this case, an extremely homogeneous deposited film having an extremely uniform thickness can be effectively formed on a large area plate-like substrate at an improved deposition rate.

Further, the plasma CVD apparatus in the present invention may take such a constitution as shown in FIG. 25 in which one or more cathode electrodes 103 are arranged in parallel to a substrate web 306 which is paid out by a support roll 150 and taken up by a take-up roll 151 upon the film formation. In this case, an extremely homogeneous deposited film having an extremely uniform thickness can be effectively formed on a large area substrate web at an improved deposit.

Upon the film formation using the plasma CVD apparatus according to the present invention, appropriate film-forming raw material gas may be used depending upon the kind of a deposited film to be formed. Such film-forming raw material gas can include, for instance, the previously mentioned silane, disilane, more high-molecularsilanes, and mixtures of these. Besides, germane, and those hydrocarbons previously mentioned, and mixtures of these can be also mentioned.

As previously described, in any case, the film-forming gas may be introduced into the reaction chamber together with appropriate carrier gas. Such carrier gas can include, for example, $H_2$ gas and inert gas such as Ar gas, He gas or the like.

In addition, it is possible to use property-improving gas for the purpose of, for instance, adjusting the band gap of a deposited film. Such gas can include, for example, nitrogen-containing gases such as nitrogen gas, ammonia, and the like; hydrocarbon gases such as methane, ethane, ethylene, acetylene, propane, and the like; and gaseous fluoride compounds such as silicon tetrafluoride, silicon hexafluoride, germanium tetrafluoride, and mixtures of these.

In order to dope a deposited film formed, it is possible to use an appropriate doping gas. Such doping gas can include those doping gases previously mentioned. Specifically, for example, they are gaseous diboran, boron fluoride, phosphorous fluoride, and the like.

In the following, the present invention will be described in more detail with reference to examples which will be described below. It should be understood that the scope of the present invention is not restricted by these examples.

EXAMPLE 1

In this example, there was used the plasma CVD apparatus shown in FIGS. 21(A) and 21(B) in which the high frequency power source 111 comprises a high frequency power source capable of oscillating a frequency in the range of 30 MHz to 600 MHz, and the cathode electrode 103 comprises a cathode electrode having such a configuration shown in FIG. 15(D) in that the cathode columnar cathode electrode 1102 is divided by a dielectric plate 1103 made of alumina ceramics and covered by a dielectric cover 1105 made of alumina ceramics.

Using this plasma CVD apparatus and under the film-forming conditions shown in Table 11, in the same manner as in Experiment 1, an amorphous silicon film was formed on a substrate for electrical characteristic evaluation and also on five cylindrical substrates.

Herein, with reference to the experimental results shown in Tables 1(A), 1(B) and 1(C), the dielectric cover 1103 of 1 mm in thickness was provided near the center portion of the position where the quality of a film formed would be locally deteriorated when film formation is conducted in a plasma CVD apparatus having neither the dielectric plate 1103 nor the dielectric cover 1105.

For the resultant amorphous silicon films, evaluation was conducted with respect to the film quality, film quality distribution, film deposition rate, and film deposition rate distribution in the same manner as in Experiment 1.

The evaluated results with respect to the photosensitivity for the samples formed under the three different pressure conditions; 50 mTorr, 25 mTorr, and 5 mTorr are shown in Tables 12(A), 12(B) and 12(C).

The evaluated results with respect to the deposition rate and deposition rate distribution for the samples formed under the three different pressure conditions are shown in Tables 13(A), 13(B) and 13(C).

Referring to the samples formed by the high frequency energy with the frequency of 30 MHz, all the samples formed under the pressure condition of 50 mTorr had photosensitivity in the range of $8\times10^3$ to $2\times10^4$, which is practically not problematic. And these samples were found to be 0.5 nm in average deposition rate and 6% in deposition rate distribution.

All the samples formed under the pressure condition of 25 mTorr had photosensitivity in the range of $1\times10^4$ to $3\times10^4$, and they were found to have a good film property. And these samples were found to be 0.5 nm in average deposition rate and 6% in deposition rate distribution.

Under the pressure condition of 5 mTorr, discharge could not be generated.

Relating to the samples formed by the high frequency energy with the frequency of 60 MHz to 300 MHz: all the samples formed under the pressure condition of 50 mTorr were found to have photosensitivity in the range of $1\times10^4$ to $3\times10^4$ and have a good film property, and these samples were found to be 1 to 1.8 nm in average deposition rate and 4 to 6% in deposition rate distribution; all the samples formed under the pressure condition of 25 MTorr were found to have photosensitivity in the range of $4\times10^4$ to $8\times10^4$ and have a good film property, and these samples were found to be 0.92 to 2 nm in average deposition rate and 4 to 5% in deposition rate distribution; and all the samples formed under the pressure condition of 5 mTorr were found to have photosensitivity in the range of $1\times10^5$ to $5\times10^5$ and have an extremely excellent film property, and these samples were found to be 1.0 to 1.7 nm/s in average deposition rate and 4% in deposition rate distribution.

Relating to the samples formed by the high frequency energy with the frequency of 400 MHz to 600 MHz: all the samples formed under the pressure condition of 50 mTorr were found to have photosensitivity in the range of $7\times10^3$ to $1\times10^4$ and have a film property which is practically not problematic, and these samples were found to be 0.6 to 0.7 nm in average deposition rate and 6 to 8% in deposition rate distribution; all the samples formed under the pressure condition of 25 MTorr were found to have photosensitivity in the range of $1\times10^4$ to $3\times10^4$ and have a good film property, and these samples were found to be 0.6 to 0.7 nm in average deposition rate and 6 to 8% in deposition rate distribution; and all the samples formed under the pressure condition of 5 mTorr were found to have photosensitivity in the range of $5\times10^4$ to $8\times10^4$ and have a good film property, and these samples were found to be 0.5 to 0.7 nm/s in average deposition rate and 6 to 7% in deposition rate distribution.

EXAMPLE 2

In this example, the production of light receiving member was conducted using the plasma CVD apparatus shown in FIGS. 21(A) and 21(B) and under the respective film-forming conditions which provided photosensitivity of more than $10^5$ in Example 1, namely, under the conditions in that the pressure condition is 5 mTorr and the oscillation frequency is 60 MHz, 100 MHz, 200 MHz, or 300 MHz. For the dielectric plate 1102 in the cathode electrode 103 of the apparatus, there was used a dielectric plate made of alumina ceramics in a form similar to that used under the pressure condition of 5 mTorr in Example 1.

Particularly, under the conditions shown in Table 14 and using a different oscillation frequency selected from the group consisting of 60 MHz, 100 MHz, 200 MHz, and 300 MHz, a charge injection inhibition layer, a photoconductive layer and a surface layer were formed in the named order on six aluminum cylindrical substrates to obtain six three-layered light receiving members for each oscillation frequency.

For the resultant light receiving members produced using the respective oscillation frequencies, evaluation was conducted with respect to the charge retentivity, the image density of an image reproduced, and the present or absence of a defect in the image reproduced. As a result, any of these light receiving members provided very good results over the entire surface thereof for any of the evaluation items. Accordingly, it is understood that any of the light receiving members has excellent electrophotographic characteristics.

EXAMPLE 3

In this example, using the plasma CVD apparatus shown in FIG. 23, film formation was conducted on a plurality of cylindrical aluminum substrates 106' arranged in the reaction chamber 100 without rotating the substrates. As the cathode electrode 103 in the plasma CVD apparatus, there was used a cathode electrode having the configuration shown in FIG. 15(D).

Particularly, there were provided six cathode electrodes each comprising a columnar cathode electrode 103 made of aluminum comprising having a overall length of 450 mm which is provided with a 1 mm thick dielectric plate 1103 made of alumina ceramics interposed in the central portion of the cathode electrode in the axial direction and which is provided with a dielectric cover 1105 made of alumina ceramics such that the outer side face of the cathode electrode is covered by the dielectric cover. These six cathode electrodes were spacedly arranged in the reaction chamber 100 as shown in FIG. 23.

And six cylindrical aluminum substrates 106' of 108 mm in outer diameter, 358 mm in length and 5 mm in thickness were respectively positioned on the cylindrical substrate holders 106.

Film formation was conducted under the film-forming conditions shown in Table 15 to form an amorphous silicon (a-Si) film on the surface of each of the six cylindrical substrates 106'.

Based on the resultant samples, the film deposition rate and film deposition rate distribution were evaluated as will be described below.

One of the six cylindrical substrates each having the a-Si film formed thereon was randomly selected. For the cylindrical substrate thus selected, on the surface thereof (that is, the surface of the a-Si film formed on the surface of the cylindrical substrate), lines were drawn at an interval of about 20 mm in the axial direction and another lines were drawn at an interval of about 32 mm in the circumferential direction, whereby 180 intersections were established on the surface of the a-Si film. Then, for the film portion situated at each intersection, the film thickness was measured by means of the charging current type film thickness measuring instrument used in Experiment 1, followed by calculating a film deposition rate based on the measured film thickness. Then, there was obtained an average value among the resultant film deposition rates, and this value was defined as an average film deposition rate. The average film deposition rate was 7.2 nm/s.

The film deposition rate distribution in the axial direction was evaluated in the following manner.

For the deposition rates at the eighteen measuring positions in one line in the axial direction, there was obtained a difference between the maximum film deposition rate and the minimum film deposition rate. The difference was divided by the average film deposition rate among the film deposition rates of the eighteen measuring positions to obtain a film deposition rate distribution for the one line. In this way, a film deposition rate distribution was obtained for each of the remaining nine lines in the axial direction. And, there was obtained an average value among the ten film deposition rate distribution values. This average value was defined as a film deposition rate in the axial direction, and it was represented by a percentage. The film deposition rate distribution in the axial direction was 5%.

The film deposition rate distribution in the circumferential direction was evaluated in the following manner.

For the deposition rates at the ten measuring positions in one row in the circumferential direction, there was obtained a difference between the maximum film deposition rate and the minimum film deposition rate. The difference was divided by the average film deposition rate among the film deposition rates of the ten measuring positions to obtain a film deposition rate distribution for the one row. In this way, a film deposition rate distribution was obtained for each of the remaining seventeen rows in the circumferential direction. And, there was obtained an average value among the eighteen film deposition rate distribution values. This average value was defined as a film deposition rate in the circumferential direction, and it was represented by a percentage. The film deposition rate distribution in the circumferential direction was 9%.

EXAMPLE 4

In this example, the production of light receiving member was conducted using the same plasma CVD apparatus used in Example 3.

Particularly, under the conditions shown in Table 16, a charge injection inhibition layer, a photoconductive layer and a surface layer were formed in the named order on six aluminum cylindrical substrates to obtain six three-layered light receiving members.

For the resultant light receiving members, evaluation was conducted with respect to the charge retentivity, the image density of an image reproduced, and the present or absence of a defect in the image reproduced. As a result, any of these light receiving members provided very good results over the entire surface thereof for any of the evaluation items. Accordingly, it is understood that all the light receiving members have excellent electrophotographic characteristics.

EXAMPLE 5

The procedures of Example 3 were repeated, except that the cylindrical substrates were rotated upon the film formation, to thereby produce six light receiving members.

For one of the six cylindrical substrates having the a-Si film formed thereon which was randomly selected, the film deposition rate and film deposition rate distribution were evaluated in the same manner as in Example 3. The evaluated results revealed that the average film deposition rate is 7.2 nm/s, the film deposition rate distribution in the axial direction is 5%, and the film deposition rate distribution in the circumferential direction is 3%.

EXAMPLE 6

In this example, the production of light receiving member was conducted by repeating the procedures of Example 3, except for rotating the cylindrical substrates upon the film formation.

Particularly, under the conditions shown in Table 16, a charge injection inhibition layer, a photoconductive layer and a surface layer were formed in the named order on six aluminum cylindrical substrates to obtain six three-layered light receiving members.

For the resultant light receiving members, evaluation was conducted with respect to the charge retentivity, the image density of an image reproduced, and the present or absence of a defect in the image reproduced. As a result, any of these light receiving members provided very good results over the entire surface thereof for any of the evaluation items. Accordingly, it is understood that all the light receiving members have excellent electrophotographic characteristics.

EXAMPLE 7

In this example, using the apparatus shown in FIG. 24, film formation was conducted on a substrate comprising a 1 mm thick plane glass plate of 500 mm×500 mm in size positioned in the reaction chamber.

As the cathode electrode 103, there was used a cathode electrode having the configuration shown in FIG. 22. Particularly, there were provided five cathode electrodes each comprising a columnar body having an overall length of 602 mm which comprises three columnar aluminum conductors 1102 of 200 mm in length and 25 mm in diameter and two 1 mm thick circular dielectric plates 1103 (made of alumina ceramics) having a diameter of 25 mm each being interposed between the respective two columnar aluminum conductors 1102, and a dielectric cover 1105 (made of alumina ceramics) of 605 mm in length, 26 mm in inner diameter and 38 mm in outer diameter by which said columnar body is covered. These five cathode electrodes were spacedly arranged in the reaction chamber as shown FIG. 24.

Then, using a high frequency power with an oscillation frequency of 250 MHz under the film-forming conditions shown in Table 17, film formation was conducted to form an amorphous silicon (a-Si) film on the surface of the plane glass plate as the substrate.

Based on the a-Si film formed on the plane glass plate, the film deposition rate and film deposition rate distribution were evaluated as will be described below.

On the surface of the plane glass plate (that is, the surface of the a-Si film formed on the surface of the plane glass plate), lines were drawn at an interval of about 30 mm in the longitudinal direction and another lines were drawn at an interval of about 30 mm in the lateral direction, whereby 256 intersections were established on the surface of the a-Si film. Then, for the film portion situated at each intersection, the film thickness was measured by means of the charging current type film thickness measuring instrument used in Experiment 1, followed by calculating a film deposition rate based on the measured film thickness. Then, there was obtained an average value among the resultant film deposition rates, and this value was defined as an average film deposition rate. The average film deposition rate was 7.2 nm/s.

The film deposition rate distribution was evaluated in the following manner.

For the deposition rates at the 256 measuring positions, there was obtained a difference between the maximum film deposition rate and the minimum film deposition rate. The difference was divided by the average film deposition rate to obtain a value. This value was defined as the film deposition rate distribution, and it was represented by a percentage. The film deposition rate distribution was 8%.

Comparative Example 1

The procedures of Example 7 were repeated, except that the dielectric plates 1103 and the dielectric cover 1105 in each cathode electrode used in Example 7 were omitted, to thereby form an a-Si film on the same plane glass plate as in Example 7.

Based on the resultant a-Si film, the film deposition rate and film deposition rate were evaluated in the same manner as in Example 7. The evaluated results revealed that the average film deposition rate is 6.3 nm/s, and the film deposition rate distribution is 35%.

Comparative Example 2

Using the parallel plane plate type plasma CVD apparatus shown in FIG. 1, a substrate 6 comprising a 1 mm thick plane glass plate of 500 mm×500 mm in size was positioned on the counter electrode 5 in the reaction chamber 1, and film formation was conducted under the film-forming conditions shown in Table 18 to form an a-Si film on the plane glass plate.

Based on the resultant a-Si film, the film deposition rate and film deposition rate were evaluated in the same manner as in Example 7. The evaluated results revealed that the average film deposition rate is 3.5 nm/s, and the film deposition rate distribution is 85%.

EXAMPLE 8

Using the apparatus shown in FIG. 25, film formation was conducted on a 0.1 mm thick substrate web 306 made of stainless steel which was moving while being paid out from the support roll 150 and taken up on by the take-up roll 151.

As the cathode electrode 103, there was used a cathode electrode having the configuration shown in FIG. 22. Particularly, there was provided a cathode electrode comprising a columnar body having an overall length of 602 mm which comprises three columnar aluminum conductors 1102 of 200 mm in length and 25 mm in diameter and two 1 mm thick circular dielectric plates 1103 (made of alumina ceramics) having a diameter of 25 mm each being interposed between the respective two columnar aluminum conductors 1102, and a dielectric cover 1105 (made of alumina ceramics) of 605 mm in length, 26 mm in inner diameter and 38 mm in outer diameter by which said columnar body is covered. This cathode electrode was arranged in the reaction chamber as shown FIG. 25.

Then, using a high frequency power with an oscillation frequency of 550 MHz under the film-forming conditions shown in Table 19, film formation was conducted to form an a-Si film on the foregoing substrate web. A substrate web portion of 500 mm in length was cut from the resultant.

Based on the a-Si film formed on the substrate web portion, the film deposition rate and film deposition rate were evaluated in the same manner as in Example 7. The evaluated results revealed that the average film deposition rate is 1.5 nm/s, and the film deposition rate distribution is 5%.

EXAMPLE 9

In accordance with the procedures of Experiment 2 using the plasma CVD apparatus shown in FIGS. 8(A) and 8(B), a two-layered light receiving layer comprising a photoconductive layer and a surface layer was formed on six well-cleaned cylindrical aluminum substrates of 80 mm in outer diameter, 358 mm in length and 5 mm in thickness under the conditions shown in Table 20, whereby six light receiving members having the layer constitution shown in FIG. 11 were produced (these six light receiving members will be simply referred to as "drum" in the following)

The drum production was conducted ten times by using a different cathode electrode selected from the group consisting of the cathode electrodes No. 1 to No. 10 shown in Table 4.

Each of the resultant ten drums was set to an electrophotographic apparatus NP6750 modified for experimental purposes (produced by Canon Kabushki Kaisha), where evaluation was conducted with respect to (1) occurrence of ghost, (2) blank exposure memory, (3) unevenness in charge retentivity (hereinafter referred to as charge retentivity unevenness) (4) unevenness in photosensitivity (hereinafter referred to as photosensitivity unevenness) , (5) occurrence of smeared image, (6) occurrence of white dot, (7) occurrence of black dot, and (8) occurrence of fogging, respectively after having conducted 500,000 copying shots.

The evaluated results obtained are collectively shown in Table 21.

The evaluation of each of these evaluation items was conducted in the following manner.

(1) Evaluation of the Occurrence of Ghost

A ghost test chart FY9-9040 (produced by Canon Kabushiki Kaisha) having a black solid circle of 5 mm in diameter and having a reflection density of 1.1 stuck thereon is positioned on the original table and a halftone test chart (produced by Canon Kabushiki Kaisha) is superposed thereon, followed by subjecting to image reproduction to obtain a copied halftone image product. For the image product, there is measured a difference between the reflection density of the image based on the foregoing black solid circle of the ghost test chart and that of the halftone image.

The result obtained is shown in Table 21 on the basis of the following criteria.

◎: a case where the situation is excellent,
○: a case where the situation is good enough,
Δ: a case where distinguishable ghost is observed in a limited area, and
X: a case where distinguishable ghost is observed in a relatively wide area.

(2) Evaluation of the Blank Exposure Memory

A halftone test chart FY9-9042 (produced by Canon Kabushiki Kaisha) is positioned on the original table, followed by subjecting to image reproduction to obtain a copied halftone image product. For the image product, while focusing particularly on the position corresponding to the portion of the drum surface having been irradiated with the blank exposure light, there is measured a difference between the reflection density of the image based on the drum surface portion irradiated with no blank exposure light and that of the image based on the drum surface portion irradiated with the blank exposure light.

The result obtained is shown in Table 21 on the basis of the following criteria.

◎: a case where the situation is excellent,
○: a case where the situation is good enough,
Δ: a case where distinguishable blank exposure memory is observed in a limited area, and
X: a case where distinguishable blank exposure memory is observed in a relatively wide area.

(3) Evaluation of the Charge Retentivity Unevenness

The drum is installed in the electrophotographic apparatus, where a high voltage of +6 kV is impressed to the main charger to conduct corona charging wherein the dark surface potential of the drum is measured by means of an electrostatic voltmeter. This surface potential measurement is conducted for the positions selected at an interval of 3 cm on the drum surface in the longitudinal direction. Then, there is obtained an average value among the measured dark surface potentials. This average value is defined as the charge retentivity. And the value which is the most remote from the average value is defined as the charge retentivity unevenness.

The above evaluation is conducted for all the six drums produced in the same batch, and the one which is the largest in the charge retentivity unevenness is shown in Table 21 on the basis of the following criteria.

⊚: a case where the situation is excellent,

○: a case where the situation is good enough,

Δ: a case where a region having a relatively large charge retentivity unevenness is observed in a limited area of the drum surface, and X: a case where regions having a relatively large charge retentivity unevenness are observed in a relatively wide area of the drum surface.

(4) Evaluation of the Photosensitivity Unevenness

The drum is installed in the electrophotographic apparatus, where immediately after charging the drum to a prescribed dark surface potential, light image is irradiated to the drum. The irradiation of the light image herein is conducted in a manner in which light from a xenon lamp as the exposure light source is passed through a filter to cut off light having a wavelength of less than 550 nm, followed by irradiating to the drum. In this case, the surface potential in light of the drum is measured by means of the electrostatic voltmeter. The quantity of the exposure light is adjusted so that the light surface potential becomes constant at a prescribed potential value. The quantity of the exposure light in this case is defined as the photosensitivity.

This measurement is conducted for the positions selected at an interval of 3 cm on the drum surface in the longitudinal direction. Then, there is obtained an average value among the measured values. This average value is defined as the average photosensitivity. And the value which is the most remote from the average value is defined as the photosensitivity unevenness.

The above evaluation is conducted for all the six drums produced in the same batch, and the one which is the largest in the photosensitivity unevenness is shown in Table 21 on the basis of the following criteria.

⊚: a case where the situation is excellent,

○: a case where the situation is good enough,

Δ: a case where a region having a relatively large photosensitivity unevenness is observed in a limited area of the drum surface, and X: a case where regions having a relatively large photosensitivity unevenness are observed in a relatively wide area of the drum surface.

(5) Evaluation of the Occurrence of Smeared Image

A test chart FY9-9058 (produced by Canon Kabushiki Kaisha) containing minute characters on the white background is positioned on the original table, followed by subjecting to image reproduction while irradiating exposure light in a quantity which is greater by two times over the ordinary exposure light quantity, whereby a reproduced image product is obtained. For the resultant image product, evaluation is conducted of whether or not a discontinued defect is present in the reproduced minute characters. When such a discontinued defect is present in the reproduced image product, a given image region thereof which is worst in terms of the reproduction of the minutes characters of the original is dedicated for the evaluation.

The evaluated result obtained is shown in Table 21 on the basis of the following criteria.

⊚: a case where no discontinued portion is present,

○: a case where a very slightly discontinued portion is present,

Δ: a case where several discontinued portions are present but the reproduced minute characters can be recognized, and X: a case where a large number of discontinued portions are present and the reproduced minute characters are difficult to be recognized.

(6) Evaluation of the Occurrence of White Dot

A whole solid black test chart FY9-9073 (produced by Canon Kabushiki Kaisha) is positioned on the original table, followed by subjecting to image reproduction, whereby a reproduced image product is obtained. For a give area of the image product, the number of a white dot having a diameter of less than 0.2 mm is counted.

The evaluated result obtained is shown in Table 21 on the basis of the following criteria.

⊚: a case where no white dot is present,

○: a case where few white dots are present,

Δ: a case where several white dots are present, and

X: a case where a relatively large number of white dots are present.

(7) Evaluation of the Occurrence of Black Dot

Ten white copying papers are superposed on the original table, followed by subjecting to image reproduction, whereby a reproduced image product is obtained. For a give area of the image product, the number of a black dot having a diameter of less than 0.2 mm is counted.

The evaluated result obtained is shown in Table 21 on the basis of the following criteria.

⊚: a case where no black dot is present,

○: a case where few black dots are present,

Δ: a case where several black dots are present , and

X: a case where a relatively large number of black dots are present.

(8) Evaluation of the Occurrence of Fogging

A halftone test chart FY9-9042 (produced by Canon Kabushiki Kaisha) is positioned on the original table, followed by subjecting to image reproduction, whereby a reproduced image product is obtained. For a white dot having a diameter of less than 0.2 mm present in a give area of the image product, examination is conducted whether or not shadowed fogging is present around the white dot.

The evaluated result obtained is shown in Table 21 on the basis of the following criteria.

⊚: a case where no white dot with shadowed fogging is present,

○: a case where few white dots with shadowed fogging are present,

Δ: a case where several white dots with shadowed fogging are present, and

X: a case where a relatively large number of white dots with shadowed fogging are present.

Comparative Example 3

The procedures of Example 9 were repeated, except that only one kind of a cathode electrode comprising a single constituent material (SUS 304) [corresponding to the Ref electrode in Experiment 1] was used as the cathode electrode in the plasma CVD apparatus shown in FIGS. 8(A) and 8(B), to thereby obtain six drums.

For the resultant drums, evaluation was conducted in the same manner as in Example 9. The evaluated results obtained are shown in Table 21.

As apparent from the results shown in Table 21, it is understood that the cathode electrodes according to the present invention provide superior effects.

EXAMPLE 10

The procedures of Example 9 were repeated, except that only one kind of a cathode electrode comprising the No. 6 cathode electrode was used, and a three-layered light receiving layer comprising a charge injection inhibition layer, a photoconductive layer and a surface layer was formed on six well-cleaned cylindrical aluminum substrates of 80 mm in outer diameter, 358 mm in length and 5 mm in thickness under the conditions shown in Table 22, to thereby obtain six drums having the layer constitution shown in FIG. 11.

For the resultant drums, evaluation was conducted in the same manner as in Example 9. The evaluated results obtained are shown in Table 23.

EXAMPLE 11

The procedures of Example 9 were repeated, except that only one kind of a cathode electrode comprising the No. 6 cathode electrode was used, and a four-layered light receiving layer comprising a charge injection inhibition layer, a charge transportation ayer, a charge generation layer and a surface layer was formed on six well-cleaned cylindrical aluminum substrates of 80 mm in outer diameter, 358 mm in length and 5 mm in thickness under the conditions shown in Table 24, to thereby obtain six drums having the layer constitution shown in FIG. 13.

For the resultant drums, evaluation was conducted in the same manner as in Example 9. The evaluated results obtained are shown in Table 23.

EXAMPLE 12

The procedures of Example 9 were repeated, except that only one kind of a cathode electrode comprising the No. 6 cathode electrode was used, and a three-layered light receiving layer comprising a first photoconductive layer region, a second photoconductive layer region, and a surface layer was formed on six well-cleaned cylindrical aluminum substrates of 80 mm in outer diameter, 358 mm in length and 5 mm in thickness under the conditions shown in Table 25, to thereby obtain six drums having the layer constitution shown in FIG. 14.

For the resultant drums, evaluation was conducted in the same manner as in Example 9. The evaluated results obtained are shown in Table 23.

As Table 23 illustrates, it is understood that the present invention is extremely effective without depending upon the layer constitution of a light receiving member produced.

EXAMPLE 13

The procedures of Example 9 were repeated, except that instead of the ten kinds of the cathode electrodes used in Example 9, eleven kinds of the Nos. 38 to 48 cathode electrodes shown in Table 7 were used, and a two-layered light receiving layer comprising a photoconductive layer and a surface layer was formed on six well-cleaned cylindrical aluminum substrates of 80 mm in outer diameter, 358 mm in length and 5 mm in thickness under the conditions shown in Table 20, to thereby obtain six drums having the layer constitution shown in FIG. 11 for each kind of the cathode electrode.

For the resultant drums, evaluation was conducted in the same manner as in Example 9. The evaluated results obtained are shown in Table 26.

As Table 26 illustrates, it is understood that even in the case where a given dielectric material is used as a part of the constituent of the cathode electrode, the effects of the present invention are provided.

EXAMPLE 14

The procedures of Example 9 were repeated, except that instead of the ten kinds of the cathode electrodes used in Example 9, twenty seven kinds of the Nos. 11 to 37 cathode electrodes shown in Tables 5 and 6 were used, and a two-layered light receiving layer comprising a photoconductive layer and a surface layer was formed on six well-cleaned cylindrical aluminum substrates of 80 mm in outer diameter, 358 mm in length and 5 mm in thickness and having a mirror-finished surface under the conditions shown in Table 20, to thereby obtain six drums having the layer constitution shown in FIG. 11 for each kind of the cathode electrode.

For the resultant drums, evaluation was conducted in the same manner as in Example 9.

As a result, besides the variation in the plasma potential having been about 50% or less with respect to each of the cathode electrodes used, satisfactory results were obtained as well as in Example 9.

EXAMPLE 15

The procedures of Example 9 were repeated, except that the drum production was conducted by varying the oscillation frequency of the high frequency power in the range of 20 MHz to 450 MHz, to thereby produce six drums having a two-layered light receiving layer comprising a photoconductive layer and a surface layer under the same conditions as in Example 9 for each oscillation frequency.

For the resultant drums, evaluation was conducted in the same manner as in Example 9.

As a result, in the case of the oscillation frequency in the range of 20 MHz to 450 MHz, satisfactory or excellent results were provided. Especially, in the case of the oscillation frequency in the range of 51 MHz to 250 MHz, markedly excellent results were provided.

Incidentally, it should be understood that any of the cathode electrodes used in Examples 9 to 15 and Comparative Example 3 has a surface with a surface roughness of 50 μm.

EXAMPLE 16

Using the plasma CVD apparatus shown in FIGS. 9(A) and 9(B), a three-layered light receiving layer comprising a charge injection inhibition layer, a photoconductive layer and a surface layer was formed on a plurality of cylindrical aluminum substrates of 30 mm in outer diameter and 358 mm in length under the conditions shown in Table 27, wherein the oscillation frequency of the high frequency power source 2112 was made to be 105 MHz, whereby a plurality of a-Si light receiving members were produced. This procedure was repeated ten times.

The high frequency power introduction means 2109 in the foregoing plasma CVD apparatus comprises a body comprising a columnar electrode-coupling inbetween portion 2108 made of alumina and having a diameter of 20 mm and a thickness of 8 mm interposed between two columnar electrode conductors 2107 made of SUS 304 and having a diameter of 20 mm.

Each of the raw material gas supply pipes 2113 in the foregoing plasma CVD apparatus comprises a raw material gas supply pipe made of alumina having a closed end and which is 6 mm in inner diameter and 8 mm in outer diameter and is provided with twelve gas release nozzles of 0.8 mm in diameter which are spacedly arranged at an equal interval so as to face the high frequency power introduction means which is situated nearest thereto.

For the resultant a-Si light receiving members, evaluation was conducted with respect to (a) charge retentivity, (b) photosensitivity, (c) photomemory, (d) unevennesses (charge retentivity unevenness, photosensitivity unevenness, and photomemory unevenness), (e) stability in characteristics, and (f) image quality (the quality of an image reproduced), using an electrophotographic apparatus NP-6030 modified for experimental purposes (produced by Canon Kabushiki Kaisha).

The evaluated results obtained are collectively shown in Table 28.

The evaluation of each of these evaluation items was conducted in a manner which will be described below.

(a) Evaluation of the Charge Retentivity Unevenness

The light receiving member is installed in the electrophotographic apparatus. A predetermined electric current is flown to the main charger of the electrophotographic apparatus, where the dark potential at the position of the development mechanism is measured. It indicates that the higher the dark potential is, the better the charge retentivity is.

The measurement of the dark potential is conducted for the entire surface region of the light receiving member in the generatrix direction.

The evaluation of the charge retentivity is based on the minimum value among the resultant values.

(b) Evaluation of the Photosensitivity

The light receiving member is installed in the electrophotographic apparatus, wherein after the electric current flown to the main charger is adjusted so that the dark potential of the light receiving member at the position of the development mechanism becomes constant at a prescribed value, using a white paper with a reflection density of less than 0.01 as a original, the quantity of image exposure light is adjusted so that the light potential of the light receiving member at the position of the development mechanism becomes constant at a prescribed value wherein the quantity of the image exposure light is measured.

It indicates that the lower the quantity of the image exposure light is, the better the photosensitivity is.

The measurement of the quantity of the image exposure light is conducted for the entire surface region of the light receiving member in the generatrix direction.

The evaluation of the photosensitivity is based on the maximum value among the resultant values.

(c) Evaluation of the Photomemory

The light receiving member is installed in the electrophotographic apparatus, wherein after the electric current flown to the main charger is adjusted so that the dark potential of the light receiving member at the position of the development mechanism becomes constant at a prescribed value, the quantity of image exposure light is adjusted so that the light potential of the light receiving member at the position of the development mechanism in the case of using a prescribed white paper as an original becomes constant at a prescribed value. While maintaining this state, a ghost test chart FY9-9040 (produced by Canon Kabushiki Kaisha) having a black solid circle of 5 mm in diameter and having a reflection density of 1.1 stuck thereon is positioned on the original table and a halftone test chart (produced by Canon Kabushikl Kaisha) is superposed thereon, followed by subjecting to image reproduction to obtain a copied halftone image product. For the image product, there is measured a difference between the reflection density of the image based on the foregoing black solidcircle of the ghost test chart and that of the halftone image. In this way, photomemory measurement is conducted. This photomemory measurement is conducted for the entire surface region of the light receiving member in the generatrix direction.

The evaluation of the photomemory is based on the maximum value among the resultant values.

(d) Evaluation of the Unevenness

The charge retentivity unevenness is evaluated as follows. For the dark potential values measured in the above charge retentivity evaluation, there is obtained a difference between the maximum value and the minimum value. Based on the resultant difference, evaluation with five levels is conducted.

The photosensitivity unevenness is evaluated as follows. For the image exposure light quantity values measured in the above photosensitivity evaluation, there there is obtained a difference between the maximum value and the minimum value. Based on the resultant difference, evaluation with five levels is conducted.

The photomemory unevenness is evaluated as follows. The foregoing photomemory measurement is conducted for 20 positions on the copied image product, and for the resultant measured values, there is obtained between the maximum vale and the minimum value. Based on the resultant difference, evaluation with five levels is conducted.

Of the evaluated results for the charge retentivity unevenness, photosensitivity unevenness and photomemory unevenness, the worst one is made to be the evaluation result of the unevenness.

(e) Evaluation of the Stability in Characteristics

For all the light receiving members obtained in the ten batches, evaluation is conducted with respect to the charge retentivity, photosensitivity, photomemory, unevenness, and total image-forming performance. Based on variations among the evaluated results, evaluation with five levels is conducted.

(f) Evaluation of the Image Quality

For an image reproduced, its quality is evaluated in total viewpoints including occurrence of smeared image, defective image and the like.

The evaluated results with respect to the above evaluation items (a) to (f) are collectively shown in Table 28.

As Table 28 illustrates, it is understood that the light receiving members produced in this example are good enough for the all the evaluation items. Hence, it is understood that the present invention enables to mass produce an a-Si series light receiving member whose entire region being excellling in electrophotographic characteristics including charge retentivity, photosensitivity, photomemory and the like.

Comparative Example 4

The procedures of Example 16 were repeated, except that the body used as the high frequency power introduction means in Example 16 was replaced by a single columnar electrode conductor with no columnar electrode-coupling inbetween portion 2108, to form a three-layered light receiving layer comprising a charge injection inhibition layer, a photoconductive layer and a surface layer on a plurality of cylindrical aluminum substrates of 30 mm in outer diameter and 358 mm in length under the conditions shown in Table 27, whereby a plurality of a-Si light receiving members were produced.

This procedure was repeated ten times as well as in the case of Example 16.

For the resultant a-Si light receiving members, evaluation was conducted with respect to (a) charge retentivity, (b)

photosensitivity, (c) photomemory, (d) unevennesses, (e) stability in characteristics, and (f) image quality in the same manner as in Example 16.

The evaluated results obtained are collectively shown in Table 28.

Based on the results shown in Table 28, it is understood that there is a distinguishable difference between Example 16 and Comparative Example 4 with respect to all the evaluation items. The reason of this situation is due to the fact that in the case of Comparative Example 4, discharge discontinuance or/and abnormal discharge had been occurred during the film formation.

EXAMPLE 17

Figure 26A:
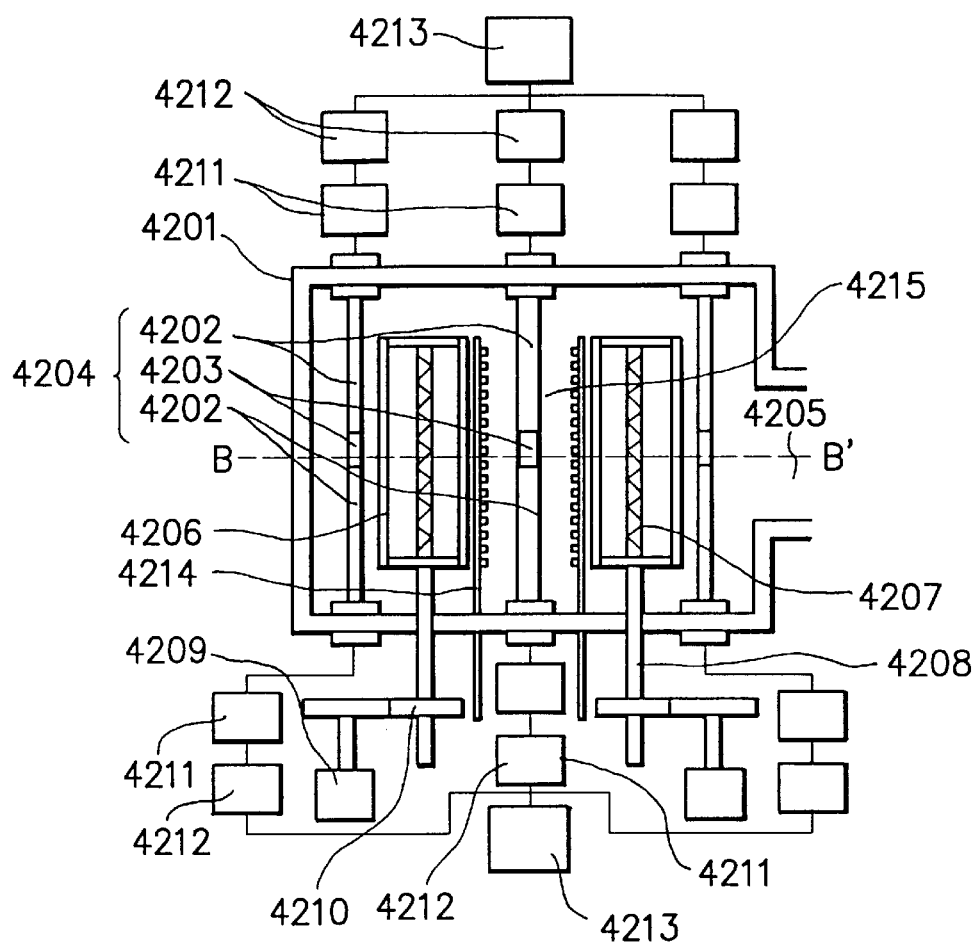
Figure 26B:
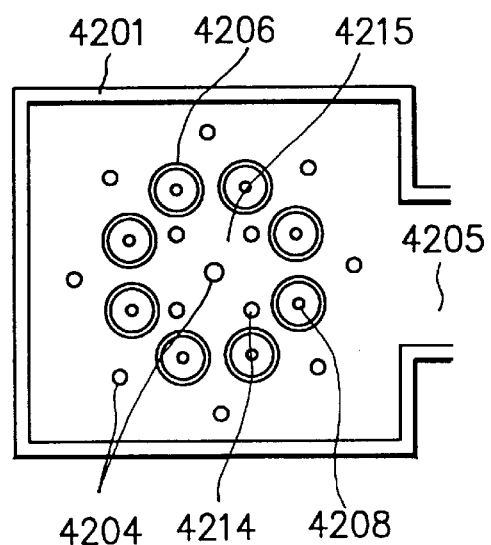

Using a plasma CVD apparatus shown in FIGS. 26(A) and 26(B), a three-layered light receiving layer comprising a charge injection inhibition layer, a photoconductive layer and a surface layer on eight cylindrical aluminum substrates of 30 mm in outer diameter and 358 mm in length under the conditions shown in Table 29, whereby eight a-Si light receiving members were produced. This procedure was repeated ten times.

In FIGS. 26(A) and 26(B), reference numeral 4201 indicates a reaction chamber, reference numeral 4202 a high frequency electrode conductor, reference numeral 4203 an electrode-coupling inbetween portion, reference numeral 4204 a high frequency power introduction means, reference numeral 4205 an exhaust pipe connected to an exhaustion device (not shown), reference numeral 4206 a cylindrical substrate, reference numeral 4207 a heat generating means, reference numeral 4208 a rotary shaft, reference numeral 4209 a driving motor, reference numeral 4210 a reduction gear, reference numeral 4211 a phase adjuster, reference numeral 4212 a matching box, reference numeral 4213 a high frequency power source, reference numeral 4214 a raw material gas supply means, and reference numeral 4215 a film-forming space (or a discharge space.

In this example, the oscillation frequence of the high frequency power source 4213 was made to be 20 MHz.

For the high frequency power introduction means 4204, one high frequency power introduction means is arranged in the film-forming space 4215 circumscribed by the eight cylindrical substrates 4206 (which are concentrically and spacedly arranged so as to circumscribe the film-forming space 4215) and eight high frequency power introduction means are arranged outside the arrangement of the eight cylindrical substrates 4206 as shown FIG. 26(B).

The one high frequency power introduction means 4204 arranged in the film-forming space 4215 comprises a body comprising a columnar electrode-coupling inbetween portion 4203 made of boron nitride and having a diameter of 15 mm and a thickness of 4 mm interposed between two columnar electrode conductors 4202 made of titanium and having a diameter of 15 mm, and said body being provided with a dielectric cover (not shown) made of alumina ceramics and having an outer diameter of 22 mm and an inner diameter of 16 mm so as to cover the exterior thereof.

Each of the eight high frequency power introduction means arranged outside the arrangement of the eight cylindrical substrates 4206 comprises a body comprising a columnar electrode-coupling inbetween portion 4203 made of boron nitride and having a diameter of 10 mm and a thickness of 4 mm interposed between two columnar electrode conductors 4202 made of titanium and having a diameter of 10 mm, and said body being provided with a dielectric cover (not shown) made of alumina ceramics and having an outer diameter of 15 mm and an inner diameter of 11 mm so as to cover the exterior thereof.

Each of the raw material gas supply means 4214 in the foregoing plasma CVD apparatus comprises a raw material gas supply pipe made of alumina and having a closed end and which is 6 mm in inner diameter and 8 mm in outer diameter and is provided with twelve gas release nozzles of 0.8 mm in diameter which are spacedly arranged at an equal interval so as to face the high frequency power introduction means positioned in the film-forming space 4215.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 30.

As Table 30 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

Comparative Example 5

Figure 27A:
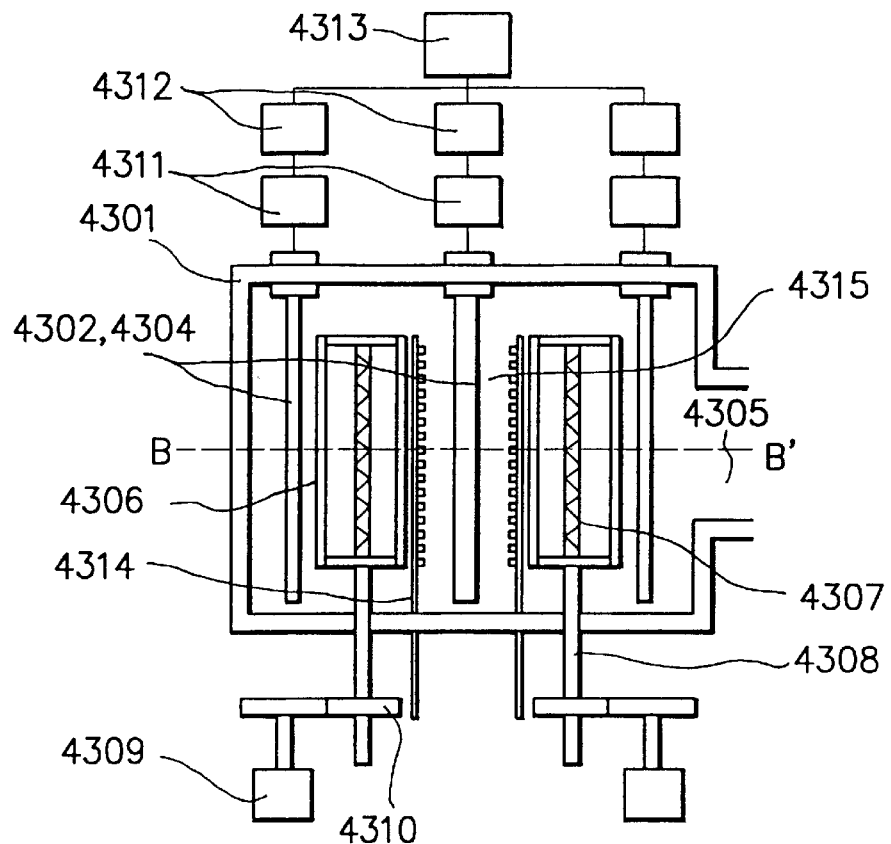
Figure 27B:
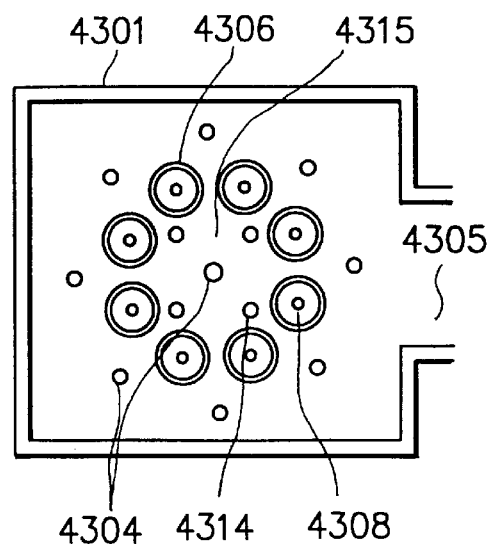

Using a plasma CVD apparatus shown in FIGS. 27(A) and 27(B), a three-layered light receiving layer comprising a charge injection inhibition layer, a photoconductive layer and a surface layer on eight cylindrical aluminum substrates of 30 mm in outer diameter and 358 mm in length under the conditions shown in Table 29, whereby eight a-Si light receiving members were produced. This procedure was repeated ten times.

In FIGS. 27(A) and 27(B), reference numeral 4301 indicates a reaction chamber, reference numeral 4302 a high frequency electrode conductor, reference numeral 4304 a high frequency power introduction means, reference numeral 4305 an exhaust pipe connected to an exhaustion device (not shown), reference numeral 4306 a cylindrical substrate, reference numeral 4307 a heat generating means, reference numeral 4308 a rotary shaft, reference numeral 4309 a driving motor, reference numeral 4310 a reduction gear, reference numeral 4311 a phase adjuster, reference numeral 4312 a matching box, reference numeral 4313 a high frequency power source, reference numeral 4314 a raw material gas supply means, and reference numeral 4315 a film-forming space (or a discharge space.

In this comparative example, the oscillation frequence of the high frequency power source 4313 was made to be 20 MHz.

For the high frequency power introduction means 4304, one high frequency power introduction means is arranged in the film-forming space 4315 circumscribed by the eight cylindrical substrates 4306 (which are concentrically and spacedly arranged so as to circumscribe the film-forming space 4315) and eight high frequency power introduction means are arranged outside the arrangement of the eight cylindrical substrates 4306 as shown FIG. 27(B).

The one high frequency power introduction means 4304 arranged in the film-forming space 4315 comprises a single columnar high frequency electrode 4302 made of titanium and having a diameter of 15 mm which is provided with a dielectric cover (not shown) made of alumina ceramics and having an outer diameter of 22 mm and an inner diameter of 16 mm so as to cover the exterior thereof.

Each of the eight high frequency power introduction means 4304 arranged outside the arrangement of the eight cylindrical substrates 4306 comprises a single columnar high frequency electrode 4302 made of titanium and having a diameter of 10 mm which is provided with a dielectric cover (not shown) made of alumina ceramics and having an outer diameter of 15 mm and an inner diameter of 11 mm so as to cover the exterior thereof.

Each of the raw material gas supply means 4314 in the foregoing plasma CVD apparatus comprises a raw material gas supply pipe made of alumina and having a closed end and which is 6 mm in inner diameter and 8 mm in outer diameter and is provided with twelve gas release nozzles of 0.8 mm in diameter which are spacedly arranged at an equal interval so as to face the high frequency power introduction means positioned in the film-forming space 4315.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 30.

Based on the results shown in Table 30, it is understood that there is a distinguishable difference between Example 17 and Comparative Example 5 with respect to all the evaluation items. Particularly, with respect to the evaluation item (d) of the unevenness, it is understood that there is a distinct difference between Example 17 and Comparative Example 5.

EXAMPLE 18

Figure 28A:
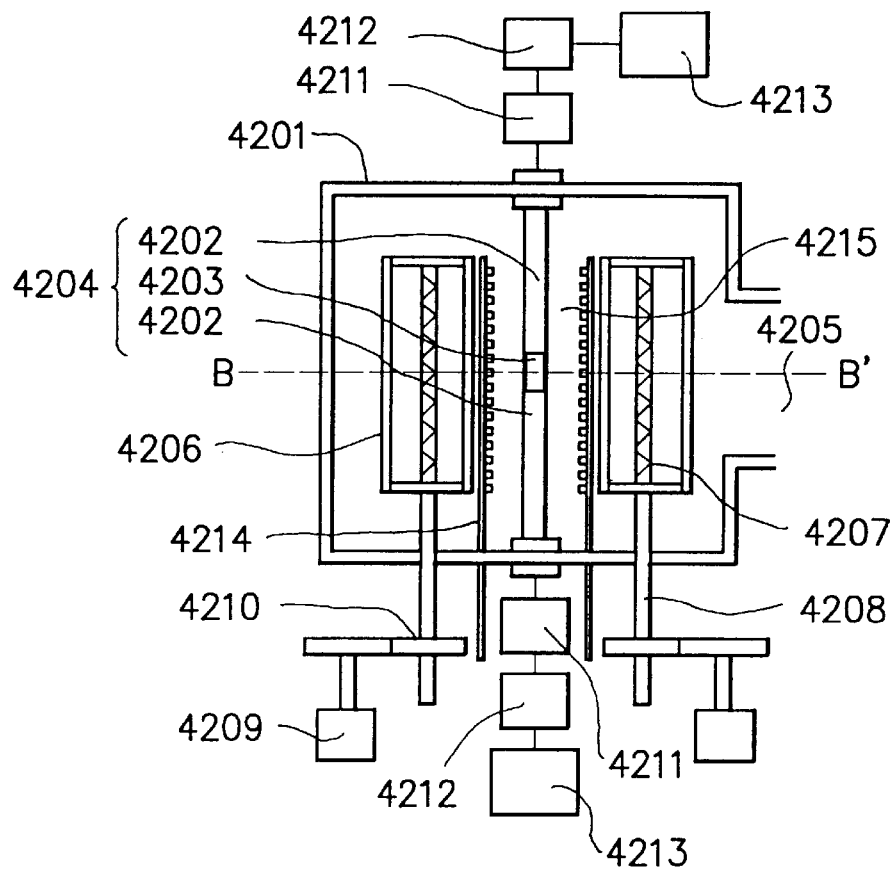
Figure 28B:
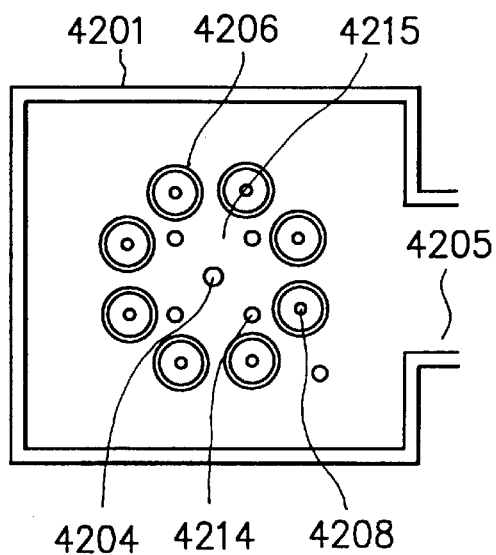

Using a plasma CVD apparatus shown in FIGS. 28(A) and 28(B), a three-layered light receiving layer comprising a charge transportation layer, a charge generation layer, and a surface layer on eight cylindrical aluminum substrates of 80 mm in outer diameter and 358 mm in length under the conditions shown in Table 31, whereby eight function division type a-Si light receiving members were produced. This procedure was repeated ten times.

In FIGS. 28(A) and 28(B), reference numeral 4201 indicates a reaction chamber, reference numeral 4202 a high frequency electrode conductor, reference numeral 4203 an electrode-coupling inbetween portion, reference numeral 4204 a high frequency power introduction means, reference numeral 4205 an exhaust pipe connected to an exhaustion device (not shown), reference numeral 4206 a cylindrical substrate, reference numeral 4207 a heat generating means, reference numeral 4208 a rotary shaft, reference numeral 4209 a driving motor, reference numeral 4210 a reduction gear, reference numeral 4211 a phase adjuster, reference numeral 4212 a matching box, reference numeral 4213 a high frequency power source, reference numeral 4214 a raw material gas supply means, and reference numeral 4215 a film-forming space (or a discharge space.

In this example, the oscillation frequence of the high frequency power source 4213 was made to be 20 MHz.

The high frequency power introduction means 4204 comprises a body comprising a columnar electrode-coupling inbetween portion 4203 made of aluminum nitride and having a diameter of 30 mm and a thickness of 10 mm interposed between two columnar electrode conductors 4202 made of SUS304 and having a diameter of 30 mm, and said body being provided with a dielectric cover (not shown) made of alumina and having an outer diameter of 38 mm and an inner diameter of 32 mm so as to cover the exterior thereof.

Each of the raw material gas supply means 4214 in the foregoing plasma CVD apparatus comprises a raw material gas supply pipe made of alumina and having a closed end and which is 10 mm in inner diameter and 12 mm in outer diameter and is provided with 10 gas release nozzles of 0.8 mm in diameter which are spacedly arranged at an equal interval so as to face the high frequency power introduction means positioned in the film-forming space 4215.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 32.

As Table 32 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

Comparative Example 6

The procedures of Example 18 were repeated, except that the columnar electrode-coupling inbetween portion 4203 in the high frequency power introduction means 4204 in Example 18 was replaced by a columnar member made of SUS304 having a diameter of 30 mm and a thickness of 10 mm, to form a three-layered light receiving layer comprising a charge transportation layer, a charge generation layer, and a surface layer on eight cylindrical aluminum substrates of 80 mm in outer diameter and 358 mm in length under the conditions shown in Table 31, whereby eight function division type a-Si light receiving members were produced. This procedure was repeated ten times.

The columnar member made of SUS304 herein is contacted with the opposite electrode conductors 4202 such that the columnar member has continuity with the opposite electrode conductors. Particularly, the high frequency power introduction means comprises a substantially single high frequency electrode.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 32.

Based on the results shown in Table 32, it is understood that there is a distinguishable difference between Example 18 and Comparative Example 6 with respect to all the evaluation items. Particularly, with respect to the evaluation item (d) of the unevenness, it is understood that there is a distinct difference between Example 18 and Comparative Example 6.

EXAMPLE 19

Figure 29A:
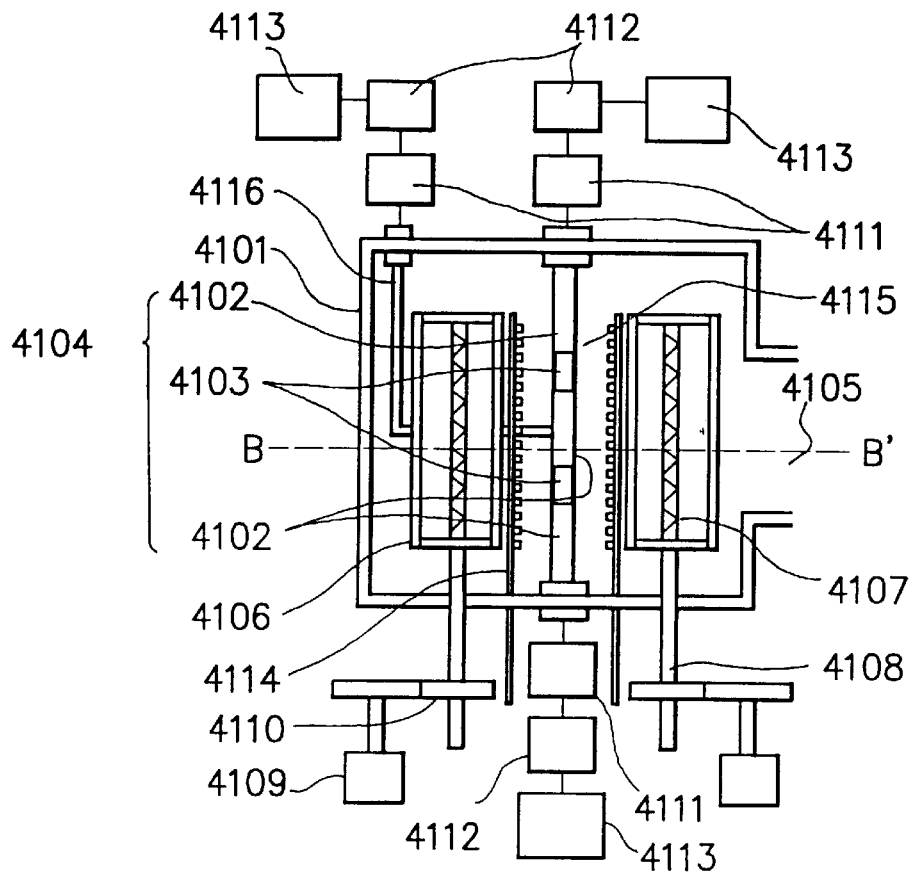
Figure 29B:
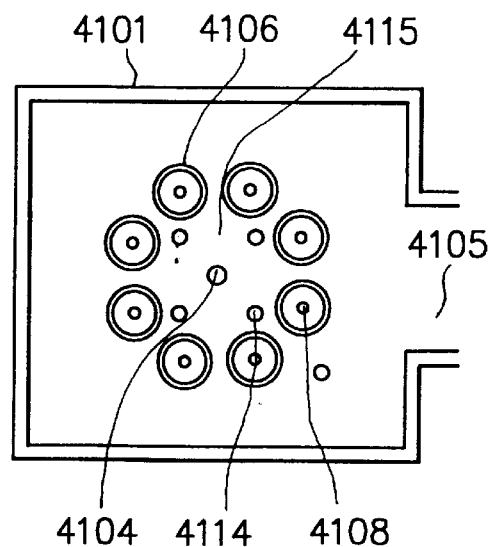

Using a plasma CVD apparatus shown in FIGS. 29(A) and 29(B), a three-layered light receiving layer comprising a charge injection inhibition layer, a photoconductive layer, and a surface layer on eight cylindrical aluminum substrates of 80 mm in outer diameter and 358 mm in length under the conditions shown in Table 33, whereby eight a-Si light receiving members were produced. This procedure was repeated ten times.

In FIGS. 29(A) and 29(B), reference numeral 4101 indicates a reaction chamber, reference numeral 4102 a high frequency electrode conductor, reference numeral 4103 an electrode-coupling inbetween portion, reference numeral 4104 a high frequency power introduction means, reference numeral 4105 an exhaust pipe connected to an exhaustion device (not shown), reference numeral 4106 a cylindrical substrate, reference numeral 4107 a heat generating means, reference numeral 4108 a rotary shaft, reference numeral 4109 a driving motor, reference numeral 4110 a reduction gear, reference numeral 4111 a phase adjuster, reference numeral 4112 a matching box, reference numeral 4113 a high frequency power source, reference numeral 4114 a raw material gas supply means, and reference numeral 4115 a film-forming space (or a discharge space.

In this example, the oscillation frequence of the high frequency power source 4113 was made to be 450 MHz.

The high frequency power introduction means 4104 comprises a body comprising three columnar electrode conductors 4102 made of SUS304 having a diameter of 10 mm and two columnar electrode-coupling inbetween portions 4103 made of silicon nitride having a diameter of 10 mm and a thickness of 20 mm each being interposed between each pair of the columnar electrode conductors 4102 so as to capacitively couple between the two columnar electrode conductors.

Each of the raw material gas supply means 4114 in the foregoing plasma CVD apparatus comprises a raw material gas supply pipe made of alumina having a closed end and which is 8 mm in inner diameter and 10 mm in outer diameter and is provided with 14 gas release nozzles of 0.8 mm in diameter which are spacedly arranged at an equal interval so as to face the high frequency power introduction means positioned in the film-forming space 4115.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 34.

As Table 34 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

Comparative Example 7

The procedures of Example 19 were repeated, except that the two columnar electrode-coupling inbetween portion 4103 in the high frequency power introduction means 4204 in Example 19 were omitted into a single electrode conductor, to form a three-layered light receiving layer comprising a charge injection inhibition layer, a photoconductive layer and a surface layer on eight cylindrical aluminum substrates of 80 mm in outer diameter and 358 mm in length under the conditions shown in Table 33, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 34.

Based on the results shown in Table 34, it is understood that there is a distinguishable difference between Example 18 and Comparative Example 6 with respect to all the evaluation items. The reason of this situation is due to the fact that in the case of Comparative Example 7, discharge discontinuance or/and abnormal discharge had been occurred during the film formation.

EXAMPLE 20

The procedures of Example 16 using the plasma CVD apparatus shown in FIGS. 9(A) and 9(B) were repeated, except that the constituent material (alumina) of the columnar electrode-coupling inbetween portion 2108 was changed to beryllia ceramics, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 21

The procedures of Example 16 using the plasma CVD apparatus shown in FIGS. 9(A) and 9(B) were repeated, except that the constituent material (alumina) of the columnar electrode-coupling inbetween portion 2108 was changed to magnesia, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 22

The procedures of Example 16 using the plasma CVD apparatus shown in FIGS. 9(A) and 9(B) were repeated, except that the constituent material (alumina) of the columnar electrode-coupling inbetween portion 2108 was changed to steatite, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 23

The procedures of Example 16 using the plasma CVD apparatus shown in FIGS. 9(A) and 9(B) were repeated, except that the constituent material (alumina) of the columnar electrode-coupling inbetween portion 2108 was changed to zircon, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 24

The procedures of Example 16 using the plasma CVD apparatus shown in FIGS. 9(A) and 9(B) were repeated, except that the constituent material (alumina) of the columnar electrode-coupling inbetween portion 2108 was changed to cordierite, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 25

The procedures of Example 16 using the plasma CVD apparatus shown in FIGS. 9(A) and 9(B) were repeated, except that the constituent material (alumina) of the columnar electrode-coupling inbetween portion 2108 was changed to zircon-cordierite, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 26

The procedures of Example 16 using the plasma CVD apparatus shown in FIGS. 9(A) and 9(B) were repeated, except that the constituent material (alumina) of the columnar electrode-coupling inbetween portion 2108 was changed to mica ceramics (trademark name: MCERITE SP, produced by Mitsui Kohzan Material Kabushiki Kaisha), to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

EXAMPLE 27

The procedures of Example 16 using the plasma CVD apparatus shown in FIGS. 9(A) and 9(B) were repeated, except that the columnar electrode-coupling inbetween portion 2108 was changed to a columnar member of 20 mm in diameter and 8 mm in thickness obtained by contacting (i) a columnar member made of alumina having a diameter of 20 mm and a thickness of 4 mm and (ii) a columnar member made of boron nitride having a diameter of 20 mm and a thickness of 4 mm, to form a three-layered light receiving layer comprising a charge injection inhibition layer, a photoconductive layer and a surface layer on eight cylindrical aluminum substrates of 30 mm in outer diameter and 358 mm in length under the conditions shown in Table 27, whereby eight a-Si light receiving members were produced. This procedure was repeated ten times.

For the resultant a-Si light receiving members, evaluation was conducted with respect to (a) charge retentivity, (b) photosensitivity, (c) photomemory, (d) unevennesses, (e) stability in characteristics, and (f) image quality, in the same manner as in Example 16.

The evaluated results obtained are collectively shown in Table 35.

As Table 35 illustrates, it is understood that the light receiving members produced in this example are good enough for the all the evaluation items. Hence, it is understood that the present invention enables to mass produce an a-Si series light receiving member whose entire region being excelling in electrophotographic characteristics including charge retentivity, photosensitivity, photomemory and the like.

As apparent from the above description, the present invention provides various advantages as will be described below.

According to the present invention, a high quality deposited film having a extremely uniform thickness and homogeneous film property can be desirably formed on any large area substrates having varios configurations such as cylindrical substrates, plate-like substrates, and sheet-like substrates at an improved deposition rate. Hence, it is possible to efficiently produce high quality large area semiconductor devices.

According to the present invention, it is possible to realize a plasma CVD apparatus and a plasma processing methode by plasma CVD which enable to stably mass-produce a large area deposited film excelling, particularly, in electrophotographic characteristics.

According to the present invention, even in the case of increasing the number of light receiving member in one batch aiming in order to raise the mass production efficiency, the stability of plasma is not deteriorated. And in this case, even when the film-forming conditions are varied, it is possible to prevent the uniformity of plasma from reducing. Particularly, the present invention enables to efficiently mass-produce a high quality electrophotographic light receiving member which stably and continuously exhibits satisfactory electrophotographic characteristics without being deteriorated even upon the repeated use over a long period of time, particularly which desirably prevents occurrance of problems relating ghost, blank exposure memory, charge retentivity unevenness, photosensitivity unevenness, and the like, wherein occurrence of defective images such as white dot, black dot, fogging, and the like is desirably prevented.

According to the present invention, by using a high frequency power introduction means having a configuration in that a dielectric body is interposed between a pair of electrode conductors as the high frequency power introduction means for supplying a high frequency power of the VHF band, it is possible to effectively depress occurrence of discharge disciontinuance and abnormal discharge, where a high quality deposited film having a extremely uniform thickness and homogeneous film property can be desirably formed on any large area substrates.

Hence, according to the present invention, it is possible to realize a plasma CVD apparatus and a plasma processing methode by plasma CVD which enable to stably mass-produce a large area a-Si series electrophotographic light receiving member whose entire region being excelling in electrophotographic characteristics.

TABLE 1 (A)

(Pressure condition: 50 mTorr)

| Power source frequency | Photosensitivity measurement position |
|---|---|
| | Upper side — Center portion → Lower side |
| | (high frequency introduction side) |
| 13.56 MHz | Δ ○ Δ ○ ○ Δ ○ ○ ○ ○ ○ Δ Δ ○ ○ Δ ○ Δ |
| 30 MHz | ○ Δ X X Δ ○ ○ Δ Δ ○ Δ ○ Δ ○ ○ Δ ○ Δ |
| 60 MHz | ○ ○ Δ X X X Δ ○ ○ ○ ○ ○ ○ ○ ○ ○ ○ ○ |
| 100 MHz | ○ ○ ○ ○ ○ Δ X X X X ○ ○ ○ ○ ○ ○ ○ ○ |
| 200 MHz | ○ ○ ○ ○ ○ ○ ○ ○ X X X X Δ ○ ○ ○ ○ ○ |
| 300 MHz | ○ ○ ○ ○ ○ ○ ○ ○ ○ X X X X Δ ○ ○ ○ ○ |
| 400 MHz | Δ Δ X X Δ Δ Δ Δ Δ Δ Δ X X X Δ Δ Δ Δ |

TABLE 1 (A)-continued (Pressure condition: 50 mTorr)

| Power source frequency | Upper side | ← Center portion → | Lower side |
|---|---|---|---|
| | (high frequency introduction side) | | |

```
500 MHz   Δ  Δ  Δ  X  X  X  Δ  Δ  Δ  Δ  Δ  Δ  X  X  X  Δ  Δ  Δ
600 MHz   Δ  X  Δ  Δ  Δ  X  X  X  Δ  Δ  Δ  Δ  Δ  X  X  X  Δ  Δ
650 MHz   Since discharge became intermittently discontinuous, film formation evaluation could
          not be carried out.
```

TABLE 1 (B)

(Pressure condition: 25 mTorr)

| Power source frequency | Upper side | ← Center portion → | Lower side |
|---|---|---|---|
| | (high frequency introduction side) | | |

```
13.56 MHz  Since discharge was not generated, film formation evaluation could not be carried out.
30 MHz     Δ  Δ  X  X  X  Δ  Δ  Δ  Δ  Δ  Δ  Δ  Δ  Δ  Δ  Δ  Δ
60 MHz     ○  ○  Δ  X  X  X  Δ  ○  ○  ○  ○  ○  ○  ○  ○  ○  ○
100 MHz    ○  ○  ○  ○  Δ  Δ  X  X  X  X  Δ  ○  ○  ○  ○  ○  ○
200 MHz    ○  ○  ○  ○  ○  ○  Δ  X  X  X  X  Δ  ○  ○  ○  ○  ○
300 MHz    ○  ○  ○  ○  ○  ○  ○  ○  Δ  X  X  X  X  Δ  ○  ○  ○
400 MHz    ○  ○  Δ  X  X  Δ  ○  ○  ○  ○  Δ  X  X  X  Δ  ○  ○
500 MHz    ○  ○  Δ  Δ  X  X  Δ  ○  ○  ○  ○  ○  X  X  X  ○  ○  ○
600 MHz    ○  X  Δ  ○  ○  Δ  X  X  X  Δ  ○  ○  ○  X  X  X  Δ  ○
650 MHz    Since discharge became intermittently discontinuous, film formation evaluation could
           not be carried out.
```

TABLE 1 (C)

(Pressure condition: 5 mTorr)

| Power source frequency | Upper side | ← Center portion → | Lower side |
|---|---|---|---|
| | (high frequency introduction side) | | |

```
13.56 MHz  Since discharge was not generated, film formation evaluation could not be carried out.
30 MHz     Since discharge was not generated, film formation evaluation could not be carried out.
60 MHz     ◎  ◎  ○  X  X  X  ○  ◎  ◎  ◎  ◎  ◎  ◎  ◎  ◎  ◎  ◎  ◎
100 MHz    ◎  ◎  ◎  ○  Δ  X  X  X  X  Δ  ○  ◎  ◎  ◎  ◎  ◎  ◎  ◎
200 MHz    ◎  ◎  ◎  ◎  ◎  ◎  Δ  X  X  X  X  ○  ◎  ◎  ◎  ◎  ◎  ◎
300 MHz    ◎  ◎  ◎  ◎  ◎  ◎  ◎  ◎  ○  Δ  X  X  X  Δ  ◎  ◎  ◎  ◎
400 MHz    ○  ○  Δ  X  X  Δ  ○  ○  ○  ○  ○  X  X  X  Δ  Δ  ○  ○
500 MHz    ○  ○  Δ  Δ  X  X  Δ  ○  ○  ○  ○  ○  X  X  X  Δ  ○  ○
600 MHz    ○  X  X  ○  ○  Δ  X  X  X  Δ  ○  ○  ○  X  X  X  Δ  ○
650 MHz    Since discharge became intermittently discontinuous, film formation evaluation could
           not be carried out.
```

TABLE 2 (A)

(Pressure condition: 50 mTorr)

| Power source frequency | Average deposition rate (nm/s) | Distribution of deposition rate (%) |
|---|---|---|
| 13.56 MHz | 0.15 | 10 |
| 30 MHz | 0.5 | 20 |
| 60 MHz | 1.1 | 21 |
| 100 MHz | 1.6 | 25 |
| 200 MHz | 1.8 | 28 |
| 300 MHz | 1.5 | 28 |
| 400 MHz | 0.8 | 35 |
| 500 MHz | 0.7 | 38 |
| 600 MHz | 0.6 | 40 |
| 650 MHz | Since discharge became intermittently discontinuous, film formation evaluation could not be carried out. | |

TABLE 2 (B)

(Pressure condition: 25 mTorr)

| Power source frequency | Average deposition rate (nm/s) | Distribution of deposition rate (%) |
|---|---|---|
| 13.56 MHz | Since discharge was not generated, film formation evaluation could not be carried out. | |
| 30 MHz | 0.4 | 21 |
| 60 MHz | 1.1 | 20 |
| 100 MHz | 1.7 | 22 |
| 200 MHz | 1.9 | 26 |
| 300 MHz | 1.4 | 26 |
| 400 MHz | 0.9 | 30 |
| 500 MHz | 0.7 | 34 |
| 600 MHz | 0.6 | 35 |
| 650 MHz | Since discharge became intermittently discontinuous, film formation evaluation could not be carried out. | |

TABLE 2 (C)

(Pressure condition: 5 mTorr)

| Power source frequency | Average deposition rate (nm/s) | Distribution of deposition rate (%) |
|---|---|---|
| 13.56 MHz | Since discharge was not generated, film formation evaluation could not be carried out. | |
| 30 MHz | Since discharge was not generated, film formation evaluation could not be carried out. | |
| 60 MHz | 1.0 | 20 |
| 100 MHz | 1.5 | 25 |
| 200 MHz | 1.7 | 28 |
| 300 MHz | 1.3 | 30 |
| 400 MHz | 0.6 | 38 |
| 500 MHz | 0.6 | 40 |
| 600 MHz | 0.5 | 44 |
| 650 MHz | Since discharge became intermittently discontinuous, film formation evaluation could not be carried out. | |

TABLE 3

| | |
|---|---|
| SiH$_4$ flow rate (sccm) | 50 |
| inner pressure (mTorr) | 3 |
| substrate temperature (° C.) | 200 |
| high frequency (MHz) (oscillation frequency) | 105 |
| high frequency power (W) | 2000 |

TABLE 4

| electrode No. | length of SUS portion (one side) (mm) | length of Ni portion (mm) | unevenness in plasma potential (%) |
|---|---|---|---|
| Ref | 500 | 0 | 120 |
| 1 | 249.975 | 0.05 | 80 |
| 2 | 249.95 | 0.1 | 50 |
| 3 | 249.9 | 0.2 | 45 |
| 4 | 249.85 | 0.3 | 40 |
| 5 | 249.5 | 1 | 38 |
| 6 | 245 | 10 | 35 |
| 7 | 175 | 150 | 37 |
| 8 | 150 | 200 | 42 |
| 9 | 100 | 300 | 49 |
| 10 | 50 | 400 | 65 |

Note: The cathode electrode is of the type shown in FIG. 5(a) in which the 1102 portion is SUS304, the 1103 portion is Ni, diameter = 20 mm, total length = 500 mm, and the two SUS portions are of the same length.

TABLE 5

| electrode No. | length of SUS portion (one side) (mm) | length of Ni portion (mm) | unevenness in plasma potential (%) |
|---|---|---|---|
| 11 | 5 | 5 | 45 |
| 12 | 5 | 10 | 40 |
| 13 | 5 | 20 | 39 |
| 14 | 8 | 5 | 38 |
| 15 | 8 | 8 | 40 |
| 16 | 8 | 10 | 37 |
| 17 | 10 | 5 | 37 |
| 18 | 10 | 10 | 39 |
| 19 | 10 | 20 | 38 |
| 20 | 20 | 5 | 37 |
| 21 | 20 | 10 | 33 |
| 22 | 20 | 50 | 40 |
| 23 | 50 | 20 | 40 |
| 24 | 50 | 50 | 42 |
| 25 | 50 | 80 | 41 |
| 26 | 80 | 20 | 49 |
| 27 | 80 | 50 | 45 |
| 28 | 80 | 80 | 45 |

Note: The cathode electrode is of the type shown in FIG. 5(h) in which the 1102 portion is SUS304, the 1103 portion is Ni, total length = 500 mm, SUS portion (one side) = 245 mm, and Ni portion = 10 mm.

TABLE 6

| electrode No. | 102 (103) portion | 103 (102) portion |
|---|---|---|
| 29 | SUS304 | Fe |
| 30 | SUS304 | SUS316 |
| 31 | SUS304 | Ti |
| 32 | Ti | Fe |
| 33 | Ti | Ni |
| 34 | Ti | SUS316 |
| 35 | SUS316 | Fe |
| 36 | SUS316 | Ni |
| 37 | Fe | Ni |

Note: The indication in the parentheses means a combination in which the 102 or 103 material is replaced by the 103 or 102 material.

TABLE 7

| electrode No. | length of SUS portion (one side) (mm) | length of Al$_2$O$_3$ portion (mm) | unevenness in plasma potential (%) |
|---|---|---|---|
| 38 | 249.975 | 0.05 | 80 |
| 39 | 249.95 | 0.1 | 49 |
| 40 | 249.9 | 0.2 | 43 |
| 41 | 249.85 | 0.3 | 40 |
| 42 | 249.5 | 1 | 33 |
| 43 | 247.5 | 5 | 35 |
| 44 | 245 | 10 | 38 |
| 45 | 240 | 20 | 39 |
| 46 | 235 | 30 | 42 |
| 47 | 225 | 50 | 47 |
| 48 | 210 | 80 | 69 |

Note: The cathode electrode is of the type shown in FIG. 5(a) in which the 1102 portion is SUS304, the 1103 portion is Al$_2$O$_3$, diameter = 20 mm, total length = 500 mm, and the two SUS portions are of the same length.

TABLE 8

| | |
|---|---|
| SiH$_4$ flow rate (sccm) | 500 |
| inner pressure (mTorr) | 15 |
| substrate temperature (° C.) | 200 |
| high frequency (MHz) (oscillation frequency) | 105 |
| high frequency power (W) | 2000 |

TABLE 9

| ten-points average surface roughness of the surface of the cathode electrode | evaluation |
| --- | --- |
| 0.1 μm or less | x |
| 0.5 μm | x |
| 1.0 μm | Δ |
| 3.0 μm | ○ |
| 5.0 μm | ⊙ |
| 10 μm | ⊙ |
| 20 μm | ⊙ |
| 30 μm | ⊙ |
| 50 μm | ⊙ |
| 100 μm | ⊙ |
| 1000 μm | ⊙ |
| 1 mm | ⊙ |
| 3 mm | ⊙ |
| 5 mm | ⊙ |
| 10 mm | ○ |
| 20 mm | Δ |
| 30 mm | x |
| 50 mm | x |

TABLE 10

| | charge injection inhibition layer | photoconductive layer | surface layer |
| --- | --- | --- | --- |
| gas used and its flow rate | | | |
| $SiH_4$ [SCCM] | 400 | 400 | 20 |
| $H_2$ [SCCM] | 400 | 800 | |
| $B_2H_6$ [ppm] (against $SiH_4$) | 1000 | 0.5 | |
| NO [SCCM] | 10 | | |
| $CH_4$ [SCCM] | | | 1000 |
| substrate temperature [° C.] | 240 | 240 | 240 |
| inner pressure [mTorr] | 15 | 20 | 30 |
| power [W] | 1000 | 1000 | 1500 |
| film thickness [μm] | 3 | 30 | 0.5 |

TABLE 11

| | |
| --- | --- |
| high frequency power | 1 KW |
| $SiH_4$ | 500 sccm |
| film formation pressure | 50 mTorr, 25 mTorr, 5 mTorr |
| substrate temperature | 250° C. |

TABLE 12 (A)

(Pressure condition: 50 mTorr)

| Power source frequency | Photosensitivity measurement position |
| --- | --- |
| | Upper side ← Center portion → Lower side |
| | (high frequency introduction side) |

| Frequency | | | | | | | | | | | | | | | | |
| --- | --- | --- | --- | --- | --- | --- | --- | --- | --- | --- | --- | --- | --- | --- | --- | --- |
| 30 MHz | Δ | ○ | Δ | ○ | ○ | Δ | Δ | Δ | ○ | Δ | Δ | ○ | Δ | Δ | ○ | ○ |
| 60 MHz | ○ | ○ | ○ | ○ | ○ | Δ | ○ | ○ | ○ | ○ | ○ | ○ | ○ | ○ | ○ | ○ |
| 100 MHz | ○ | ○ | ○ | ○ | ○ | ○ | ○ | ○ | ○ | ○ | ○ | ○ | ○ | ○ | ○ | ○ |
| 200 MHz | ○ | ○ | ○ | ○ | ○ | ○ | ○ | ○ | ○ | ○ | ○ | ○ | ○ | ○ | ○ | ○ |
| 300 MHz | ○ | ○ | ○ | ○ | ○ | ○ | ○ | ○ | ○ | ○ | ○ | ○ | ○ | ○ | ○ | ○ |
| 400 MHz | Δ | Δ | Δ | Δ | Δ | Δ | Δ | Δ | Δ | Δ | Δ | Δ | Δ | Δ | Δ | Δ |
| 500 MHz | Δ | Δ | Δ | Δ | Δ | Δ | Δ | Δ | Δ | Δ | Δ | Δ | Δ | Δ | Δ | Δ |
| 600 MHz | Δ | Δ | Δ | Δ | Δ | Δ | Δ | Δ | Δ | Δ | Δ | Δ | Δ | Δ | Δ | Δ |

TABLE 12 (B)

(Pressure condition: 25 mTorr)

| Power source frequency | Photosensitivity measurement position |
| --- | --- |
| | Upper side ← Center portion → Lower side |
| | (high frequency introduction side) |

| Frequency | | | | | | | | | | | | | | | | |
| --- | --- | --- | --- | --- | --- | --- | --- | --- | --- | --- | --- | --- | --- | --- | --- | --- |
| 30 MHz | ○ | ○ | ○ | ○ | ○ | ○ | ○ | ○ | ○ | ○ | ○ | ○ | ○ | ○ | ○ | ○ |
| 60 MHz | ○ | ○ | ○ | ○ | ○ | ○ | ○ | ○ | ○ | ○ | ○ | ○ | ○ | ○ | ○ | ○ |
| 100 MHz | ○ | ○ | ○ | ○ | ○ | ○ | ○ | ○ | ○ | ○ | ○ | ○ | ○ | ○ | ○ | ○ |
| 200 MHz | ○ | ○ | ○ | ○ | ○ | ○ | ○ | ○ | ○ | ○ | ○ | ○ | ○ | ○ | ○ | ○ |
| 300 MHz | ○ | ○ | ○ | ○ | ○ | ○ | ○ | ○ | ○ | ○ | ○ | ○ | ○ | ○ | ○ | ○ |
| 400 MHz | ○ | ○ | ○ | ○ | ○ | ○ | ○ | ○ | ○ | ○ | ○ | ○ | ○ | ○ | ○ | ○ |
| 500 MHz | ○ | ○ | ○ | ○ | ○ | ○ | ○ | ○ | ○ | ○ | ○ | ○ | ○ | ○ | ○ | ○ |
| 600 MHz | ○ | ○ | ○ | ○ | ○ | ○ | ○ | ○ | ○ | ○ | ○ | ○ | ○ | ○ | ○ | ○ |

TABLE 12 (C)

(Pressure condition: 5 mTorr)

| Power source frequency | Photosensitivity measurement position |
|---|---|
| | Upper side ← Center portion → Lower side (high frequency introduction side) |
| 30 MHz | Since discharge was not generated, film formation evaluation could not be carried out. |
| 60 MHz | ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ |
| 100 MHz | ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ |
| 200 MHz | ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ |
| 300 MHz | ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ ⊚ |
| 400 MHz | ○ ○ ○ ○ ○ ○ ○ ○ ○ ○ ○ ○ ○ ○ ○ ○ ○ ○ ○ ○ |
| 500 MHz | ○ ○ ○ ○ ○ ○ ○ ○ ○ ○ ○ ○ ○ ○ ○ ○ ○ ○ ○ ○ |
| 600 MHz | ○ ○ ○ ○ ○ ○ ○ ○ ○ ○ ○ ○ ○ ○ ○ ○ ○ ○ ○ ○ |

TABLE 13 (A)

(Pressure condition: 50 mTorr)

| Power source frequency | Average deposition rate (nm/s) | Distribution of deposition rate (%) |
|---|---|---|
| 30 MHz | 0.5 | 6 |
| 60 MHz | 1.0 | 6 |
| 100 MHz | 1.6 | 5 |
| 200 MHz | 1.8 | 5 |
| 300 MHz | 1.6 | 4 |
| 400 MHz | 0.7 | 6 |
| 500 MHz | 0.7 | 7 |
| 600 MHz | 0.6 | 8 |

TABLE 13 (B)

(Pressure condition: 25 mTorr)

| Power source frequency | Average deposition rate (nm/s) | Distribution of deposition rate (%) |
|---|---|---|
| 30 MHz | 0.5 | 6 |
| 60 MHz | 0.9 | 5 |
| 100 MHz | 1.7 | 4 |
| 200 MHz | 2.0 | 4 |
| 300 MHz | 1.5 | 4 |
| 400 MHz | 0.7 | 6 |
| 500 MHz | 0.7 | 7 |
| 600 MHz | 0.6 | 7 |

TABLE 13 (C)

(Pressure condition: 5 mTorr)

| Power source frequency | Average deposition rate (nm/s) | Distribution of deposition rate (%) |
|---|---|---|
| 30 MHz | Since discharge was not generated, film formation evaluation could not be carried out. | |
| 60 MHz | 0.8 | 4 |
| 100 MHz | 1.6 | 4 |
| 200 MHz | 1.7 | 4 |
| 300 MHz | 1.4 | 4 |
| 400 MHz | 0.7 | 6 |
| 500 MHz | 0.6 | 7 |
| 600 MHz | 0.5 | 7 |

TABLE 14

| | | |
|---|---|---|
| surface protecting layer | $SiH_4$ | 100 sccm |
| | $H_2$ | 100 sccm |
| | $CH_4$ | 500 sccm |
| | power introduced | 800 W |
| | reaction pressure | 5 mTorr |
| | film thickness | 1 μm |
| photoconductive layer | $SiH_4$ | 400 sccm |
| | $H_2$ | 400 sccm |
| | power introduced | 1000 W |
| | reaction pressure | 5 mTorr |
| | film thickness | 25 μm |
| charge injection inhibition layer | $SiH_4$ | 400 sccm |
| | $H_2$ | 400 sccm |
| | NO | 500 sccm |
| | $B_2H_6$ | 2000 ppm |
| | power introduced | 800 W |
| | reaction pressure | 5 mTorr |
| | film thickness | 1 μm |

TABLE 15

| | |
|---|---|
| high frequency power | 800 W per cathode electrode |
| $SiH_4$ | 1500 sccm |
| film formation pressure | 8 mTorr |
| substrate temperature | 200° C. |

TABLE 16

| | | |
|---|---|---|
| surface protecting layer | $SiH_4$ | 300 sccm |
| | $H_2$ | 300 sccm |
| | $CH_4$ | 1500 sccm |
| | power introduced | 500 W per cathode electrode |
| | reaction pressure | 5 mTorr |
| | film thickness | 1 μm |
| photoconductive layer | $SiH_4$ | 1500 sccm |
| | $H_2$ | 1500 sccm |
| | power introduced | 800 W per cathode electrode |
| | reaction pressure | 5 mTorr |
| | film thickness | 25 μm |
| charge injection inhibition layer | $SiH_4$ | 1000 sccm |
| | $H_2$ | 1000 sccm |
| | NO | 1200 sccm |
| | $B_2H_6$ | 2000 ppm |
| | power introduced | 500 W per cathode electrode |
| | reaction pressure | 5 mTorr |
| | film thickness | 1 μm |

TABLE 17

| | |
|---|---|
| high frequency power | 500 W per cathode electrode |
| SiH$_4$ | 400 sccm |
| film formation pressure | 15 mTorr |
| substrate temperature | 300° C. |

TABLE 18

| | |
|---|---|
| high frequency power | 2 KW |
| SiH$_4$ | 400 sccm |
| film formation pressure | 15 mTorr |
| substrate temperature | 300° C. |
| power source frequency | 250 MHz |

TABLE 19

| | |
|---|---|
| high frequency power | 1 KW |
| SiH$_4$ | 500 sccm |
| film formation pressure | 10 mTorr |
| substrate temperature | 250° C. |

TABLE 20

| | layer constitution | |
|---|---|---|
| film-forming condition | photoconductive layer | surface layer |
| SiH$_4$ | 70 sccm | 20 sccm |
| He | 1000 sccm | 200 sccm |
| CH$_4$ | 0 sccm | 350 sccm |
| H$_2$ | 250 sccm | 0 sccm |
| B$_2$H$_6$ | 5.0 ppm | 0 ppm |
| inner pressure | 4 mTorr | 8 mTorr |
| substrate temperature | 250° C. | 230° C. |
| high frequency (oscillation frequency) | 105 MHz | 105 MHz |
| high frequency power | 2000 W | 1500 W |
| film thickness | 25 μm | 0.5 μm |

TABLE 21

| electrode No. | ghost | blank exposure memory | unevenness in charge retentivity | unevenness in photo-sensitivity | smeared image | white dot | black dot | fogging |
|---|---|---|---|---|---|---|---|---|
| 1 | ⊙ | ○ | X | Δ | ○ | ⊙ | ⊙ | ⊙ |
| 2 | ⊙ | ⊙ | Δ | ○ | ○ | ⊙ | ⊙ | ⊙ |
| 3 | ⊙ | ⊙ | ○ | ○ | ⊙ | ⊙ | ⊙ | ⊙ |
| 4 | ⊙ | ⊙ | ○ | ⊙ | ⊙ | ⊙ | ⊙ | ⊙ |
| 5 | ⊙ | ⊙ | ⊙ | ⊙ | ⊙ | ⊙ | ⊙ | ⊙ |
| 6 | ⊙ | ⊙ | ⊙ | ⊙ | ⊙ | ⊙ | ⊙ | ⊙ |
| 7 | ⊙ | ⊙ | ○ | ⊙ | ⊙ | ⊙ | ⊙ | ⊙ |
| 8 | ⊙ | ○ | ○ | ○ | ⊙ | ⊙ | ⊙ | ⊙ |
| 9 | ○ | ○ | ○ | Δ | ○ | ⊙ | ⊙ | ⊙ |
| 10 | Δ | Δ | X | X | Δ | ○ | ○ | ○ |
| Comparative Example 3 | ○ | Δ | X | X | Δ | ⊙ | ○ | ○ |

TABLE 22

| | layer constitution | | |
|---|---|---|---|
| film-forming condition | charge injection inhibition layer | photo-conductive layer | surface layer |
| SiH$_4$ | 150 sccm | 70 sccm | 20 sccm |
| He | 200 sccm | 1000 sccm | 200 sccm |
| CH$_4$ | 10 sccm | 0 sccm | 350 sccm |
| NO | 20 sccm | 0 sccm | 0 sccm |
| B$_2$H$_6$ | 1000 ppm | 1.5 ppm | 0 ppm |
| inner pressure | 10 mTorr | 4 mTorr | 8 mTorr |
| substrate temperature | 240° C. | 250° C. | 230° C. |
| high frequency (oscillation frequency) | 105 MHz | 105 MHz | 105 MHz |
| high frequency power | 900 W | 2000 W | 1500 W |
| film thickness | 3 μm | 25 μm | 0.5 μm |

TABLE 23

| | Example | | |
|---|---|---|---|
| evaluation | Example 10 | Example 11 | Example 12 |
| ghost | ⊙ | ⊙ | ⊙ |
| blank exposure memory | ⊙ | ⊙ | ⊙ |
| unevenness in charge retentivity | ⊙ | ⊙ | ⊙ |
| unevenness in photosensitivity | ⊙ | ⊙ | ⊙ |
| smeared image | ⊙ | ⊙ | ⊙ |
| white dot | ○ | ⊙ | ⊙ |
| black dot | ⊙ | ⊙ | ⊙ |
| fogging | ○ | ⊙ | ⊙ |

TABLE 24

| | layer constitution | | | |
|---|---|---|---|---|
| film-forming condition | charge injection inhibition layer | charge transpor-tation conductive layer | charge generation layer | surface layer |
| SiH$_4$ | 150 sccm | 50 sccm | 70 sccm | 20 sccm |
| He | 200 sccm | 2500 sccm | 1000 sccm | 200 sccm |
| CH$_4$ | 10 sccm | 50 sccm | 0 sccm | 450 sccm |
| NO | 20 sccm | 0 sccm | 0 sccm | 0 sccm |
| B$_2$H$_6$ | 1000 ppm | 10 ppm | 1.5 ppm | 0 ppm |
| inner pressure | 10 mTorr | 10 mTorr | 4 mTorr | 8 mTorr |

TABLE 24-continued

| | layer constitution | | | |
|---|---|---|---|---|
| film-forming condition | charge injection tation layer | charge transpor- conductive layer | charge generation layer | surface layer |
| high frequency power | 900 W | 2000 W | 2000 W | 1500 W |
| film thickness | 3 μm | 20 μm | 3 μm | 0.5 μm |

TABLE 25

| | layer constitution | | |
|---|---|---|---|
| film-forming condition | photoconductive layer region 1 | photoconductive layer region 2 | surface layer |
| $SiH_4$ | 1500→70 sccm | 70 sccm | 70→20 sccm |
| He | 1500→1000 sccm | 1000 sccm | 1000→200 sccm |
| $CH_4$ | 250→0 sccm | 0 sccm | 0→350 sccm |
| $SiF_4$ | 0 sccm | 0 sccm | 0→20 sccm |
| $B_2H_6$ | 300→1.5 ppm | 1.5 ppm | 0 ppm |
| $H_2$ | 800→0 sccm | 0 sccm | 100 sccm |
| inner pressure | 10 mTorr | 4 mTorr | 8 mTorr |
| high frequency power | 900 W | 2000 W | 1500 W |
| film thickness | 25 μm | 3 μm | 0.5 μm |

TABLE 26

| electrode No. | ghost | blank exposure memory | unevenness in charge retentivity | unevenness in photo- sensitivity | smeared image | white dot | black dot | fogging |
|---|---|---|---|---|---|---|---|---|
| 38 | ⊙ | ○ | X | Δ | ○ | ⊙ | ⊙ | ⊙ |
| 39 | ⊙ | ○ | Δ | ○ | ○ | ⊙ | ⊙ | ⊙ |
| 40 | ⊙ | ⊙ | ○ | ○ | ⊙ | ⊙ | ⊙ | ⊙ |
| 41 | ⊙ | ⊙ | ⊙ | ⊙ | ⊙ | ⊙ | ⊙ | ⊙ |
| 42 | ⊙ | ⊙ | ⊙ | ⊙ | ⊙ | ⊙ | ⊙ | ⊙ |
| 43 | ⊙ | ⊙ | ⊙ | ⊙ | ⊙ | ⊙ | ⊙ | ⊙ |
| 44 | ⊙ | ⊙ | ○ | ⊙ | ⊙ | ⊙ | ⊙ | ⊙ |
| 45 | ⊙ | ○ | ○ | ○ | ○ | ⊙ | ⊙ | ⊙ |
| 46 | ○ | Δ | Δ | Δ | ○ | ⊙ | ⊙ | ⊙ |
| 47 | Δ | Δ | X | X | Δ | ○ | ○ | ○ |
| 48 | X | Δ | X | X | Δ | Δ | ○ | ○ |

TABLE 27

| | charge injection inhibition layer | photoconductive layer | surface layer |
|---|---|---|---|
| gas used and its flow rate | | | |
| $SiH_4$ [SCCM] | 400 | 400 | 20 |
| $H_2$ [SCCM] | 600 | 1600 | |
| $B_2H_6$ [ppm] (against $SiH_4$) | 1000 | 0.5 | |
| NO [SCCM] | 10 | | |
| $CH_4$ [SCCM] | | | 1000 |
| substrate temperature [° C.] | 240 | 240 | 240 |
| inner pressure [mTorr] | 15 | 20 | 30 |
| power [W] | 1500 | 1500 | 1700 |
| film thickness [μm] | 3 | 30 | 0.5 |

TABLE 28

| | charge reten- tivity | photo- sensi- tivity | photo- memory | uneven- ness | stability in char- acteristics | image quality |
|---|---|---|---|---|---|---|
| Example 16 | ⊙ | ⊙ | ⊙ | ⊙ | ⊙ | ⊙ |
| Comparative Example 4 | ○ | ○ | ○ | ○ | Δ | ○ |

TABLE 29

| | charge injection inhibition layer | photoconductive layer | surface layer |
|---|---|---|---|
| gas used and its flow rate | | | |
| $SiH_4$ [SCCM] | 400 | 1000 | 80 |
| $H_2$ [SCCM] | 2000 | 3000 | |
| $B_2H_6$ [ppm] (against $SiH_4$) | 1000 | 1.2 | |
| NO [SCCM] | 20 | | |
| $CH_4$ [SCCM] | | | 800 |
| substrate temperature [° C.] | 240 | 240 | 240 |
| inner pressure [mTorr] | 110 | 130 | 100 |
| power [W] | 2000 | 2000 | 1600 |
| film thickness [μm] | 3 | 30 | 0.5 |

TABLE 30

|  | charge retentivity | photo-sensitivity | photo-memory | unevenness | stability in characteristics | image quality |
|---|---|---|---|---|---|---|
| Example 17 | ○~◎ | ○~◎ | ○~◎ | ○~◎ | ○~◎ | ○~◎ |
| Comparative Example 5 | ○ | ○ | ○ | Δ~○ | ○ | ○ |

TABLE 31

|  | charge injection inhibition layer | photoconductive layer | surface layer |
|---|---|---|---|
| gas used and its flow rate | | | |
| SiH₄ [SCCM] | 200 | 200 | 40 |
| H₂ [SCCM] | 500 | 500 | |
| B₂H₆ [ppm] (against SiH₄) | 10→1.5 | 1.5 | |
| SiF₄ [SCCM] | 2 | 2 | |
| CH₄ [SCCM] | 300→0 | | 500 |
| substrate temperature [° C.] | 260 | 260 | 260 |
| inner pressure [mTorr] | 16→10 | 10 | 14 |
| power [W] | 700 | 500 | 300 |
| film thickness [μm] | 25 | 3 | 0.5 |

TABLE 32

|  | charge retentivity | photo sensitivity | photo-memory | unevenness | stability in characteristics | image quality |
|---|---|---|---|---|---|---|
| Example 18 | ◎ | ◎ | ◎ | ◎ | ◎ | ◎ |
| Comparative Example 6 | ○ | ○ | Δ~○ | Δ | Δ~○ | Δ~○ |

TABLE 33

|  | charge injection inhibition layer | photoconductive layer | surface layer |
|---|---|---|---|
| gas used and its flow rate | | | |
| SiH₄ [SCCM] | 200 | 500 | 40 |
| H₂ [SCCM] | 20 | 10 | |
| B₂H₆ [ppm] (against SiH₄) | 500 | 1.2 | |
| CH₄ [SCCM] | | | 300 |
| substrate temperature [° C.] | 260 | 260 | 260 |
| inner pressure [mTorr] | 20 | 15 | 15 |
| power [W] | 1000 | 1000 | 600 |
| film thickness [μm] | 3 | 30 | 0.5 |

TABLE 34

|  | charge retentivity | photo sensitivity | photo-memory | unevenness | stability in characteristics | image quality |
|---|---|---|---|---|---|---|
| Example 19 | ◎ | ◎ | ◎ | ◎ | ◎ | ◎ |
| Comparative Example 7 | ○ | ○ | ○ | ○ | Δ | ○ |

TABLE 35

|  | charge retentivity | photo-sensitivity | photo-memory | unevenness | stability in characteristics | image quality |
|---|---|---|---|---|---|---|
| Example 20 | ◎ | ◎ | ◎ | ◎ | ◎ | ◎ |
| Example 21 | ◎ | ◎ | ◎ | ◎ | ◎ | ◎ |
| Example 22 | ◎ | ◎ | ◎ | ◎ | ◎ | ◎ |
| Example 23 | ◎ | ◎ | ◎ | ◎ | ◎ | ◎ |
| Example 24 | ◎ | ◎ | ◎ | ◎ | ◎ | ◎ |
| Example 25 | ◎ | ◎ | ◎ | ◎ | ◎ | ◎ |
| Example 26 | ◎ | ◎ | ◎ | ◎ | ◎ | ◎ |
| Example 27 | ◎ | ◎ | ◎ | ◎ | ◎ | ◎ |

What is claimed is:

1. A plasma CVD apparatus comprising a substantially enclosed reaction chamber containing substrate holding means and a cathode electrode in a cylindrical form having a diameter of 5 mm to 10 cm therein, such that a high frequency power from a high frequency power source capable of generating a high frequency with an oscillation frequency of 20 MHz to 600 MHz may be supplied to said cathode electrode from one end side of said cathode electrode to generate plasma between said substrate holding means and said cathode electrode to plasma-process a substrate provided in said substrate holding means, said one end side of said cathode electrode is structured to have an electric conductor comprising a plurality of conductor members shaped in a rod-like form which are arranged substantially along one axis such that said plurality of conductor members are capacitively coupled by a dielectric member, wherein said conductor members are capable of transmitting said high frequency power from said high frequency power source in a direction along said axis.

2. A plasma CVD apparatus according to claim 1, wherein the cathode electrode is covered by a dielectric member.

3. A plasma CVD apparatus according to claim 1 which has a dielectric member which cover part of the conductor members.

4. A plasma CVD apparatus according to claim 1, wherein the cathode electrode has a symmetrical form in the longitudinal direction.

5. A plasma CVD apparatus according to claim 1, wherein each of the opposite ends of the cathode electrode is electrically connected to the high frequency power source.

6. A plasma CVD apparatus according to claim 1, wherein the high frequency power has a frequency of a VHF band.

7. A plasma CVD apparatus according to claim 1, wherein the frequency is a frequency in the range of 20 MHz to 450 MHz.

8. A plasma CVD apparatus according to claim 1, wherein the frequency is a frequency in the range of 51 MHz to 250 MHz.

9. A plasma CVD apparatus according to claim 1, wherein the dielectric member comprises at least a dielectric material selected from the group consisting of alumina ($Al_2O_3$), aluminum nitride (AlN), beryllia (BeO), magnesia (MgO), silicon nitride ($Si_3N_4$), boron nitride (BN), steatite ($MgO.SiOz$), zircon ($ZrO_2.SiO_2$), cordierite ($2MgO.2Al_2O_3$—$5SiO_2$), zircon cordierite ($ZrSiO_4$—$2MgO_3.2Al_2O_3.5SiO_2$), and mica ceramics.

10. A plasma CVD apparatus according to claim 1, wherein the conductor members and the dielectric member have the same cross-sectional form with respect to the plane in the direction perpendicular to the longitudinal direction.

11. A plasma CVD apparatus according to claim 1, wherein the conductor members and the dielectric member have a cross section of the same dimension and the same form with respect to the plane in the direction perpendicular to the longitudinal direction of the cathode electrode.

12. A plasma CVD apparatus according to claim 1, wherein the conductor members and the dielectric member have a cross section having a different dimension with respect to the plane in the direction perpendicular to the longitudinal direction of the cathode electrode.

13. A plasma CVD apparatus according to claim 1, wherein the substrate is in a cylindrical form.

14. A plasma CVD apparatus according to claim 1, wherein the substrate holding means comprises a plurality of substrate holding means which are arranged in a circle-like arrangement.

15. A plasma CVD apparatus according to claim 1, wherein the cathode electrode comprises a plurality of cathode electrodes.

16. A plasma CVD apparatus according to claim 1, wherein the conductor members have a length of 0.1 mm to 30 cm.

17. A plasma CVD apparatus according to claim 1, wherein the dielectric member has a length of 0.1 mm to 5 cm.

18. A plasma CVD apparatus according to claim 1 which has a driving mechanism for rotating the substrate positioned on the substrate holding means.

* * * * *